United States Patent [19]

Iwaoka et al.

[11] Patent Number: 4,856,899

[45] Date of Patent: Aug. 15, 1989

[54] OPTICAL FREQUENCY ANALYZER USING A LOCAL OSCILLATOR HETERODYNE DETECTION OF INCIDENT LIGHT

[75] Inventors: Hideto Iwaoka; Akira Ohte; Koji Akiyama, all of Tokyo, Japan

[73] Assignee: Yokogawa Electric Corporation, Tokyo, Japan

[21] Appl. No.: 943,670

[22] Filed: Dec. 18, 1986

[30] Foreign Application Priority Data

| Dec. 20, 1985 | [JP] | Japan | 60-287162 |
| Dec. 26, 1985 | [JP] | Japan | 60-294342 |
| Dec. 27, 1985 | [JP] | Japan | 60-296073 |
| Dec. 27, 1985 | [JP] | Japan | 60-296070 |
| Jan. 24, 1986 | [JP] | Japan | 61-11894 |
| Feb. 26, 1986 | [JP] | Japan | 61-40772 |
| Feb. 26, 1986 | [JP] | Japan | 61-40773 |
| Jun. 24, 1986 | [JP] | Japan | 61-96170 |
| Jun. 26, 1986 | [JP] | Japan | 61-98194[U] |
| Jun. 27, 1986 | [JP] | Japan | 61-97611[U] |
| Jun. 27, 1986 | [JP] | Japan | 61-149777 |
| Jul. 17, 1986 | [JP] | Japan | 61-168924 |
| Aug. 13, 1986 | [JP] | Japan | 61-189944 |
| Aug. 26, 1986 | [JP] | Japan | 61-199364 |
| Sep. 19, 1986 | [JP] | Japan | 61-221668 |
| Oct. 31, 1986 | [JP] | Japan | 61-260338 |

[51] Int. Cl.$^4$ .................................. G01B 9/02
[52] U.S. Cl. .................... 356/346; 356/5; 356/28.5; 356/349
[58] Field of Search ........... 356/5, 28 S, 346, 34 G, 356/351; 324/77 K

[56] References Cited

U.S. PATENT DOCUMENTS

| 4,523,847 | 6/1985 | Bjorklund et al. | 356/351 X |
| 4,569,588 | 2/1986 | Nishiwaki et al. | 356/349 |
| 4,666,295 | 5/1987 | Duvall et al. | 356/5 |

Primary Examiner—Vincent P. McGraw
Assistant Examiner—S. A. Turner
Attorney, Agent, or Firm—Moonray Kojima

[57] ABSTRACT

An optical frequency analyzer for measuring an optical frequency spectrum with high accuracy, high resolving power and high stability by heterodyne detecting the incident light with the aid of a local oscillator, wherein the local oscillator comprises an optical frequency synthesizer/sweeper or a marker signal attached tunable laser. The optical frequency analyzer can be modified to measure the incident light itself as the object of measurement or light emerging from the object of measurement can be the incident light.

34 Claims, 41 Drawing Sheets

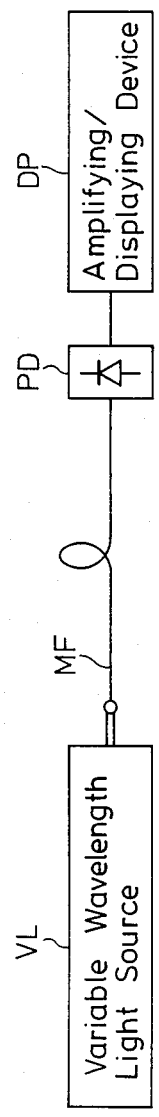
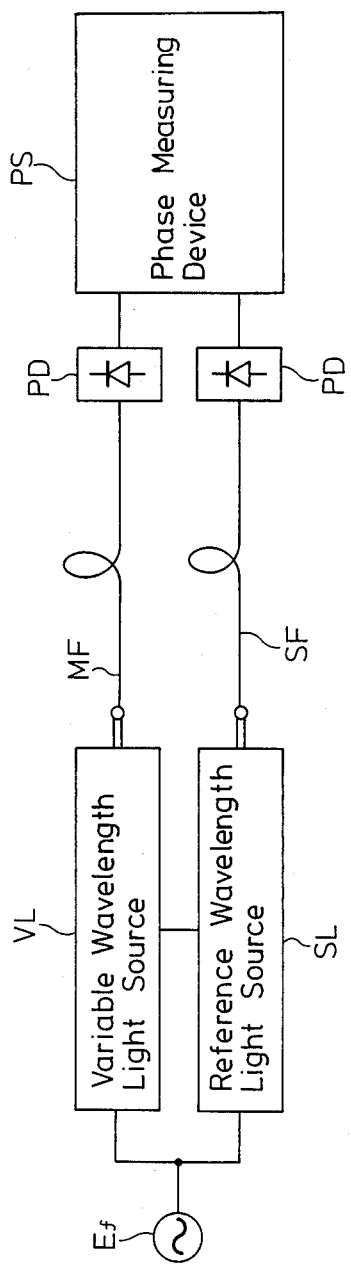

Optical Phase-Locked Loop Output

Pulse Synchronizing Signal

FIG. 67

| Substrate / Components | Semiconductor | | | Ferrodielectric Substance | Insulator |
|---|---|---|---|---|---|
| | GaAs(InP) | Si | | LiNbO₃ / LiTaO₃ | SiO₂ (Glass Crystal) |
| Laser | Monolithic | External Fitting, Hybrid | | External Fitting, Hybrid | External Fitting, Hybrid |
| Light Receiving Element | Monolithic | Monolithic | | External Fitting, Hybrid | External Fitting, Hybrid |
| AOM | SAW | Transducer | | SAW | Transducer |
| Absorption Cell | Hole→Glass Coat Sealing→Cover | Hole→Thermal Oxidation Sealing→Cover | | Hole→Glass Coat Sealing→Cover | Hole→Sealing→Cover (Evanescent Effect is Permissible) |
| Fabry-Perot Adjusting Method for Broad Band Region Feedback Configuration (Hole, Ridge, Dope) | Temperature or Electric Current | Temperature or Electric Current | | Temperature or Electric Field | Temperature |
| Thermal Control (Laser F-P) | Thin Film Resistance or the Like | Thin Film Resistance or the Like | | Thin Film Resistance or the Like | Thin Film Resistance or the Like |
| Circuit | Hybrid | Identical Substrate Monolithic | | Hybrid | Hybrid |

OPTICAL FREQUENCY ANALYZER USING A LOCAL OSCILLATOR HETERODYNE DETECTION OF INCIDENT LIGHT

BACKGROUND OF THE INVENTION

1. Field of Invention

This invention relates to an optical frequency analyzer having high accuracy and high resolving power.

2. Description of the Prior Art

A conventional optical frequency spectrum analyzer may be of the following types. (A) One utilizing a diffraction grating or a prism as a spectroscope. (B) One utilizing a Fabry-Perot resonator as a spectroscope.

As illustrated in FIG. 1, two half mirrors HM are disposed to form a resonator. Let the light velocity be c, and let the distance between the half mirrors be L. This resonator has a resonant frequency (see FIG. 2) at a frequency interval of c/2L. When light to be measured is rendered incident upon the left half mirror HM, light having the frequency identical to the resonant frequency is transmitted through the half mirror HM and falls on receiving device PD. When half mirror HM is oscillated by means, for example, of a PZT or the like, in order to sweep the resonant frequency, the spectrum of the measurement light can be observed from the output from light receiving device PD.

In the optical frequency spectrum analyzer described in (A), however, wavelength resolving power becomes 0.1 nm (equivalent to about 30 GHz) or thereabout; and an absolute accuracy is about 2 nm (equivalent to about 600 GHz). These results are not favorable. On the other hand, the optical frequency spectrum analyzer described in (B) shows results of the limit of frequency resolving power to about several tens of MHz. If the measurement if effected by inputting light having a reference wavelength, the absolute wavelength can be measured. The treatment is, however, very difficult, and accuracy is deteriorated (in connection with degreee of parallelism of mirrors and addjustment of perpendicular incidence, or error in frequency caused by fluctuations of an interval at which the mirrors are disposed). Furthermore, there is a defect in that it is impossible to simultaneously measure laser beams which are being oscillated in a plurality of modes.

Frequency measurement with high accuracy of 1 MHz or less and with high resolving power is required in the field of optical communication s and photo applied mesurements. Hence, the above types of optical frequency spectrum analyzers are unsatisfactory.

FIG. 3 is a block diagram depicting a conventional optical fiber loss wavelength characteristic measuring device. Output light from a variable wavelength light source VL enters a fiber MF to be measured, and the subsequent emergent light is detected by a photo detector PD. The detected light is outputted as an electric signal to an amplifying/displaying circuit DP. The characteristics of wavelength are measured from the variations of light power obtained when sweeping the output wavelength of the variable wavelength light source VL.

FIG. 4 is a block diagram showing a conventional optical fiber wavelength dispersion characteristic measuring device. The variable wavelength light source VL and a reference wavelength light source SL are amplitude modulated by a modulation signal source Ef having a frequency f. The photo detector member PD detects output optical powers both of measurement fiber Mf to which the output light of variable wavelength light source VL is applied and of reference fiber SF to which the output light of source SL is applied. The phase differences in component of the frequency f between the two outputs are detected by a phase measuring device PS, thereby measuring a propagation delay time with respect to the wavelength of the measurement fiber MF.

However, the measuring devices depicted in FIGS. 3, 4 are deficient in many respects, such as, the optical phase propagation characteristics cannot be measured in a highly accurate manner. The only acceptable measurement becomes possible with use of a long light path as in the case of optical fibers. A short waveguide path is not acceptable for obtaining accurate measurements. The measurement in regard to the propagation characteristic (e.g. loss, gain, phase, delay) and reflection characteristics is of importance to testing performance of such devices as the optical fiber, light waveguide path, wavelength branching filters, optical switches and the OEIC which are all essential components in any communication system or photo applied measurement systems. The above described conventional devicees and systems are not sufficiently adequate.

SUMMARY OF THE INVENTION

Accordingly, an object of the invention is to overcome the aforementioned and other deficiencies and defects of the prior art.

Another object is to provide an optical frequency analyzer wherein light relative to incident light is made to fall upon an optical heterodyne detecting member together with frequency swept light outputted from an optical frequency sweeping member; and an electrical signal with a frequency corresponding to the difference between two frequencies is outputted and is then signal processed by a signal processing/displaying member through the intermediary of a filter, thereby making it possible to measure frequency characteristics of a measurement object with high accuracy, high resolving power and high stability.

BRIEF DESCRIPTION OF THE DRAWINGS

FIG. 3 is a block diagram depicting a conventional optical fiber loss wavelength characteristic measuring device.

FIG. 4 is a block diagram depicting a conventional optical fiber wavelength dispersion characteristic measuring device.

FIG. 67 is a table depicting a method of fabricating respective components of the device of FIG. 66.

FIGS. 74(A), 75(B), 74(C) and 75 are perspective and plan views showing principal portions of another example of the arrangement of FIG. 73.

DETAILED DESCRIPTION OF PREFERRED EMBODIMENTS

In the different figures, the same components having the same function will bear the same reference symbol, in general. Where that is the case, to improve clarity of description, repeated discussion of the component will be generally avoided.

Figure 1:
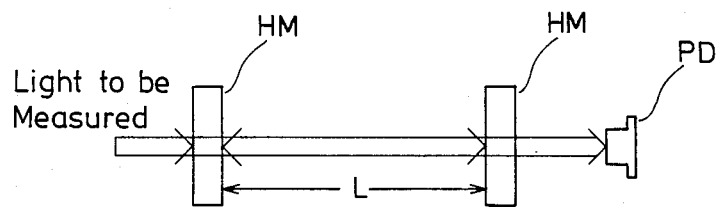
FIGS. 1, 2 are diagrams depicting the principles of a conventional optical frequency spectrum analyzer.
Figure 2:
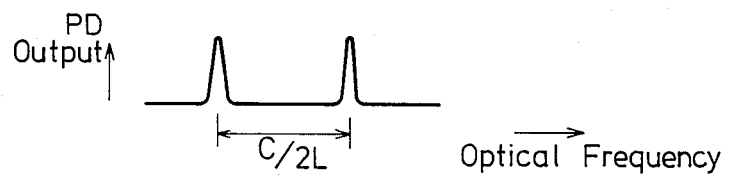
Figure 5:
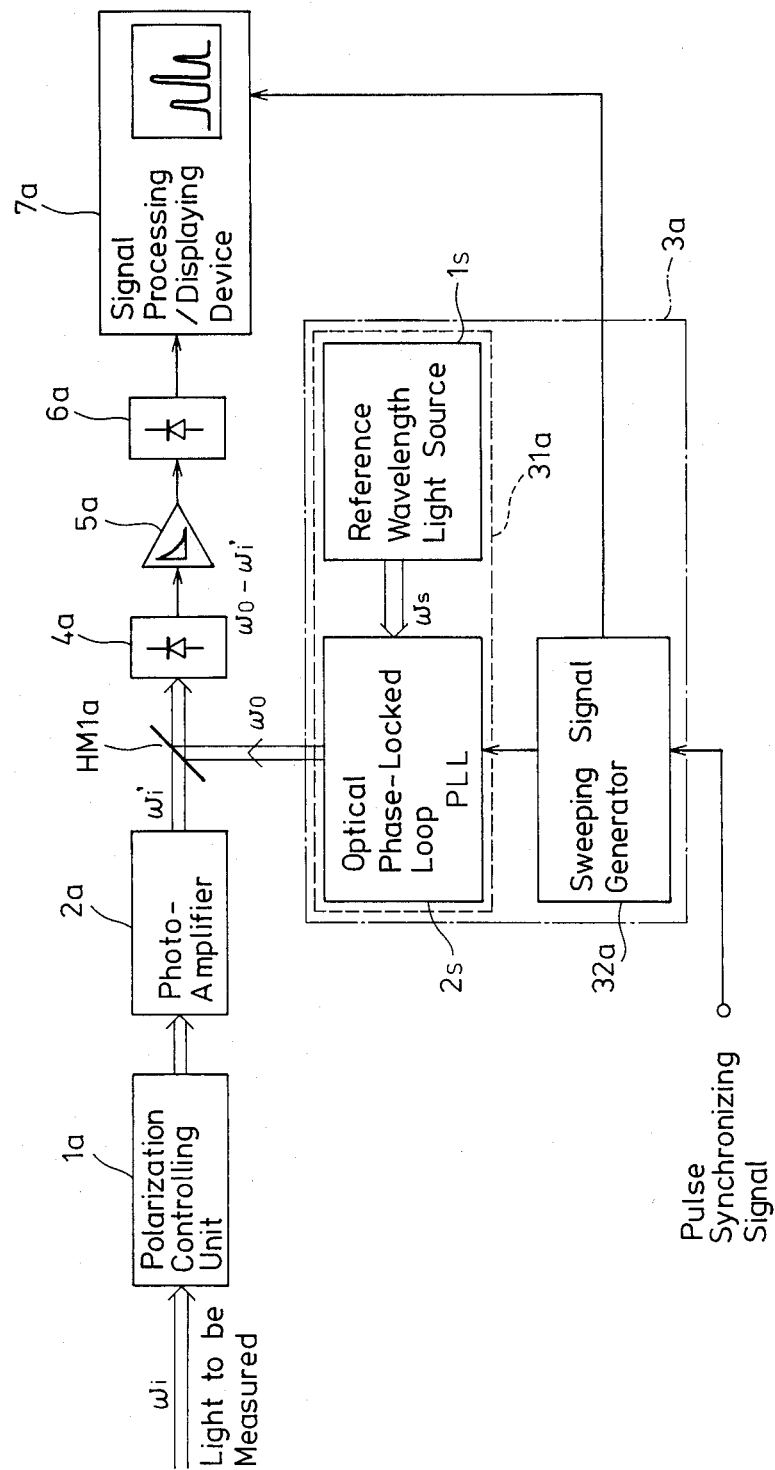
FIG. 5 is a block diagram depicting a first illustrative embodiment of the invention.

FIG. 5 depicts an optical frequency analyzer which can perform frequency analysis. The belt like arrow head indicates flow of photo or optical signals, while the solid line arrow head indicates flow of electrical signals. The analyzer comprises a polarization control unit 1a which uses a magnetic optical effect crystal (YIG, lead glass or the like) in which measurement light, defining an object to be measured, is arranged to be incident light; a photo amplifying device 2a for for inputting output light from control unit 1a; a local oscillator 3a which constitutes an optical frequency sweeping device; a half mirror HM1a for inputting beams of output light from oscillator 3a and of amplifier 2a; an optical heterodyne detector 4a comprising e.g. PIN photodiode, avalanche photodiode, or the like, for inputting output light from half mirror HM1a; filter 5a having a band pass property for inputting and amplifying electric output from heterodyne detector 4a; a detector for inputting electric output from filter 5a; and a signal processing/displaying circuit 72 for inputting electric output from detector 6a.

Local oscillator 3a comprises a sweeping signal generator 32a, reference wavelength light source 1s, and optical phase locked loop 2s for inputting light output from light source 1s. Loop 2s is arranged such that the frequency sweeping thereof is controlled by signal generator 32s and the output thereof is outputted to half mirror HM1a.

Photo amplifier 2a comprises a GaAlAs laser (780 nm zone) and an ImGaAsP laser (1500 nm zone) and may utilize the following types of amplifiers.

(A) A Fabry-Perot cavity type amplifier wherein bias electric current flows in the vicinity of the oscillation threshold value, signal light strikes a laser diode, and linear photo amplification is effected by inductive emission.

(B) An injection locking amplifier wherein signal light strikes a laser diode which continues oscillating, and wherein the optical frequency and the phase of the oscillation are controlled.

(C) A travelling wave type amplifier wherein both end surfaces of a laser diode chip are coated with non-reflective material, and photo amplification is performed by transmission of light.

Operation of the FIG. 5 embodiment is as follows. Local oscillator 3a comprises an optical frequency synthesizer/sweeper, which will be described hereinbelow in greater detail, and which sweeps the wavelength of output from loop 2s by the output from generator 32a. Loop 2s, having output frequency $\omega_o$, controls the wavelength of the output such as to correspond to an oscillation wavelength or reference source 1s, having output frequency $\omega s$. With this arrangement, it is possible to output local oscillation light with high accuracy, high stability and high spectral purity.

When measurement light having frequency $\omega_i$ enters unit 1a, a polarization plane of incident light is arranged to be identical to another polarization plane of the output from oscillator 3a by controlling the impressed magnetic field while utilizing rotary polarization of the magnetic optical effect crystal. The output from control unit 1a is amplified by amplifier 2a and is then synthesized with the output from oscillator 3a by half mirror HM1a. The synthesized light output is converted by heterodyne detector 4a into an electrical signal having a frequency equivalent to the difference obtained by $\omega_o - \omega_i'$ (in this case, however, $\omega_i' = \omega_i$). The electric output from heterodyne detector 4a is partially transmitted through filter 5a by its band pass properties and is taken out as power in detector 6a. The processor/display unit 7a inputs electric output from detector 6a as a power signal and at the same time inputs a signal relative to the sweeping from generator 32a as a frequency axial signal, thereby spectrum displaying the measurement light.

Examples of operating frequencies are wavelength of $\omega_s$ is 780 nm (wavelength of laser diode locked to absorption line of Rb); wavelength of $\omega_o$ is 1560 nm±50 nm; and wavelength of $\omega_i$ is 1560 nm±50 nm. These operational frequency examples are confined to the case where the measurement light has the most suitable wavelength for optical communication. They are particularly effective in the measurement of characteristic (e.g. absolute wavelength, spectrum distribution and spectrum width) of light emitted from a laser diode in a communication system.

Figure 6:
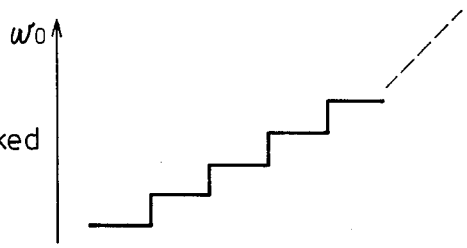
FIGS. 6(a) and 6(b) is a time chart depicting operation of the embodiment of FIG. 5.
Figure 6:
Figure 7:
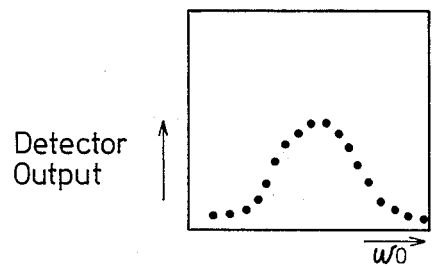
FIG. 7 is a graph depicting operation of the embodiment of FIG. 5.

FIG. 5, a pulse synchronizing signal is added to generator 32a for the purpose of exhibiting such an example that the spectrum is, with pulse light serving as incident light, measured. FIGS. 6(A), 6(B) time charts are provided to explain the operations of the above case. A trigger signal (see FIG. 6(B)) synchronized with pulse light is inputted to generator 32a oscillator 3a. Synchronized with this, frequency $\omega_o$ of loop 2s is, as shown in FIG. 6(A), swept in a step configuration. Simultaneously, a signal, identical to that of FIG. 6(A), corresponding to the sweeping of frequency $\omega_o$ is transmitted to processor/display 72. As a result, a power spectrum of $\omega_o$ exists at one point for every beam of pulse light and hence it is feasible to output the whole spectrum of pulse light depicted in FIG. 7 after sweeping operation has been completed.

In FIG. 5, the frequency resolving power of the optical frequency spectrum analyzer is determined both by the spectrum width of output frequency $\omega_o$ of oscillator 3a and the band width of filter 5a. The spectrum width of frequency $\omega_o$ is likewise determined by the variable wavelength light source of the optical frequency synthesizer. An external resonator type laser diode, which will be discussed later with respect to FIGS. 19-22, is further used, whereby it is possible to obtain excellent frequency resolving power eg 100 KHz.

Moreover, it is feasible to obtain an optical frequency spectrum analyzer which is highly precise, e.g. at $10^{-12}$, with absolute wavelength accuracy and which is highly stable.

Furthermore, the light pulse can be easily measured. Also, a W-Ni (tungsten, nickel) point contact diode and a Josephson element can be used for the heterodyne detector 4a. Although, a band pass filter is used as filter 5a, other filters can be used. For example, a low pass filter may be used. In this case, there is detected optical power of $\omega_i'$ so that the equation $\omega_i' = \omega_o$ is established to accompany sweeping of frequency $\omega_o$.

Figure 8:
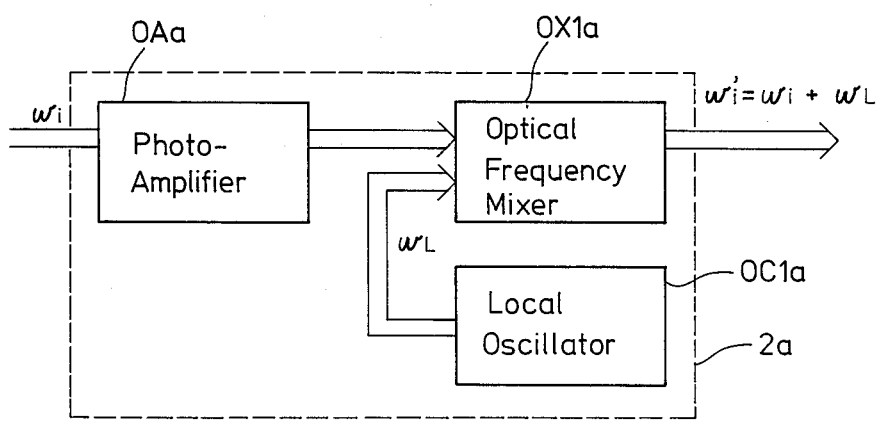
FIG. 8 is a block diagram depicting a photo amplifying device.
Figure 27:
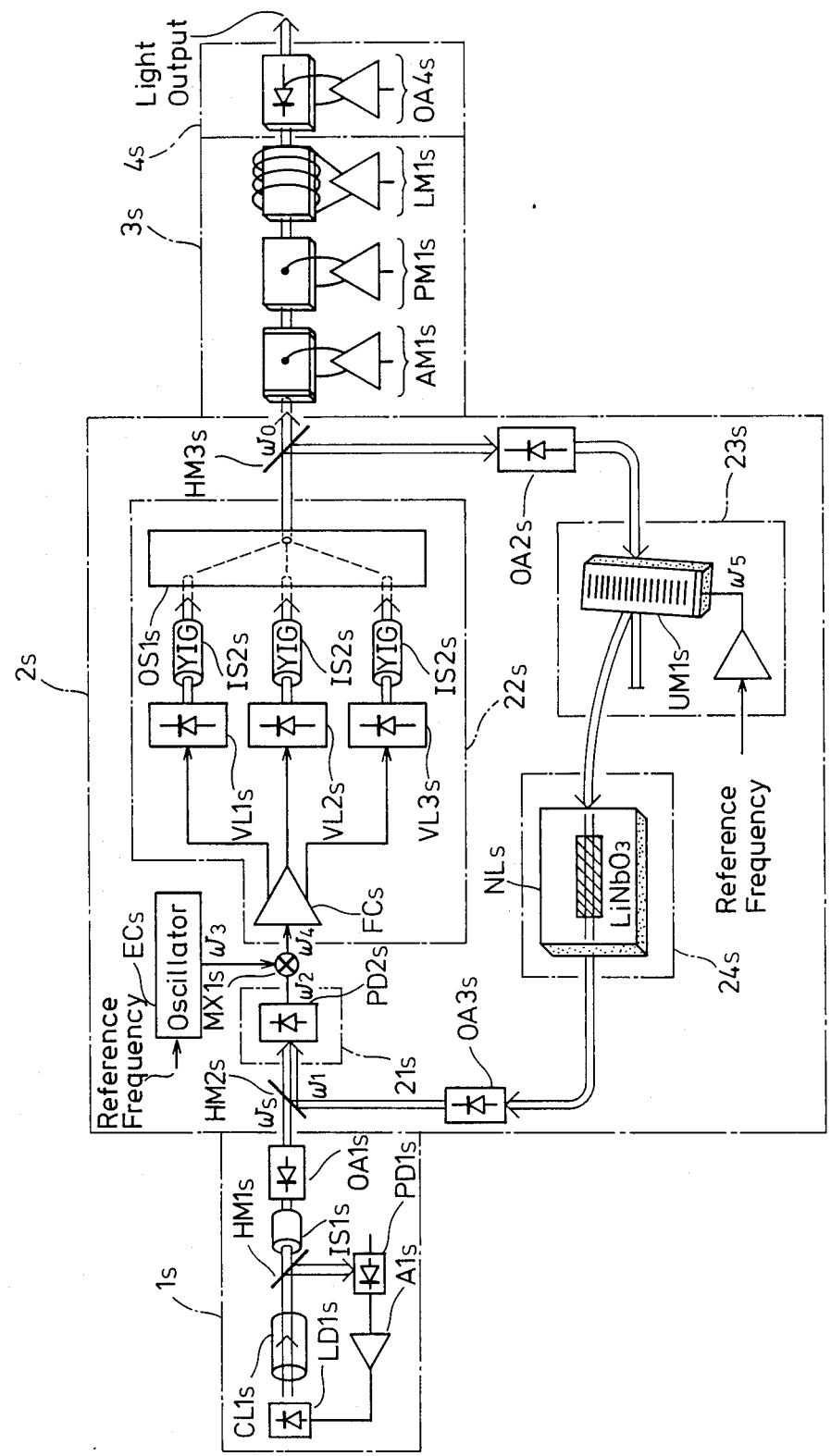
FIG. 27 is a block diagram depicting a second example of the arrangement of FIG. 26.

FIG. 8 depicts another example of a photo amplifier 2a. The amplifier 2a comprises a local oscillator OC1a generating an output having frequency $\omega_L$ which uses a second wavelength stabilized light source; a photo amplifier OAa for inputting output from control unit 1a; an optical frequency mixer OX1a which uses a non-linear type optical crystal for inputting the output from photo amplifier OAa and output from local oscillator OC1a. Due to the non-linear optical effect, the output frequency $\omega_i'$ of mixer OX1a is $\omega_i' = \omega_i + \omega_L$. As the oscillator OC1a, the preferred arrangement is an optical frequency synthesizer/sweeper, such as shown in FIG. 27, which outputs highly accurate frequency $\omega_L$. If such a photo amplifier is used, the measurement frequency range will also be expanded except for the sweeping range of $\omega_o$. Provided that local oscillator OC1a which is capable of outputting a plurality of frequencies $\omega_{L1}$, $\omega_{L2}$ ... is used, it is feasible to obtain an even greater sweeping range.

Figure 9:
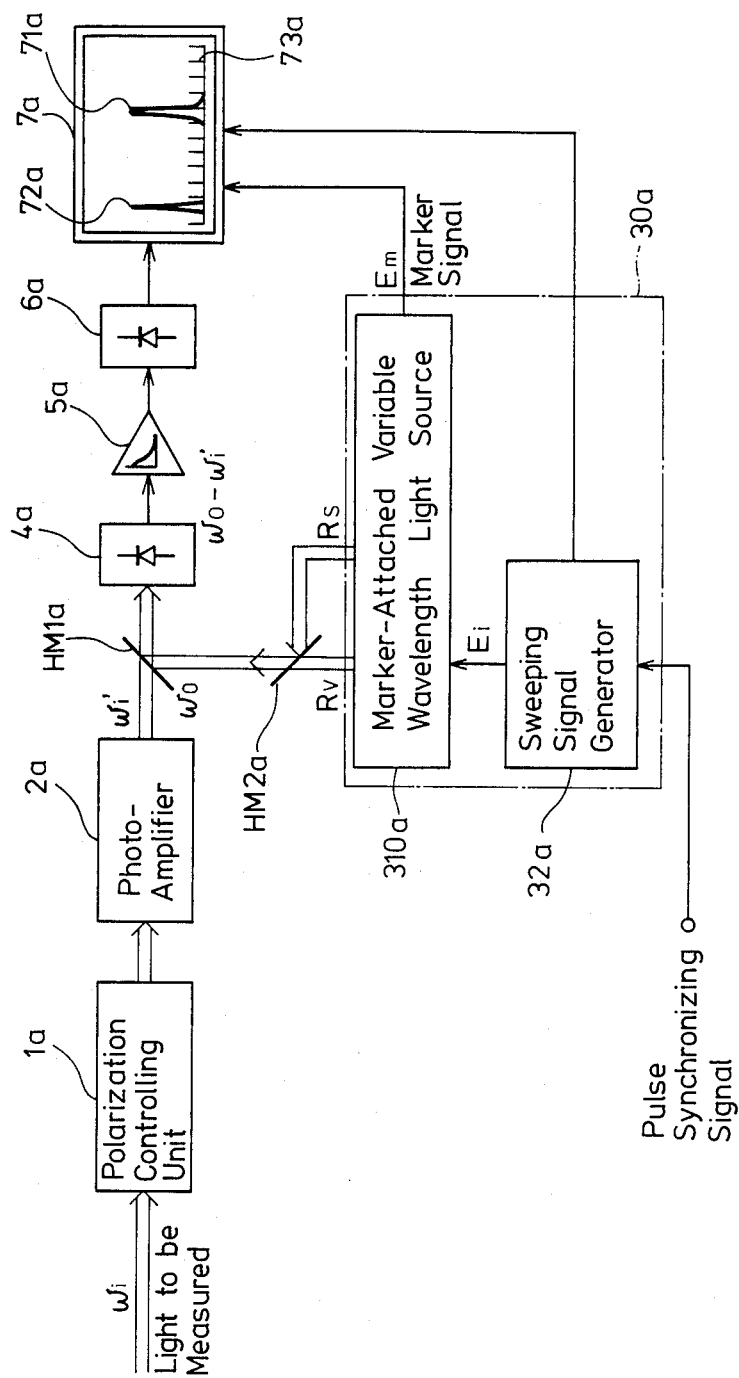
FIG. 9 is a block diagram depicting a second illustrative embodiment of the invention.

FIG. 9 depicts another spectrum analyzer which differs from FIG. 5 as follows. A marker attached variable wavelength light source 310a is arranged such that the frequency sweeping is controlled by sweeping signal generator 32a in local oscillator 30a that constitutes a sweeper. Half mirror HM2a synthesizes reference wavelength light Rs and variable wavelength light Rv of the marker attached variable wavelength light source 310a. Beams of output light from amplifier 2a and output from half mirror HM2a are synthesized in half mirror HM1a and are then supplied to heterodyne detector 4a. Processor/display 7a inputs signal relative to the sweeping from generator 32a as the frequency axial signal and concurrently inputs electric output from detector 6a as the power signal. After this process, processor/display 7a spectrum displays a beam of measurement light 71a and a beam of reference light 72a and at the same time displays a marker 73a after inputting a marker electrical signal Em outputted from source 310a.

Figure 10:
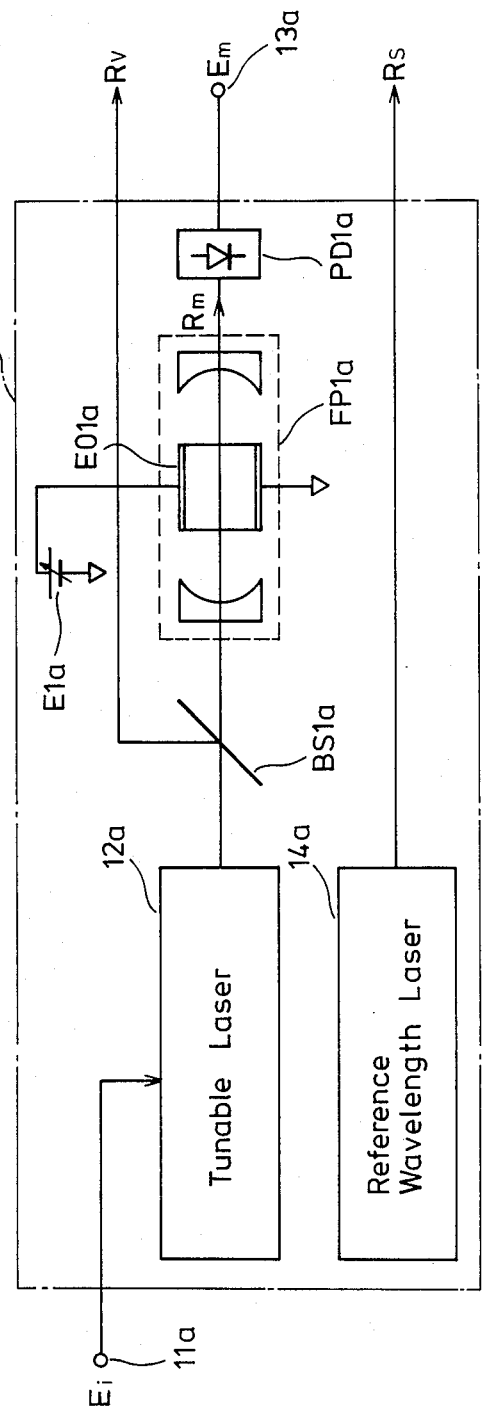
FIG. 10 is a block diagram depicting details of a marker attached variable wavelength light source used in the embodiment of FIG. 9.

FIG. 10 depicts details of the source 310 of FIG. 9 which comprises an input terminal 11a to which a sweeping electrical signal Ei for controlling the wavelength is applied; a tunable laser 12a for inputting the sweeping electrical signal Ei through the intermediary of input terminal 11a; a beam splitter BS1a for bidirectionally splitting output from tunable laser 12a; a resonator FP1a which constitutes a marker light source, consisting of a Fabry-Perot etalon for inputting light transmitted through beam splitter BS1a; electro-optic element EO1a provided on the optical axis within resonator FP1a; a signal source E1a for driving element EO1a; a light receiving element PD1a for receiving output from resonator FP1a and for converting it to an electrical signal; and a highly accurate and stable reference wavelength laser light source 14a for emitting output light having a substantially constant wavelength.

Figure 11:
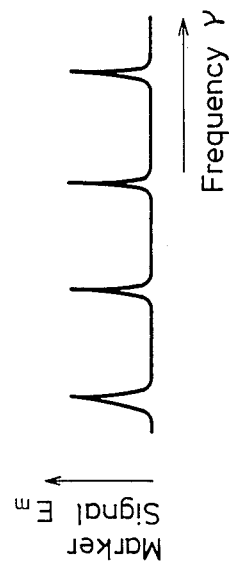
FIG. 11 is a spectrum chart depicting a marker signal output Em on the basis of frequency regions of the arrangement of FIG. 10.

Operation of the FIG. 10 embodiment is as follows. Laser 12a emits output having a wavelength corresponding to signal Ei which is applied via input terminal 11a. The output is reflected by beam splitter BS1a thereby to become the variable wavelength output Rv. The rest is transmitted through beam splitter BS1a and are then inputted to resonator FP1a. Resonator FP1a is capable of changing its equivalent resonator length by operation of electro-optic element EO1a, since element EO1a is present on the light path. Thus, a beam of output light Rm from resonator FP1a produces a peak value at a wavelength interval corresponding to the output voltage from signal source E1a. Light receiving element PD1 detects output RM and converts it into an electric signal which is outputted as a marker signal Em from terminal 13a. FIG. 11 shows marker signal Em on the basis of frequency regions. Reference source 14a emits output light Rs having a substantially constant wavelength within the scope of the output band of the variable light source 12a.

Operational examples of frequencies are wavelength of reference light Rs is 780 nm (wavelength of laser diode locked to absorption beam of Rb); wavelength of variable wavelength light Rv is 780 nm±50 nm; and wavelength of $\omega_i$ is 780 nm±50 nm.

In the FIG. 9 embodiment, since the reference light, marker light and measurement data are recorded or displayed, it is feasible to readily ascertain the absolute value of the wavelength, if the number of intervals of marker light is counted from the wavelength of the reference light and at the same time interpolation is effected.

The frequency resolving power of the analyzer is determined by the spectrum width of the variable wavelength light Rv of source 310a and by the band width of filter 5a. Since the spectrum width of the variable wavelength light depends on tunable laser 12 of light source 310a, it is possible to obtain excellent frequency resolving power (e.g. of 100 KHz) by utilizing an external resonator type laser diode which will be explained with reference to FIGS. 19–22. Also, it is feasible to produce an analyzer which is highly accurate and stable at the absolute wavelength (e.g. in the range of $10^{-12}$). Moreover, in the FIG. 10 embodiment, if the effective length of the Fabry-Perot etalon FP1a can be freely varied, the electro-optical element EO1a is not needed.

Figure 12:
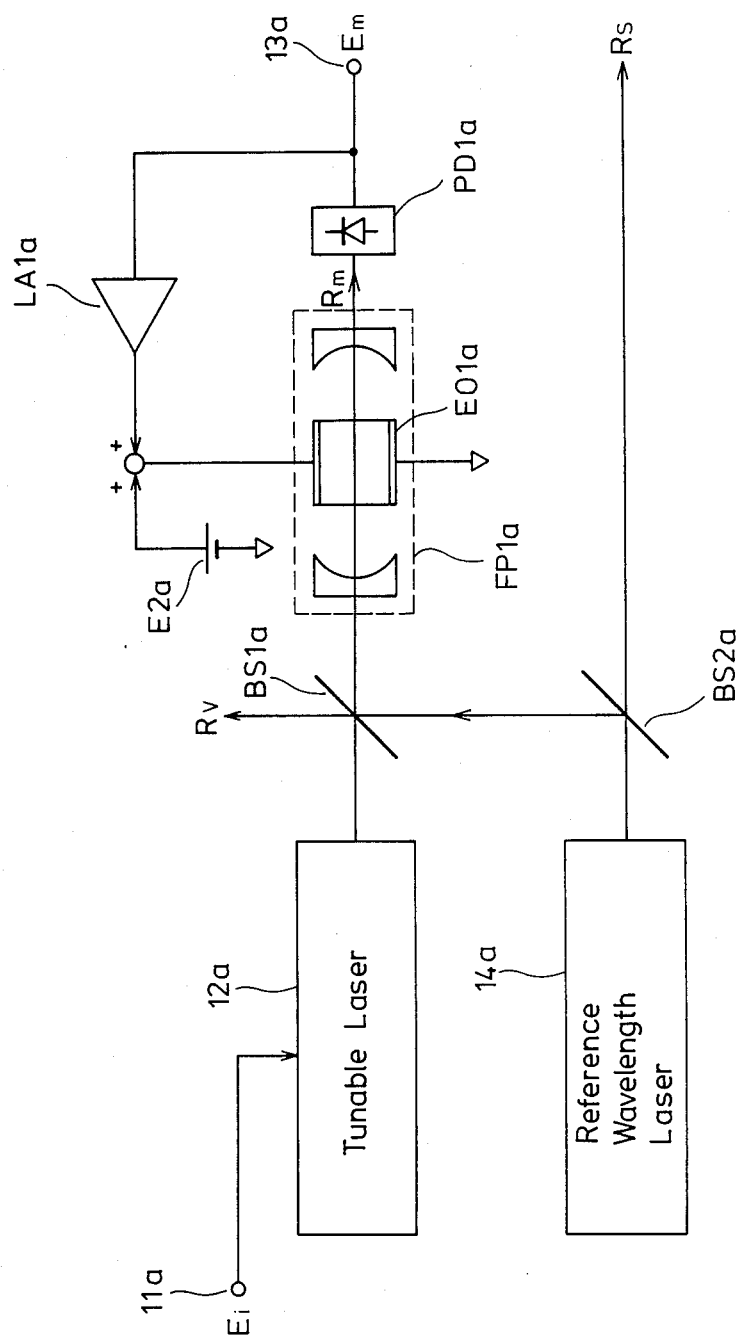
FIG. 12 is a block diagram depicting a second example of the marker attached variable wavelength light source of FIG. 10.

FIG. 12 depicts a variation of the marker attached variable wavelength light source 310a of FIG. 10 and comprises a beam splitter BS2a provided on the output light path for reference source 14a, for causing output light to be reflected and to strike beam splitter BS1a; a lock-in amplifier LA1a for inputting output from light receiving element, which is a detector, PD1a; a bias signal source E2a whose output is added to the output from lock-in amplifier LA1a and is then applied to electro optical element EO1a. Some beams of output light from reference source 14a are reflected by beam splitter BS2a and fall via beam splitter S1a upon resonator FP1a. The resonator length of resonator FP1a is controlled so that the reference wavelength component reaches its maximum in a feedback loop comprising lock-in amplifier LA1a, thereby making it possible to cause the marker light to accord with the reference wavelength.

Figure 13:
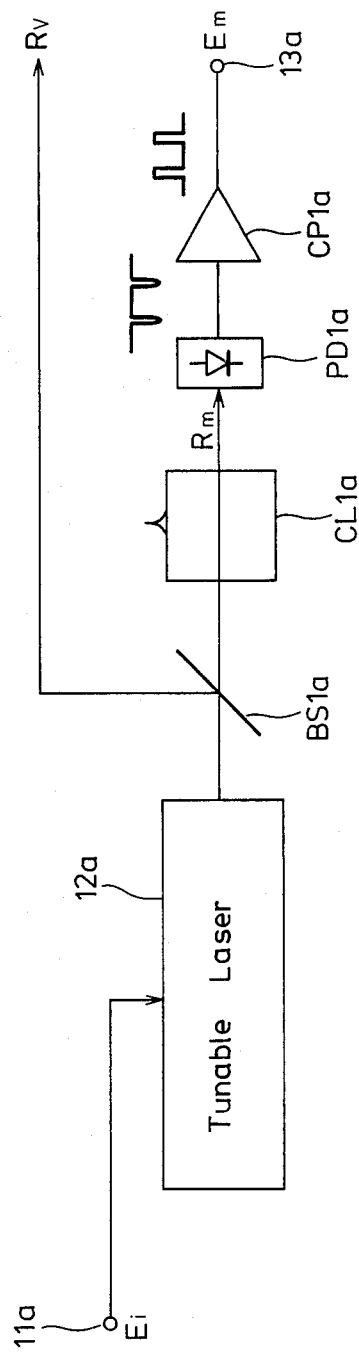
FIG. 13 is a block diagram depicting a third example of the marker attached variable wavelength light source of FIG. 9.

FIG. 13 depicts details of the marker attached light source 310a for use in the arrangement of FIG. 9, and comprises an absorption cell CL1a which comprises a standard substance, e.g. Cs, for receiving light transmitted through beam splitter BS1a (this absorption cell CL1a constitutes a marker light source); a light receiving element or detector PD1a for receiving output Rm from absorption cell CL1a and converting it into an electrical signal; a comparator CP1a for receiving electric signals from detector PD1a; and a marker signal output terminal 13a connected to comparator CP1a. The standard source may comprise any of Cs (having two absorption beams in the vicinity of 852 nm), Rb (having four absorption beams in the vicinity of 780 nm, and four absorption beams in the vicinity of 794 nm), $NH_3$ (having a a plurality of absorption beams, and $H_2O$ (having a plurality of absorption beams.).

Operation of the FIG. 13 arrangement is as follows. Part of the beams of output from tunable laser 12a is transmitted through beam splitter BS1a and strikes absorption cell CL1a. The incident light is subjected to absorption at a given wavelength by the standard substance and outputted as transmitted light Rm having peak value (i.e. the lowest point) at the stabilized wavelength. Element PD1a converts output light Rm into electrical signals which are waveform arranged. The arranged signal is, as marker signal Em, outputted from terminal 13a. Since quantum standard marker light is outputted, the wavelength can be measured with high accuracy.

Figure 14:
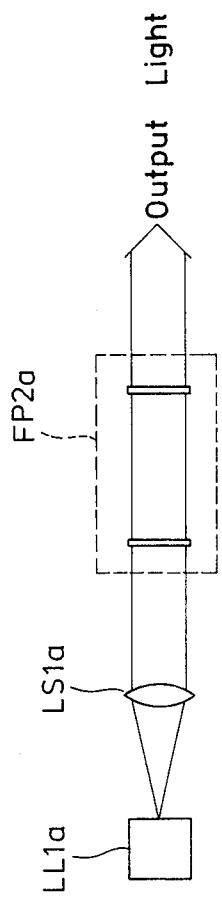
FIG. 14 is a block diagram depicting a fourth example of a marker light source used in the arrangement of FIG. 9.

FIG. 14 depicts another marker light source used in the source 310a of FIG. 9. The arrangement comprises a light source LL1a having consecutive spectrums (this light source comprises an LED, a xenon lamp or the like); a lens LS1a for causing beams of output light from light source LL1a to be parallel; and a Fabry-Perot resonator FP2a comprising two seim-transparent mirrors, for acting on the output light from lens LS1a.

Figure 15:
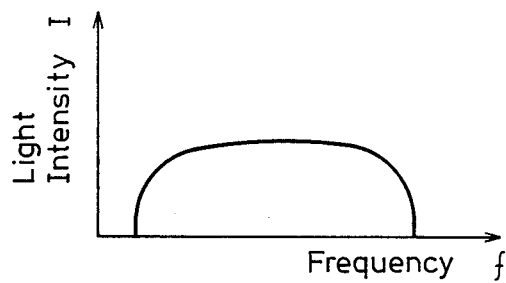
FIGS. 15(A), 15(B) and 15(C) are graphs depicting characteristic curves of the device of FIG. 14.
Figure 15:
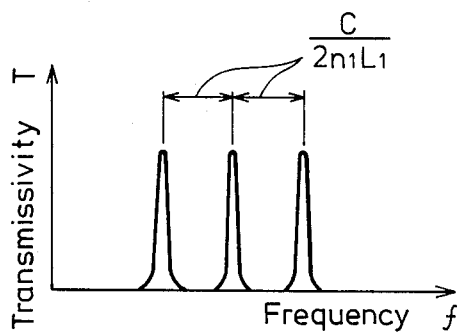
Figure 15:
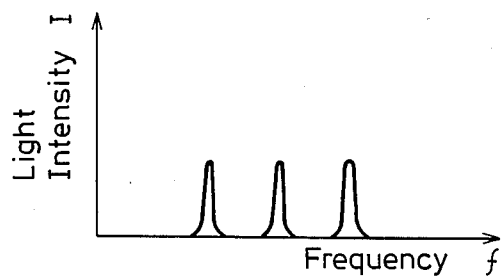

Operation of the FIG. 14 device is as follows with reference to FIGS. 15(A), 15(B), and 15(C). Source LL1a outputs light having a large width of spectrum as shown in FIG. 15(A). The beams of light outputted from source LL1a are rendered parallel by lens LS1a and further enter resonator FP2a, thereby resonating between the two semi-transparent mirrors thereof. Let the length of the resonator (i.e. distance between the two semi-transparent mirrors) be $L_1$, let the light velocity be c, and let the refractive index be $n_1$. Then, the transmissivity of the resonator, as shown in FIG. 15(B), has a sharp peak for every $c/2n_1L_1$. As a result, the light outputted from the semi-transparent mirror is as shown in FIG. 15(C). Accordingly, a reference marker can be produced with a simple device.

Figure 16:
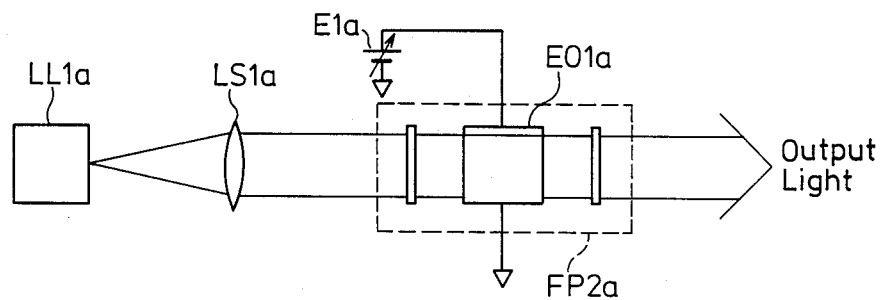
FIG. 16 is a block diagram depicting a fifth example of a marker light source used in the arrangement of FIG. 9.

FIG. 16 depicts details of another marker light source for use in source 310a of FIG. 9, wherein the effective length of the resonator of FIG. 14 is varied. The arrangement comprises an electro-optic crystal EO1a incorporated in the light path of the Fabry-Pero resonator FP2a; and a control signal source E1a connected to an electrode of the crystal EO1a. When an electric field is applied to crystal EO1a by control signal source E1a, the refractive index of crystal EO1a changes, whereby the equivalent or effective length of the resonator is varied. Hence, the wavelength of the output light can be readily changed. With a simple arrangement, it is feasible to manufacture an optical frequency marker device wherein using a simple electrical device, the frequency can be varied by varying the effective resonator length.

In each of the foregoing embodiments, the resonator may be placed in a constant temperature oven to control the temperature of the resonator to be substantially constant and produce a stable frequency interval.

Figure 17:
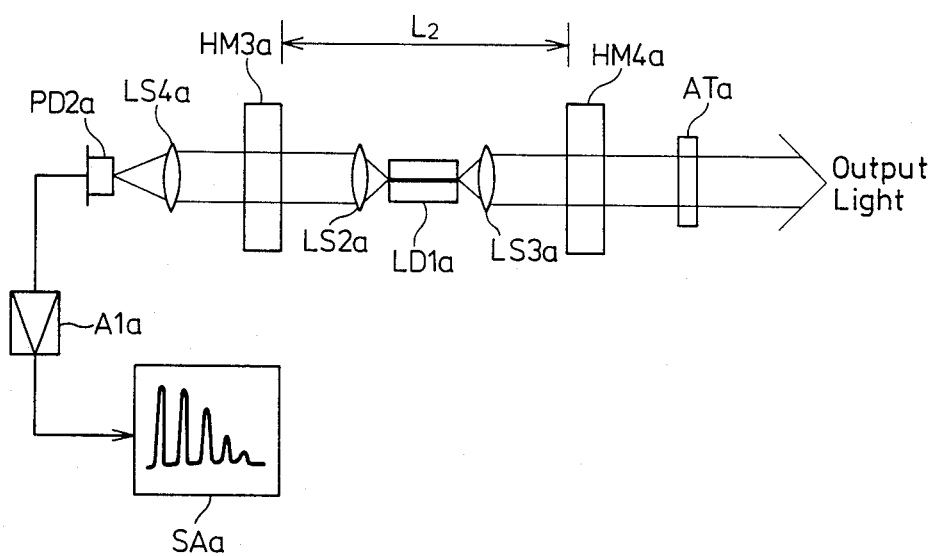
FIG. 17 is a block diagram depicting a sixth example of a marker light source used in the arrangement of FIG. 19.

FIG. 17 depicts details of a further marker source comprising a semiconductor laser LD1a comprising both ends which are AR-coated with non-reflective material; collimator lens LS2a, LS3a for causing the beams of output from laser LD1a to be parallel; semi-transparent mirrors HM3a, HM4a which form an external resonator disposed outside lens LS2a, LS3a; and an attenuator ATa through which light is outputted from semi-transparent mirror HM4a. The beams of output light transmitted through semi-transparent mirror HM3a coverage at lens LS4a and are then detected by a photo-detector PD2a, which may be an APD (avalanche photo diode). The output electric signal from detector PD2a is amplified by an amplifier A1a, and its waveform is monitored by a spectrum analyzer SAa.

Figure 18:
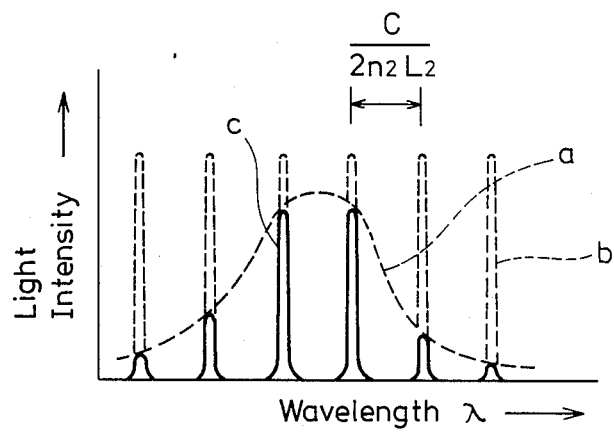
FIG. 18 is a graph depicting a characteristic curve of the device of FIG. 17.

Operation of the FIG. 17 embodiment is as follows with reference to FIG. 18. A gain curve of spontaneous emitted output light from laser LD1a is depicted as indicated by a dotted line (a) in FIG. 18. The beams of light which are outputted from both end surfaces of laser LD1a, respectively, become parallel in lens LS2a, LS3a and resonate between semi-transparent mirrors HM3a, HM4a. Let the length of the resonator be $L_2$, let the light velocity be c, and let the refractive index be $n_2$. Then, the free spectrum range of the external resonator is determined by $c/2n_2L_2$, and as indicated by a dotted line (b) in FIG. 18, Q rises for every $c/2n_2L_2$. Subsequently, the marker output light outputted from attenuator ATa is characterised (i.e. multiple modes oscillation) as shown by the solid line (c) in FIG. 18. The wavelength interval $\lambda_x$ of the marker output light can precisely be read as a frequency interval $\omega_x$ by an electrical spectrum analyzer SAa. If resonator length $L_2$ is varied, it will be possible to change the wavelength interval $\lambda_x$ of the marker output light. For example when $L_2 = 10$ mm, the frequency interval $\omega_x$ is given by $\omega_x = c/2L_2 = 15$ GHz. When the external resonator is placed into the constant temperature oven as occasion requires, a stable frequency interval can be obtained.

Figure 19:
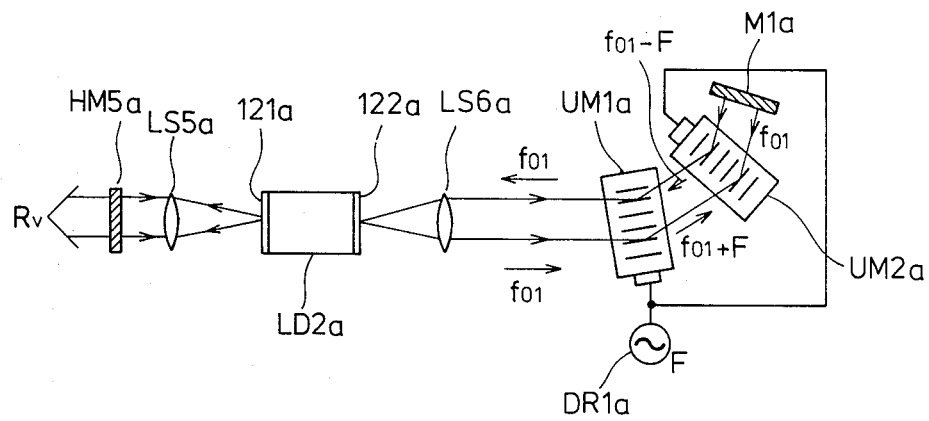
FIG. 19 is a block diagram depicting one example of a tunable laser user in the arrangement of FIG. 10.

FIG. 19 depicts details of a tunable laser 12a used in the marker attached variable wavelength light source 30a of FIG. 10, wherein an element having wavelength selectivity is incorporated in the resonator. The arrangement comprises a semiconductor laser LD2a; non-reflection coated surfaces 121a, 122a provided at both ends of the laser LD2a; lens LS5a for causing beams of light emerging from non-reflection surface 121a to be parallel; half mirror HM5a on which light transmitted through lens LS5a is reflected (this half mirror outputs resonant light to the outside); lens LS6a for causing light emerging from non-reflection surface 122a to be parallel; a first acousto-optical modulator UM1a for receiving light which is transmitted through lens LS6a; a second acousto-optical modulator UM2a for receiving light outputted from modulator UM1s; a mirror M1a for reflecting light emerging from modulator UM2a; and an oscillator DR1a for exciting modulators UM1a, UM2a at a frequency F.

The beams of light which emerge from non-reflection surface 121a of laser LD2a are arranged to be parallel in lens LS5a and are then reflected by half mirror HM5a. The reflected beams of light travel back through the light path and strike laser LD2a once again. The beam of light having a frequency $f_{o1}$ which emerges from non-reflection surface 122a are arranged to be parallel by lens LS6a and strike modulator UM1a. The wavelength of such light varies so as to satisfy given incident and emergent angles with respect to a diffraction grating created by ultrasonic waves, if the wavelength of the ultrasonic wave applied to modulators UM1a, UM2a changes.

When diffraction is being effected, the incident light is subjected to Doppler shift caused by the ultrasonic waves, and the frequency of +1-dimensional diffracted light (the direction of ultrasonic waves is the same as the diffracted direction) becomes $f_{o1}+F$. The emergent light from modulator UM1a is diffracted in modulator UM2a once again. In modulator UM2a, the relation between diffraction light—and direction in which ultrasonic waves travel is opposite to that in modulator UM1a; and 1-dimensional diffraction light is therefore present. As a result, the volume of Doppler shift amounts to $-F$, and the frequency of output from modulator has the relation $f_{o1}+F-F=f_{o1}$. The output light from modulator UM1a undergoes Doppler shift in modulator UM2a after being reflected by mirror M1a. The frequency thereof is express $f_{o1}-F$, and further becomes $f_{o1}-F+F=f_{ol}$ in modulator UM1a. It reverts back to the original frequency $f_{o1}$, thereby returning to laser LD2a. Consequently, the resonant state continues. If the wavelength (frequency F) of the ultrasonic wave is varied, it is feasible to sweep the wavelength of the resonant light. The light which has been resonated is outputted via half mirror HM5a to the outside.

Figure 20:
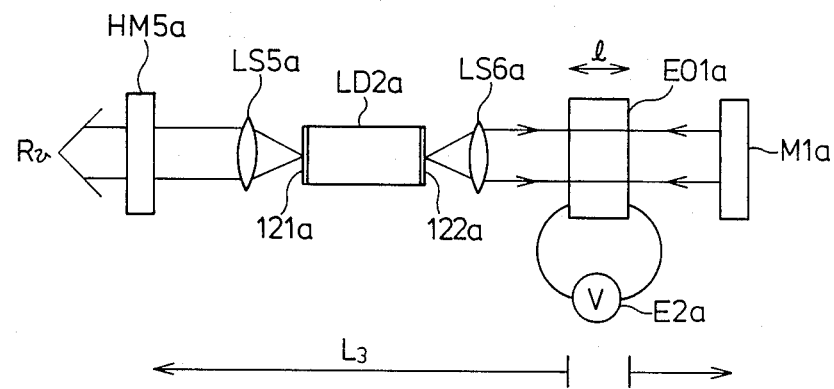
FIG. 20 is a block diagram depicting a second example of a tunable laser.

FIG. 20 describes a tunable laser having incorporated in the resonator an element capable of controlling the refractive index of light. The arrangement comprises an electro-optic device EO1a, both surfaces of which are coated with non-reflection material and comprises LiNbO$_3$ (niobium acid lithium) or the like and receives output from lens LS6a; and a signal source E2a for controlling element EO1a. The beams of light which have merged from laser LD2a are arranged to be parallel by lens LS6a and one is transmitted to electro-optic device HO1a. The transmitted light travels back through the previous light path after being reflected by mirror M1a and strikes laser LD2a once again. As a result, a resonator can be constructed between half mirror HM5a and mirror M1a. Let the distance, exclusive of a length along the light path for the electro-optic device EO1a, between half mirror HM5a and mirror M1a be $L_3$, let light velocity be c, and let integer be p, and refractive index be $n_3$. Then, oscillation frequency $f_{o2}$ is $$f_{o2}=p\cdot c/2(L_3+n_3(V)) \quad (1)$$

Namely, the refractive index $n_3$ can be varied by changing the intensity of electric field applied to electro-optic device EO1a, using electric signals from source E2a, thereby making it possible to sweep ("sweep" can be construed in some instances to mean control) oscillation frequency $f_{o2}$.

Figure 21:
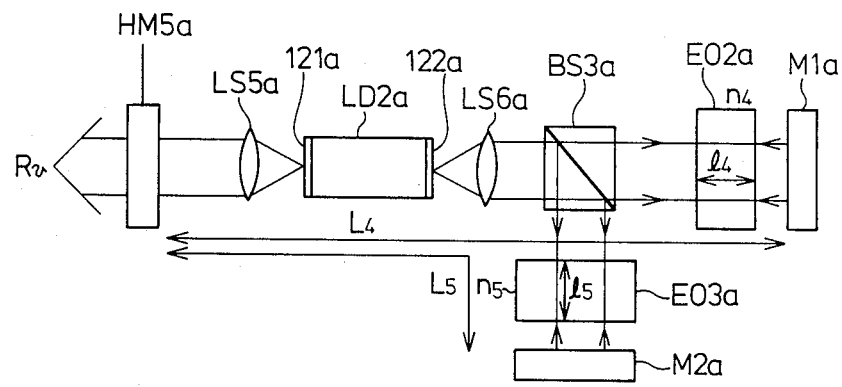
FIG. 21 is a block diagram depicting a third example of a tunable laser.

FIG. 21 depicts details of another tunable laser 12a wherein double resonators are shown. The arrangement comprises a beam splitter BS3a for bidirectionally splitting the emergent light from lens LS6a; electro-optic device EO2a upon which light transmitted through beam splitter BS3a falls; mirror M1a on which the emergent light from electro-optic device EO2a is reflected; electro-optic device EO3a for receiving light reflected by beam splitter BS3a; and mirror M2a for reflecting emergent light from device EO3a. Let the lengths, extending along the light path, of the electro-optic devices EO2a, EO3a be $l_4$, $l_5$, respectively; let the refractive index be $n_4$, $n_5$, respectively; let distinace exclusive of length $l_4$ extending along the light path between half mirror HM5a and mirror M1a be $L_4$; let the distance, exclusive of length $l_5$, extending along the light path between the half mirror HM5a and mirror M2a be $L_5$; and let the integer be q. Then, in this case, the oscillation frequency $f_{o3}$ is $$f_{o3}=q\cdot c/2(L_4+n_4(V_1)l_4)-(L_5+n_5(V_2)l_5) \quad (2)$$

Since the denominator of formula (2) can be made smaller than that of formula (1), it is feasible to increase the variable range of the oscillation frequency as compared with the arrangement of FIG. 20.

Figure 22:
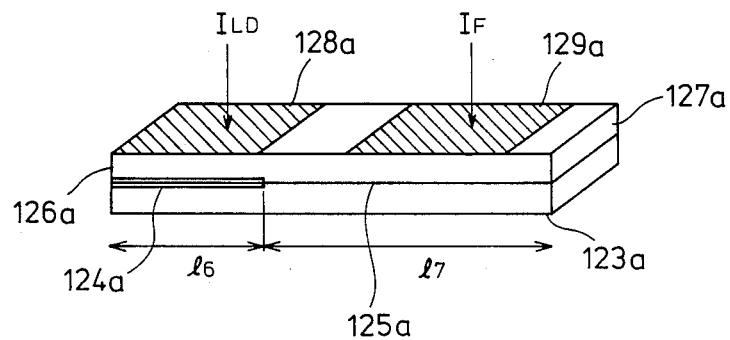
FIG. 22 is a perspective view depicting a fourth example of a tunable laser.

FIG. 22 depicts the tunable laser of FIG. 20 arranged on a single semiconductor chip in an integrated circuit, and comprises a laser diode 123a formed of AlGaAs, InGaAsP; a photo amplifier 124a provided at the joined portion of laser diode 123a; a waveguide path type external resonator 125a; mirrors 126a, 127a provided at both ends of laser diode 123a; an electrode 128a provided on the surface of laser diodes 123a such as to correspond to photo amplifier 124a; and electrode 129a provided on the surface such as to correspond to the waveguide path type external resonator 125a. An electric current $I_{LD}$ is supplied to the joint through electrode 128a, and laser beams are emitted to photo amplifier 124a. An electric current $I_F$ is supplied via electrode 129a to resonator 125a and the refractive index of resonator 125a is varied, thereby sweeping the oscillation frequency. Let the lengths extending along the joined portion of the resonator 125a and the photo amplifier 124a be $l_6$, $l_7$, respectively; let the refractive indices be $n_6$, $n_7$, respectively; and let the integer be r. Then, oscillation frequency $f_{o4}$ is $$f_{o4}=r\cdot c/2(n_6 l_6+n_7(I_F)l_7) \quad (3)$$

Figure 23:
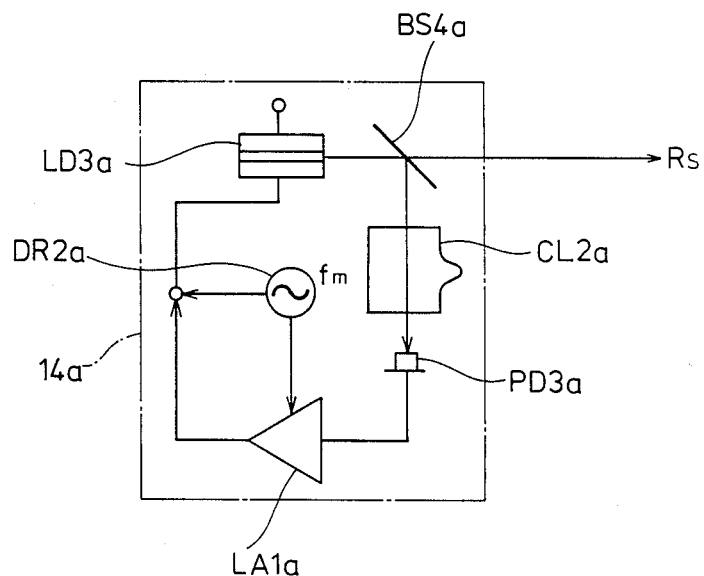
FIG. 23 is a block diagram depicting one example of a reference wavelength laser light source used in the arrangement of FIG. 10.

FIG. 23 depicts details of a reference wavelength laser light source 14a, such as used in the marker attached source 310a of FIG. 10 and comprises a semiconductor laser LD3a; a beam splitter BS4a upon which output light from laser LD3a strikes; an absorption cell CL2a comprising a standard substance, e.g. Cs, and which receives light reflected by beam splitter BS4a; a light receiving detector PD3a upon which light transmitted through cell CL2a falls; a lock-in amplifier LA1a for inputting electric output from detector PD3a and for controlling electric current applied to laser LD3a in response to the electric signals from detector PD3a; and an oscillator DR2a for frequency modulating the electric current applied to laser LD3a and for supplying a phase detecting frequency from lock-in amplifier LA1a. The light transmitted by beam splitter BS4a becomes the output light of the source. The standard substance may also be Rb, NH$_3$ or H$_2$O.

The output light from laser LD3a is reflected by beam splitter BS4a, strikes absorption cell CL2a and is subjected to absorption by the standard substance therein. The quantity of absorption is detected by detector PD3a and is fed back via lock in amplifier LA1a to the electric current applied to laser LD3a. The output wavelength of laser LD3a is locked to absorption spectral beams of the standard substance, so that a reference wavelength light is produced by the source with high accuracy and high stability.

One method of absorption is using the linear absorption method. In this method, the absorption spectrum becomes relatively large in thickness by virtue of the Doppler shift. The absorption beams having a hyperfine structure which are hidden due to the Doppler shift are detected by saturated absorption spectroscopy (see T. Yabuzaki, A. Hori, M. Kitano, and T. Ogawa, "Frequency Stabilization of Diode Lasers Using Doppler Free Atomic Spectra", Proc. Int. Conf. Laser, 1983).

The oscillation wavelength of the laser LD3a is locked to the thus detected absorption beams, whereby much higher stability can be obtained.

Figure 24:
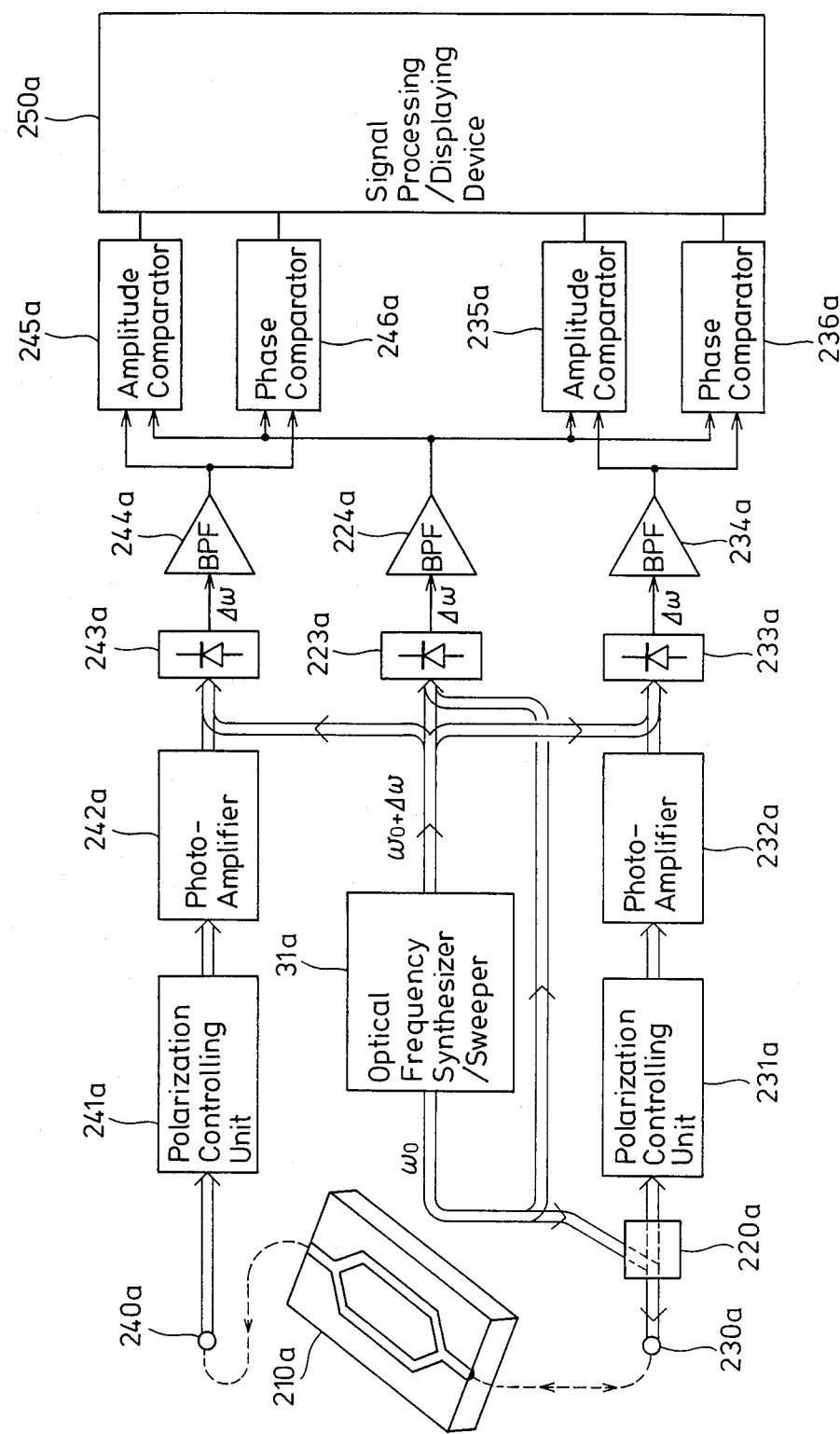
FIG. 24 is a block diagram of a third illustrative embodiment of the invention.

An optical frequency synthesizer/sweeper, which will be described hereinbelow, may be used as the tunable laser 12a in FIGS. 10-13. FIG. 24 depicts one such synthesizer/sweeper is depicted. The synthesizer/sweeper 31a sends forth a frequency swept light output (constituting an optical frequency sweeping device), and will be discussed with respect to FIG. 26. A sweeping signal generator is omitted from this FIG. 24 arrangement. The arrangement of FIG. 24 comprises a optical frequency analyzer and comprises the frequency synthesizer/sweeper 31a; an optical heterodyne detecting member 223a for inputting first and second beams of output light from synthesizer/sweeper 31a; filter 224a comprising a band pass filter for inputting electric output from optical heterodyne detector 223a; optical directivity coupler 220a which inputs a first beam of output light from optical frequency synthesizer/sweeper 31a; an emergent terminal 23a from which output light from optical directivity coupler 220a emerges; an object to be measured 210a for receiving output light from emergent terminal 230a; an incident terminal 240a upon which light emerging from object 210a strikes; a polarization control unit 241a which makes use of a magnetic optical effect crystal (YIG, lead, glass or the like) for inputting incident light from incident terminal 240a; a photo amplifier 242a for inputting output from polarization control unit 241a; an optical heterodyne detector 243a comprising a PIN photodiode, avalanche photodiode or the like, for receiving a second beam of output light from photoamplifier 242a and from synthesizer/sweeper 31a; filter 244a comprising a band pass filter for receiving electric output from heterodyne detector 243a and amplifying such signal; an amplitude comparator 245a for receiving electric signals from filters 244a, 224a; a phase comparator 246a for receiving electric outputs from filters 244a, 224a; polarization control unit 231a, similar to control unit 241a, which receives reflected light from the object 210a through coupler 220a; photo amplifier 232a, similar to photo amplifier 242a, for inputting output light from control unit 231a; optical heterodyne detector 233a, similar to detectors 243a, which receives a second beam of output light from photoamplifier 3232a and from synthesizer/sweeper 31a; filter 234a, similar to filter 244a, for receiving electric output from heterodyne detector 233a, and comprising a band pass filter; amplitude comparator 235a, similar to comparator 245a, for receiving electric outputs from filters 234a, 224a; phase comparator 236a, similar to phase comparator 246a, for receiving electric outputs from filters 234a, 224a; and signal processing/displaying unit 250a for receiving electric outputs from phase comparators 236a, 246a.

A first optical heterodyne detector may be considered to comprise heterodyne detectors 233a, and 243a. A first filter device may be considered to comprise filters 234a and 244a. A second optical heterodyne detector may be considered to comprise detector 223a. A second filter device may be considered to comprise filter 224a. A comparison means may be considered to comprise phase comparators 236a, and 246a and amplitude comparators 235a and 245a. A signal processing means may be considered to comprise signal processing/displaying device 250a. The photo amplifiers may be similar to the photoamplifier 2a shown in FIG. 5. Heterodyne detectors 233a, 223a and 243a may be similar to the optical heterodyne detector 4a shown in FIG. 5.

Operation of the FIG. 24 embodiment is as follows. Synthesizer/sweeper 31a frequency sweeps the light output, and outputs it with high accuracy and high stability and high spectral purity. The first light output which is outputted from synthesizer/sweepr 31a is frequency shifted by $\Delta\omega$ by an optical frequency shifter (not shown) comprising an ultrasonic modulator, thereby becoming a second light output. The first light output, having a frequency $\omega_o$, from synthesizer/sweeper 31a strikes object 210a via coupler 220 and terminal 230a, and the emergent light from the object 210a is inputted via incident terminal 240a to control unit 241a.

Control unit 241a controls an impressed magnetic field by making most of the rotary polarization of its magnetic optical effect cyrstal, and a polarization plane of the input light is thereby arranged to be identical with that of the local oscillation light (second light output). The output from control unit 241a is synthesized with the local oscillation light from synthesizer/sweeper 31a by a half mirror (not shown) after being amplified by photo amplifier 242a. The synthesized output is then converted by heterodyne detector 243a into an electric signal having a frequency equivalent to the difference $\Delta\omega=(\omega_o+\Delta\omega)-\omega_o$. The electric output from heterodyne detector 243a is partially transmitted through filter 244a due to its band pass filter properties and becomes a reference signal. The first output, having frequency $\omega_o$, from synthesizer/sweeper 31a is directly synthesized with local oscillation light having frequency $\omega_o+\Delta\omega$, by a half mirror or the like, and is then converted into an electrical signal having a frequency equivalent to the difference $\Delta\omega$ between the two frequencies by heterodyne detector 223a and outputted to filter 224a.

The electrical signal output which is influenced by the properties of object 210a, from filter 244a and a reference signal, which is not influenced by the properties of object 210a, from filter 224a (see path synthesizer/sweeper 31a, detector 223a, filter 224a) are compared with respect to the amplitudes thereof in amplitude comparator 245a and are further compared with respect to the phase thereof in phase comparator 246a. The electric outputs from amplitude comparator 245a and phase comparator 246a are signal processed by signal processing/displaying device 250a, whereby the propagation characteristics of object 210a are displayed. The reflected light outputted from object 210a via emergent terminal 230a and directivity coupler 220a is likewise consecutively processed in polarization control unit 231a, photo amplifier 232a, heterodyne detector 233a, filter 234a, amplitude comparator 235a, phase comparator 236a, and signal processing/displaying circuit 250a, whereby the reflection characteristics of object 210a are displayed.

When the light waveguide path is an object to be measured, it is feasible to measure wavelength characteristics of the phase difference or the propagation loss of the waveguide path. On the other hand, if an optical fiber is the object to be measured, measurement becomes possible by utilizing the fiber in such a manner that the wavelength characteristics of delay and propagation loss are short. When a laser diode photo amplifier is the object being measured, the wavelength characteristics of amplification gain, phase delay, and the like can be measured. Furthermore, reflection loss at an optical contact point can be measured from the characteristics of the reflected light. Thus, it can be appreciated, that with the invention, it is possible to measure the amplitude, phase and wavelength characteristics and the like in a highly accurate manner. Moreover, it is feasible to readily and simultaneously measure the propagation characteristics (e.g. loss, phase, delay, gain and the like) of the object to be measured and the reflection characteristics thereof.

In the FIG. 24 embodiment, filters 224a, 234a, 244a, comprise band pass filters. However, other filters, such as a low pass filter, can be used. In the latter case, the equation $\Delta\omega = 0$ is established.

Operational frequencies used in FIG. 24 are as follows: Wavelength $\omega_s$ is 780 nm (wavelength of laser diode locked to absorption beam of Rb); Wavelength of $\omega_o$ is 1560 nm $\pm$ 50 nm; and Frequency of $\Delta\omega$ is 100 MHz. These frequencies are the most suitable for optical communication systems, and also effective in the measurement of light communication devices.

In the FIG. 24 embodiment, the reference signal used for the comparison device is obtained using second heterodyne detector 223a and second filter 224a. The invention, however, is not limited to these types of devices. For example, a modulation signal (corresponding to shift frequency $\Delta\omega$) applied to a frequency synthesizer/sweeper 31a may be used. In this case, the configuration can be simplified by omitting heterodyne detector 223a and filter 224a.

The light which emerges from the network analyzer and travels to the object 210a is not limited to continuous light but may comprise pulse light. It is also feasible to measure the wavelength characteristics with respect to a pulse light by sweeping the optical frequency while synchronizing with the pulse light.

Figure 25:
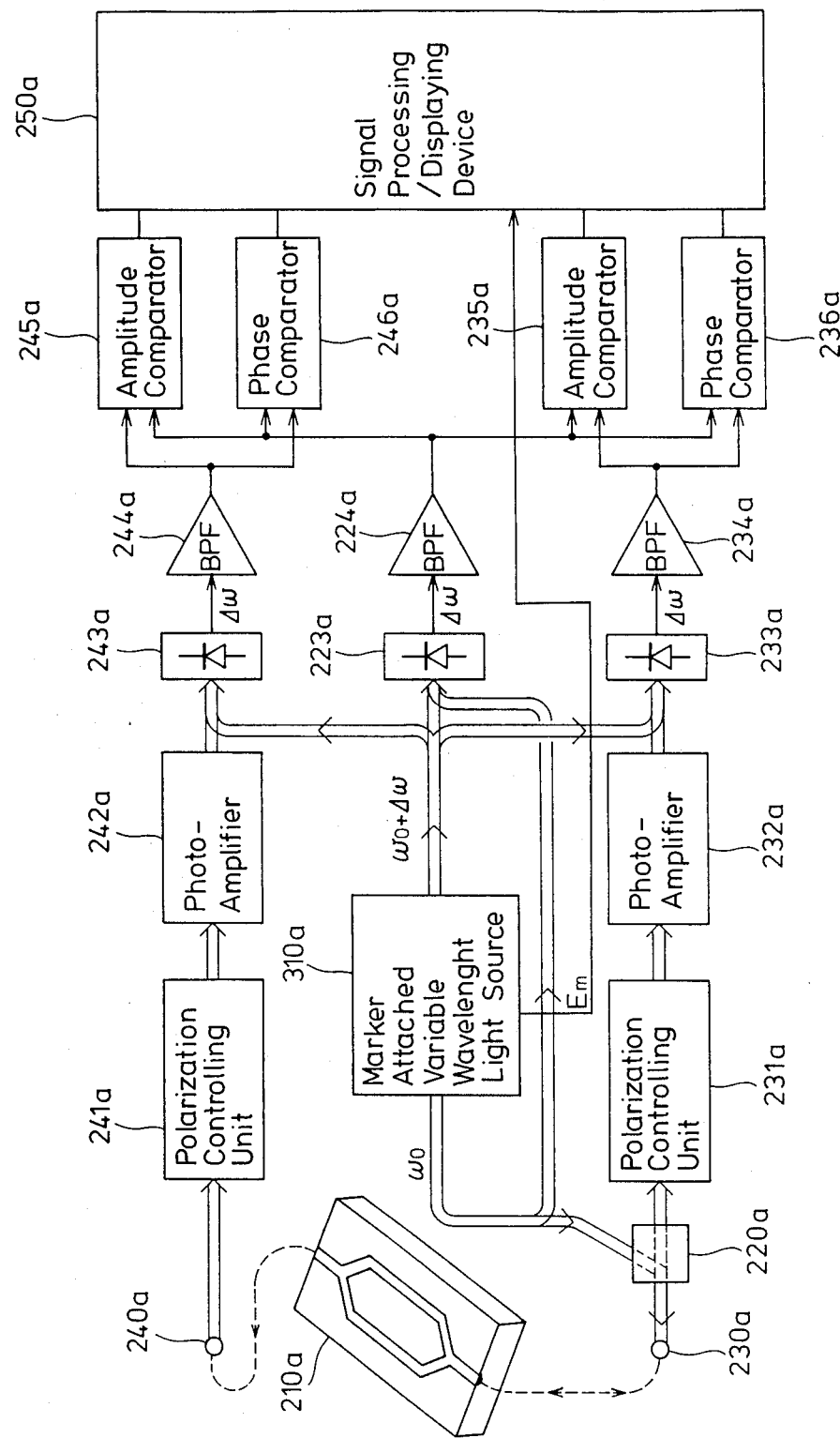
FIG. 25 is a block diagram depicting a fourth illustrative embodiment of the invention.

FIG. 25 describes a further analyzer similar to FIG. 24 except that a frequency sweeping device comprising marker attached variable wavelength light source 310a, similar to that used for the spectrum analyzer of FIG. 9, is used instead of synthesizer/sweeper 31a. A sweeping signal generator also is omitted. As with the FIG. 24 embodiment, a first variable wavelength output supplied from source 310a is frequency shifted by $\Delta\omega$ by an optical frequency shifter (not shown) thereby forming a second light output. Marker signal output Em from source 310a is inputted directly to signal processing/displaying device 250a, whereby a marker is displayed together with the respective characteristics.

The operational frequencies used in FIG. 25 are: Wavelength $\omega_o$ is 1560 nm $\pm$ 50 nm; and Frequency of $\Delta\omega$ is 100 MHz. These frequencies are suitable for optical communication and measurement.

The FIG. 25 embodiment is simple and can precisely measure various frequency characteristics, such as phase, amplitude, and the like, using a simple variable frequency light source and by correcting the wavelength with use of a marker. In the embodiment, the second light output from variable source 22s (see FIG. 26) may be used as an input light for the optical frequency marker.

Figure 26:
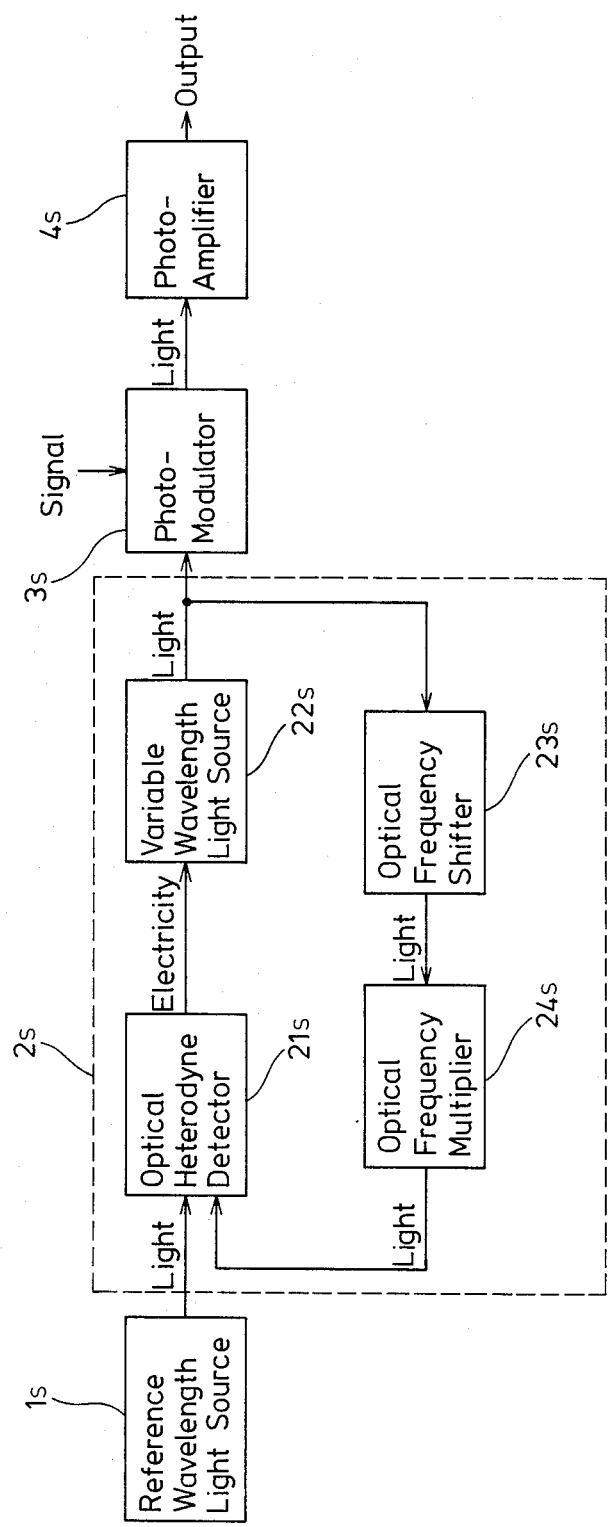
FIG. 26 is a block diagram depicting one example of an optical frequency synthesizer/sweeper used in the embodiments of FIGS. 5 and 24.

An example of the synthesizer/sweeper used in FIGS. 5, 24, is depicted in FIG. 26, and comprises reference wavelength light source 1s in which wavelength is stabilized; optical phase locked loop 2s for receiving light output from source 1s; photo modulator 3s for modulating output from loop 2s; and photo amplifier 4s for amplifying output from modulator 3s. Phase locked loop 2s comprises an optical heterodyne detector 21s which receives light, as an input at one side, from source 1s; variable wavelength light source 22s wherein the oscillation wavelength of output light is controlled by an electric output from heterodyne detector 21s; frequency shifter 23a for shifting the frequency of output from light source 22s; and optical frequency multiplier 24s for multiplying the frequency of output from shifter 23s and for supplying the output thereof as an input to the other side of heterodyne detector 21s.

Operation of the embodiment of FIG. 26 is as follows. When output from reference source 1s is inputted to loop 2s, loop 2s fixes, i.e. locks, the wavelength of the output to one corresponding to the oscillation wavelength of reference source 1s. To be specific, heterodyne detector 21s makes a comparison between the output light emitted from source 1s and output from multiplier 24s, and controls source 22s so as to diminish the difference between the two. Shifter 23s, in a feedback circuit, adds an offset frequency to the output light from source 22s. Multiplier 24s determines the ratio of frequency of output from source 1s to the frequency of output from source 22s. Modulator 3s modulates the output from loop 2s using another signal applied thereto. Amplifier 4s amplifies the output from modulator 3s and supplies the output as an output from the synthesizer/sweeper.

FIG. 27 depicts greater details of the components of FIG. 26 wherein light source 1s comprises a laser diode LD1s; absorption cell CL1s for receiving output light from laser diode LD1s and comprising Rb gas or Cs gas as the standard substance half mirror HM1s upon which output light from cell CL1s falls, photo diode PD1s for inputting light reflected by half mirror HM1s; control circuit A1s for inputting electric output from photo diode PD1s and for controlling electric current applied to laser diode LD1s by an output corresponding to the electric signal from PD1s; a returning light preventing isolator IS1s through which light transmitted through half mirror HM1s passes; and photo amplifier OA1s to which light penetrating isolator IS1s is inputted.

Phase locked loop 2s comprises half mirror HM2s to which is applied output from source 1s; photodiode PD2s comprising a PIN photodiode, avalanche photodiode, or the like, for inputting light transmitted through half mirror HM2s (photodiode PD2s constitutes heterodyne detector 21s); an oscillator ECs which generates an electric signal having a predetermined frequency by inputting reference frequency from a crystal; an a mixer circuit MX1s to which both the electric output from oscillator ECs and electric output from heterodyne detector PD2s are connected and having an output supplied to source 22s.

The variable wavelength light source 22s comprises frequency modulating circult FCs to which is applied output from mixer MX1s; tunable laser diodes VL1s, VL2s, VL3s for receiving outputs from frequency modulating circuit FCs; isolators IS2s through which fluxes of output light from diodes VL1s, VL2s, VL3s pass (isolators IS2s comprise YIG, for example); and an optical switch OS1s for receiving respective outputs from isolators IS2s.

The loop 2s further comprises half mirror HM3s upon which the output from switch OS1s strikes; photo amplifier OA2s for receiving output light reflected by half mirror HM3s; an ultrasonic modulator UM1s for receiving output light from photo amplifier OA2s (modulator UM1s constitutes the optical frequency shifter 23s); light waveguide path NLs comprising a non-linear material, for receiving output from shifter 23s (path NLs constitutes the frequency multiplier 24s); and photo amplifier OA3s for amplifying the output from path NLs.

Photo modulator 3s, which receives output from loop 2s, comprises amplitude modulator AM1s and phase modulator PM1s, both comprising electro-optical crystals, such as LiNbO3; polarizing modulator LM1s which uses a magneto-optical crystal such as YIG. Photo amplifying member 4s comprises photo amplifier OA4s and amplifies the output from photo modulator 3s.

Figures 28A, 28B:
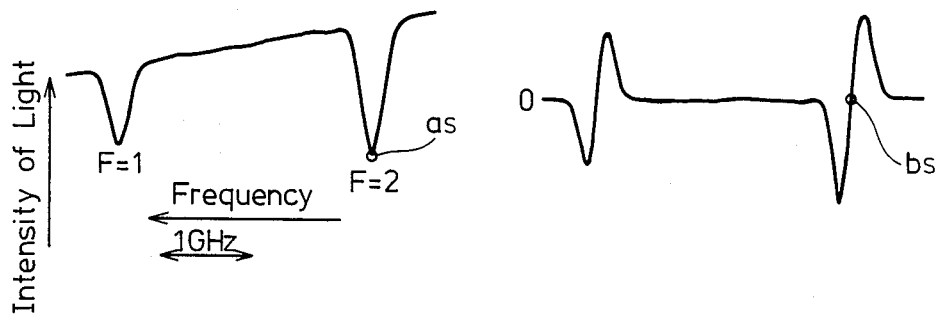
FIGS. 28(A), 28(B) are wave charts showing characteristic curves of the arrangement of FIG. 27.

Operation of the FIG. 27 embodiment is as follows. Source 1s, as will be described later, controls the oscillation wavelength of laser diode LD1s to absorption beams of Rb or Cs atoms, for example, thereby producing high accuracy and high stability (e.g. at more than $10^{-12}$) at an absolute wavelength. If the wavelength of the output from laser diode LD1s, when passing through absorption cell CL1s, accords with the absorption beams of Rb gas (or Cs gas), the output from diode LD1s is absorbed. The absorptive properties are shown in FIG. 28(A).

Figure 29:
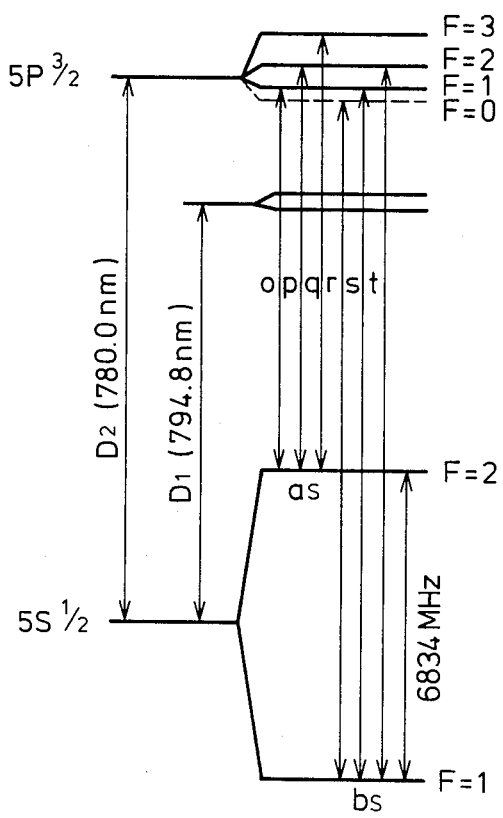
FIG. 29 is an energy diagram depicting energy levels of Rb gas.

FIG. 29 depicts an energy level diagram of Rb gas. The absorption beams of Rb are such that a $D_2$ beams is 780 nm and a $D_1$ beam is 795 nm. If the beams are multiplied, the results become 1560 nm and 1590 nm, respectively. These numeric values fall within a zone of 1500 nm which is preferred for optical communications, and for photo applied measurements.

Some fluxes of output from cell CL1s are reflected by half mirror HM1s and are then detected by photo detector PD1s. Thereafter, the output wavelength from laser diode LD1s is locked to the center of absorption by controlling the electric current applied to laser diode LD1s in control circuit A1s such as to correspond to the output from photodetector PD1s. For example, when the output wavelength is to be locked to a point $a_s$ of FIG. 28(A), it is fixed to a point $b_s$ (value of differential waveform becomes zero) of FIG. 28(B) which is a differential waveform of FIG. 28(A) in control circuit A1s by using a lock-in amplifier. This is referred to as the "linear absorption method". According to this method, the absorption spectrum becomes wide as in the case of FIG. 28(A). However, absorption beams of a hyperfine structure, which are concealed on account of Doppler shift, are detected by "saturated absorption" spectroscopy, and if the oscillation wavelength of laser diode LD1s is locked to the detected absorption beams, still higher stability is obtained.

Laser diode LD1s can be stabilized in temperature by use of a constant temperature oven. The light transmitted by half mirror HM1s strikes isolator IS1s. Isolator IS1s prevents light returned from the outside by reflection from changing into noises. The output from isolator IS1s is, as occasion arises, amplified by photo amplifier OA1s.

Loop 2s locks the oscillation wavelength of variable source 22s to the oscillation wavelength of reference source 1s at a predetermined offset and ratio. The output from source 1s passes through half-mirror HM2s and falls upon photo diode PD2s of heterodyne detector 21s. Light fed back from multiplier 24s is amplified by photo amplifier OA3s and reflected by half mirror HM2s and then strikes photo diode PD2s. Let the frequency of output from source 1s and the optical frequency of feedback light be $\omega_s$ and $\omega_1$, respectively, and let the frequency $\omega_2$ of output electrical signal from heterodyne detector 21s be given by $\omega_2 = |\omega_s - \omega_1|$.

Then, provided that the frequency of output from oscillator ECs is $\omega_3$, the output $\omega_4$ of mixer MX1s (which is a phase detecting circuit) is expressed $\omega_4 = \omega_2 - \omega_3$, when the offset frequency is added to the output frequency $\omega_2$ of heterodyne detector 21s. Output electrical signal $\omega_4$ of mixer MX1s is inputted to frequency modulation circuit FCs of variable source 22s, and circuit FCs controls the optical frequencies of tunable laser diodes VL1s, VL2s, VL3s, so that the equation $\omega_4 = 0$ is established.

In connection with the diodes VL1s, VL2s, VL3s, since a resonator is constituted by making the most of the reflection on a diffraction grating incorporated in a diode chip and the oscillation frequency is determined by the pitch of the diffraction grating, there may be used a DFB (distributed feedback) laser and an ADFB (acoustic DFB) laser which is classified as kind of DBR (Distributed Bragg Reflector) (see Yamanishi, M, et. al, "GaAs Acoustic Distributed Feedback Lasers", Jpn. J. Appl. Phys., Suppl. 18-1, P. 355, 1979). These lasers have comparatively stable wavelengths. The ADFB laser generates a surface elastic wave (SAW) such as to be orthogonal to the diffraction grating provided within the DBR laser, and forms an optical ring resonator based on Bragg diffraction which requires the diffraction grating which is incorporated in the chip and the surface eleastic wave. When sweeping the wavelength of the SAW, the resonant wavelength of the ring resonator varies, thereby making it possible to sweep the oscillation wavelength.

In this embodiment, the oscillation wavelength falls within a zone of 1560 nm. The DFB laser, the DBR laser and the ADFB laser which individually include a lengthy resonator have advantages in that the oscillation spectrum is narrow, and the spectrum has good purity. Where the variable wavelength range of a single ADFB laser is insufficient, a plurality of ADFB lasers (VL1s, VL2s, VL3s), may be used, as shown in FIG. 27, whereby it is feasible to perform change-over operation with the aid of an optical switch or light wave synthesizer. Namely, the fluxes of output light from diodes VL1s, VL2s, VL3s are inputted via isolators IS2s to optical switch OS1s, wherein light having a desired variable wavelength range is selected. The fluxes of output light from switch OS1s is partially reflected by half mirror HM3s and are then inputted to photo amplifier OA2s.

The output from amplifier OA2s is inputted to shifter 23s and applied to modulator UM1s, thereby outputting Bragg's s-dimensional diffracted light. Let the frequency of ultrasonic signals supplied from a reference frequency source, such as a crystal oscillator, be $\omega_5$, and the optical frequency of the diffracted light shifts be $s_{107}$ 5.

The output from shifter 23s strikes multiplier 24s, and a secondary higher harmonic wave of the input light is outputted at waveguide path NLs. The tunable laser diode output of 1560 nm is inputted through photo amplifier OA2s, and a signal of 780 nm of a secondary higher harmonic wave is outputted. As a waveguide path NLs, there is used a slab light waveguide path having a quadruple layer of air-$TiO_2$-ZnS-glass wherein a non-linear thin film of ZnS and a linear thin film of $TiO_2$ are used in order that non-linear effects are produced with high efficiency. In this embodiment, the secondary higher harmonic wave is utilized; however, discretionary n-dimensional higher harmonic wave may also be used.

The output from multiplier 24s is amplified by photo amplifier OA3s. Thereafter, at half mirror HM2s the output light from multiplier 24s is, as the feedback light, brought into confluence with output from source 1s.

In the FIG. 27 embodiment, the optical frequency $\omega_o$ of output loop 2s is $$\omega_o = (\omega_s \pm \omega_3)/n \pm s\omega_5 \quad (4)$$

(the symbols are not in the same order). In this embodiment, the optical frequency multiple n is 2. That is, $\omega_o$ is, at the predetermined ratio of n, locked to optical frequency $\omega_s$ which assumes high accuracy and high stability at the absolute wavelength, and has an offset of an arbitrary frequency $\omega_3/n$ or just $\omega_5$. If $\omega_3$ or $\omega_5$ is swept, it is possible to realize highly accurate sweeping of optical frequency. Since $\omega_3$ and $\omega_5$ are electrical signals, high accuracy and high stability can be readily obtained.

The output from loop 2s is inputted to modulator 3s and is amplitude modulated by means of an amplitude modulator AM1s. It is further modulated in phase by a phase modulator PM1s, and is then varied with respect to the direction of polarization by a polarization modulator LM1s. After light output from modulator 3s is amplified by amplifier OA4s of photo amplifier 4s, the amplified output becomes the output of the synthesizer.

In FIG. 27 amplifier OA1s to OA4s are the same as those utilized in amplifier 2a of FIG. 5. Also, the positions of shifter 23s and multiplier 24s may be interchanged. The frequency $\omega_o$ of output from loop 2s may be $$\omega_o = (\omega_s \pm \omega_3 \pm s\omega_5)/n \quad (5)$$

In loop 2s both mixers MX1s and shifter 23s are designed for adding offset frequencies, and any one of them may be omitted. Moreover, loop 2a may have its multiple n be 1, in which case, the multiplier 24s may be omitted. Furthermore, although the absorption beams of Rb of Cs are used in absorption cell CL1s of source 1s, other standard substances may be used, such as $NH_3$ or $H_2O$. Since the discretionary beams (1500 nm zone) of $NH_3$ are highly accurate and stable at the absolute wavelength, multipler 24s may be omitted in that case. Also, it is feasible to stabilize the wavelength by using a Fabry-Perot resonator as a wavelength detector. However, utilizing absorption beams that are standard in terms of quantum is superior to using such Fabry-Perot resonator.

The tunable laser diodes VL1s, VL2s, VL3s are not limited to the ADFB laser used in the embodiment. For example, an external resonator may be used which adopts the diffraction grating added to the outside of the laser diode chip with the diffraction grating being made to rotate, and a variable wavelength is obtained by making the most of its wavelength selectivity. A narrow spectrum is characteristic of such external resonator type laser diode. As another example, the devices of FIGS. 19-22, may be used.

Also, a W-Ni(tungsten-nickel) point contact diode and the Josephson element can be applied to the heterodyne detector 21s. These elements can both multiply and mix. Hence, it is possible to concurrently input $\omega_s$, $\omega_1$, $\omega_3$, thereby making unnecessary the mixer MX1s of FIG. 27. In this case, the outputs from these elements, viz., the frequencies of input signals to circuit FCs become $\omega_4 = \omega_s = \omega_1 + m\omega_3$ (m being a multiple). The equation $\omega_4 = \omega_s - 2\omega_1 \pm m\omega_3$ is also possible. In that case, multiplier 24s is not required.

Figure 30:
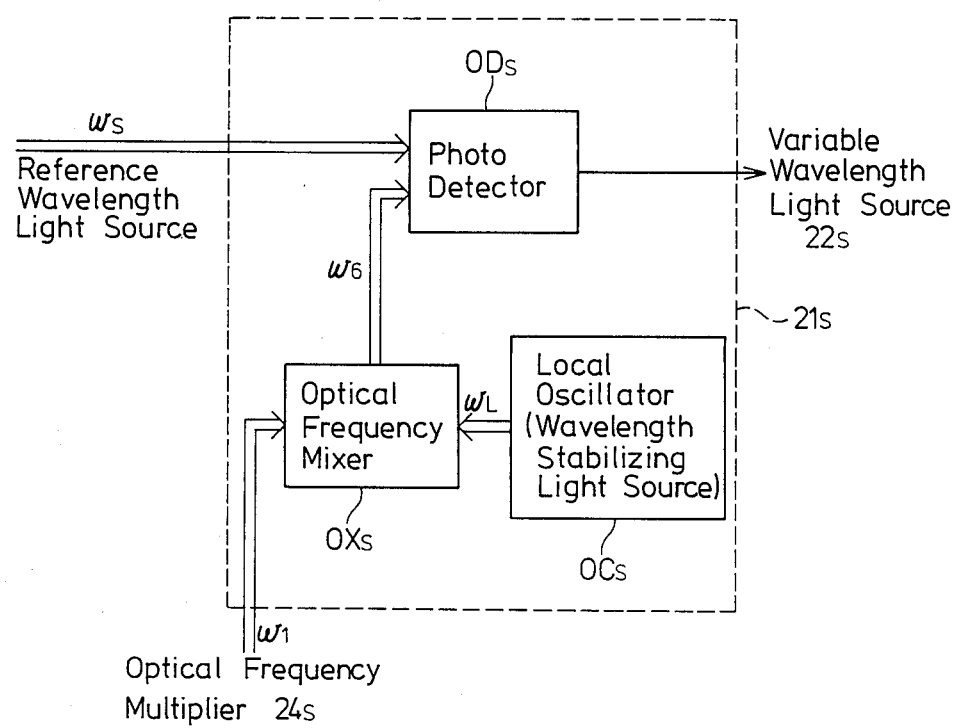
FIG. 30 is a block diagram depicting a third, partially varied, example of the arrangement of FIG. 26.

FIG. 30 depicts details of heterodyne detector 21s (of FIG. 27) which comprises local oscillator OLs of a optical frequency $\omega_L$ which utilizes a second wavelength stabilizing source; an optical frequency mixer OXs to which output from oscillator OCs and multiplier 24s are inputted via photo amplifier OA3s (this mixer comprises non-linear optical crystal); and a photo detector ODs comprises a PIN diode, an avalanche photo diode, or the like, for receiving output from mixer OXs and output from reference source 1s and for outputting electrical siganls to variable source 22s.

According to FIG. 30, by virtue of non-linear effect, the optical output frequency $\omega_6$ of mixer OXs is expressed as $\omega_6 = \omega_1 + \omega_L$. In the embodiment of FIG. 27, there is limitatively obtained only $\omega_1$ which is to be determined by $\omega_s = \omega_1 = n\omega_o$ (apart from the offset frequency) by multiplier 24s. In the embodiment of FIG. 30, however, it is possible to output light with many different wavelengths. For example, when the wavelength $\lambda_s$ of $\omega_s$ is so selected as to be 780 nm by using the absorption beam of Rb and when the wavelength $\lambda_L$ of $\omega_L$ is so selected as to be 852 nm by using the absorption beam of Rb, since there is the relation $1/\lambda_s = 1/\lambda_1 + 1/\lambda_L$ between the respective wavelengths $\lambda_s$, $\lambda_1$, $\lambda_L$ of $\omega_s$, $\omega_1$, $\omega_L$ because the relation $\omega_s = \omega_6$ that is valid in time of a feedback loop balance, the equation $\lambda_1 = 9230$ nm is obtained.

Figure 31:
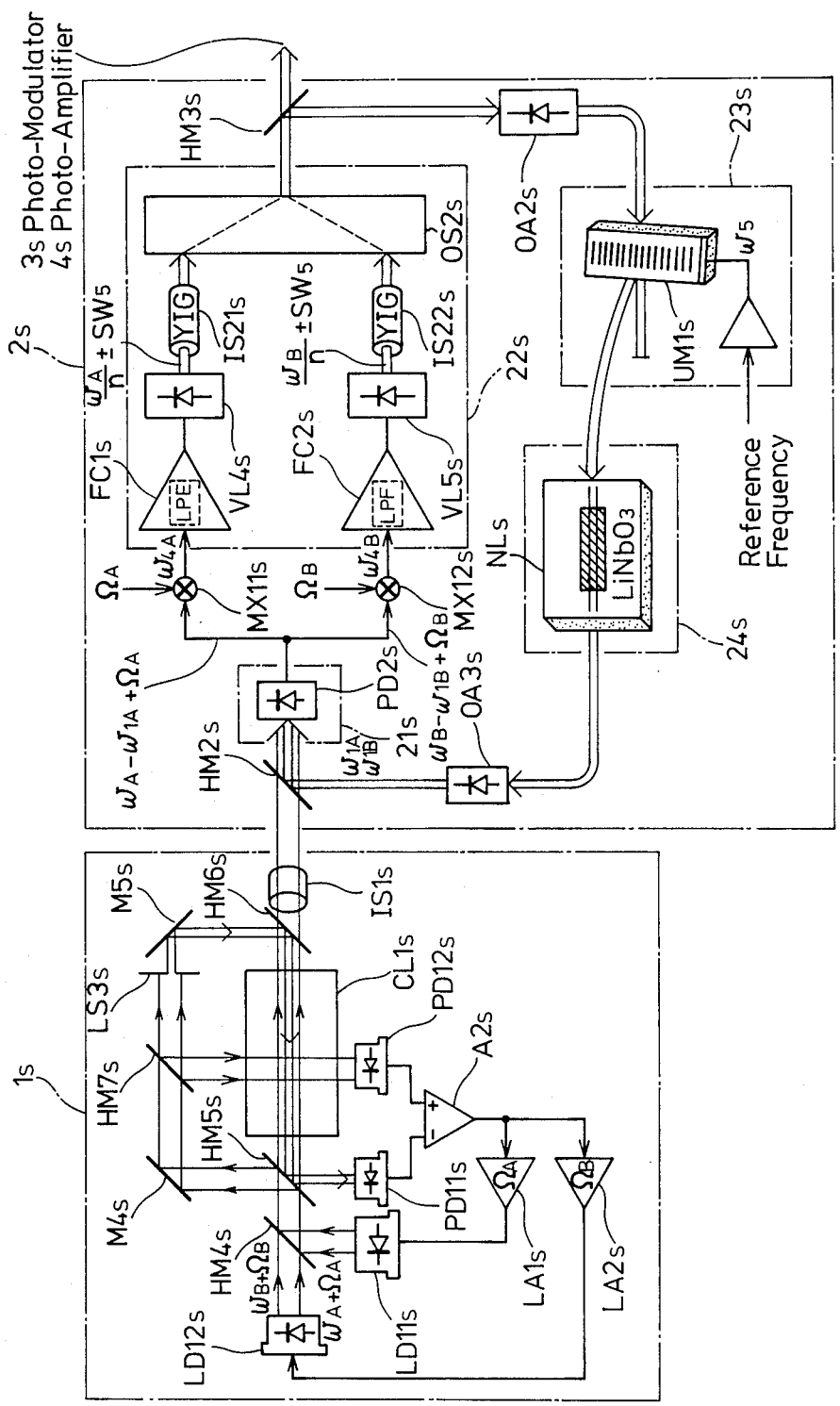
FIG. 31 is a block diagram depicting a fourth example of the arrangement of FIG. 26.

FIG. 31 describes an embodiment similar to FIG. 26, but of a synthesizer/sweeper which is capable of simultaneously outputting two optical frequencies. The arrangement comprises a reference wavelength light source 1s and phase locked loop 2s. The source 1s is a two wavelength stabilized laser diode which utilizes saturated absorption method and comprises laser diodes LD11s, LD12s, which generate laser outputs having different wavelengths; half mirror HM4s for causing the outputs from lasers LD11s, LD12s to become confluent with each other; half mirror HM5s for bidirectionally splitting output from half mirror HM4s; absorption cell CL1s (similar to that of FIG. 27) for receiving light transmitted through half mirror MH5s; half mirror HM6s upon which light emerging from cell CL1s strikes; a returning light preventing isolator IS1s through which output from half mirror HM6s passes; mirror M4s which receives light reflected by half mirror HM5s; half mirror HM7s upon which light reflected by mirror M4s falls; diaphragm LS3s for receiving light transmitted by half mirror HM7s; mirror M5s upon which output from diaphragm LS3 s strikes; a photo detector PD11s for receiving output from mirror M5s (as reflected by half mirror HM6s transmitted through cell CL1s and reflected by half mirror HM5s); photo detector PD12s for receiving light reflected by half mirror MH7s and transmitted through absorption cell CL1s; differential amplifier A2s for computing the difference between an electric output from photo detector PD11s and an electric output from photo detector PD12; lock in amplifiers LA1s, LA2s (which serve as driving circuits for laser diodes LD11s, LD12s) for receiving outputs from differential amplifier A2s and applying outputs to laser diodes LD11s, LD12s, respectively; and a returning light preventing isolator IS1s through which output light from half mirror HM6s passes.

Optical phase locked loop 2s is similar to FIG. 27, but differs in the following respects. Mixers MX11s, MX12s are provided for inputting an electric output from heterodyne detector 21s and FM modulation frequencies $\Omega_A$, $\Omega_B$. The variable source 22a comprises frequency modulation circuits FC1s, FC2s (which have LPF properties) for receiving outputs from mixers MX11s, MX12s; tunable laser diodes VL4s, VL5s, the oscillation frequencies thereof being controlled by the outputs from circuits FC1s, FC2s; returning light preventing isolators IS21s, IS22s for receiving outputs from respective tunable laser diodes VL4s, VL5s and preventing reflected light from becoming noise; and light wave synthesizer OS2s for inputting and synthesizing light outputs from isolators IS21s, IS22s. The other components are the same as that of FIG. 27.

The operation of the FIG. 31 embodiment is as follows. Provided that the outputs from diodes LD11s, LD12s are $\omega_A + \Omega_A$, $\omega_B + \Omega_B$, the two fluxes of light are synthesized in half mirror HM4s and are bidirectionally split by half mirror HM5s. The light transmitted through half mirror HM5s is supplied as saturation light to cell CL1s. Thereafter, the light is transmitted through half mirror HM6s and is then outputted via isolator IS1s to loop 2s.

On the other hand, light reflected by half mirror HM5s is further reflected by mirror M4s and is then split bidirectionally by half mirror HM7s. Light passing through half mirror HM7s is diaphragmed by diaphragm LS3s and is reflected by half mirror HM6s. The reflected light becomes probe light which is much narrower than the saturation light and is supplied to absorption cell CL1s. Then, the light is subjected to absorption accompanied with a sharp cavity formed in Doppler expansion by the saturation effect, is reflected by half mirror HM5s and strikes photo detector PD11s. Light that is reflected by half mirror HM7s, serving as reference light, is applied from a perpendicular direction to cell CL1s and then undergo absorption coupled with Doppler expansion.

Subsequently, the light is supplied to photo detector PD12s. Differential amplifier A2s computes the difference between electric outputs from photo detectors PD11s, PD12s and then supplies a difference signal to lock-in amplifiers LA1s, LA2s. With $\Omega_A$ serving as the reference frquency, lock-in amplifier LA1s effects synchronizing rectification, detects $\Omega_A$ components alone and controls laser diode LD11s, thereby locking it, for example, to absorption beams of F=1 of FIG. 28, to the center of anyone of absorption beams r to t shown in FIG. 29, which are respectively possessed of a hyperfine structure, the absorption beams being hidden by the Doppler shift.

Similarly, with $\Omega_B$ serving as the reference frequency, lock-in amplifier LA2s effects synchronizing rectification, detects $\Omega_B$ components alone and controls the laser diode LD12s, thereby locking it, for example, to absorption beams of F=2 of FIG. 28, to the center of any one of the absorption beams o to q shown in FIG. 29, which individually have hyperfine structures and are concealed by Doppler shift.

Thus, there is produced a two wave length stabilized light source having oscillation frequencies $\omega_A + \Omega_A$, $\omega_B + \Omega_B$. Two wavelength outputs from source 1s are inputted to loop 2s and are heterodyne detected by heterodyne detector 21s together with output from multiplier 24s. As a result, there are obtained detecting outputs with such frequencies as $|\omega_A - \omega_{1A} + \Omega_A|$, $|\omega_B - \omega_{1B} + \Omega_B|$, $|\omega_A - \omega A + \Omega_A + \Omega_B|$, $|\omega_A - \omega_{1B} + \Omega_A|$, $|\omega_B - \omega_{1A} + \Omega_B|$ (wherein $\omega_{1A}$, $\omega_{1B}$ are the frequencies of outputs from multiplier 24s). During operation of loop 2s, $\omega_A \approx \omega_{1A}$, and $\omega_B \approx \omega_{1B}$. Since $\Omega_A$, $\Omega_B$ are several KHz and the difference between $\omega_A$ and $\omega_B$ is, as shown in FIG. 29, 6.8 GHz, it is feasible to take out only the frequency components of $|\omega_A - \omega_{1A} + \Omega_A|$ and $|\omega_B - \omega_{1B} + \Omega_B|$ by imparting low pass properties to photo detectors PD2s. The mixers MX11s, MX12s mix the outputs from heterodyne detector 21s and input signals having frequencies $\Omega_A$ and $\Omega_B$, thereby generating output signals $\omega_{4A} = |\omega_A - \omega_{1A}|$; $\omega_{4B} = |\omega_B - \omega_{1B}|$.

In variable source 22s, the frequency modulation circuits FC1s and FC2s respectively control oscillation frequencies of variable wavelength diodes VL4s, VL5s so that the frequencies of the output signals $\omega_{4A}$ and $\omega_{4B}$ from mixers MX11s, MX12s come to zero. The light outputs from laser didoes VL4s, VL5s are supplied via isolators IS21s, IS22s, to synthesizer OS2s wherein the outputs are synthesized, thereby generating light outputs having two optical frequencies of $\omega_A/n + s\omega_5$, and $\omega_B/n \pm s\omega_5$. These light outputs are not frequency modulated at frequencies $\Omega_A$, $\Omega_B$.

Although the FIG. 31 synthesizer/sweeper generates two frequencies, more than two frequencies can be generated as desired. Also, although the saturation absorption method is used, linear absorption method can also be used wherein the two wavelengths locked to the center of absorption of F=1 and F=2 are shown in FIG. 28. In the latter case, the incident light to cell CL1s is arranged to be two fluxes of light and two lock-in amplifiers are used as components of the reference source 1s depicted in FIG. 27.

In FIG. 31, modulator UM1s alone is used for offset and sweeping of optical frequencies. However, frequencies $\omega_{3A} + \Omega_A$ and $\omega_{3B} + \Omega_B$ are available which are obtained by adding shift frequencies $\omega_{3A}$ and $\omega_{3B}$ thereto instead of input frequencies $\Omega_A$ and $\Omega_B$ of mixer MX11s, MX12s. In this case, the two optical frequencies of outputs become $(\omega_A \pm \omega_{3A})/n \pm s\omega_5$ and $(\omega_B \pm \omega_{3B})/n \pm s\omega_5$, respectively. Hence, it is possible to simultaneously sweep the two frequencies at $\omega_5$ and to separately sweep the two frequencies by sweeping $\omega_{3A}$ and $\omega_{3B}$, respectively.

As shown in each of the embodiments, the synthesizer/sweeper is capable of locking the light output thereof to the absorption beams of Rb or Cs at the absolute wavelength with high accuracy and high stability and of obtaining a quantum standard (conventional frequency standard uses microwave resonance of Cs (i.e. 9 GHz) or Rb (ie. 6 GHz)) having stability of $10^{-12}$ or more.

Since an ADFB laser, comprising a lengthy resonator and an external resonator type laser diode, is used as the tunable laser diode, the Q of the resonator is high, and the width of oscillation spectrum can be diminished. Also, since an optical phase locked loop is used, highly accurate sweeping of optical frequency can be performed.

By using absorption beams of Rb (780 nm, 795 nm) and the multiplication method as well, it is feasible to output with high accuracy and stability, light of the 1500 nm zone, which creates the least photo transmission loss. Thus, the invention is highly practical.

Furthermore, with this embodiment, many different optical frequencies can be outputted. In addition, it is possible to concurrently output a plurality of frequencies and to sweep them separately. Moreover, it is feasible to remove unnecessary FM modulation components from the light outputs. Similarly, in the embodiment of FIG. 27, if frequencies $\omega_{3'} = \omega_3 + \Omega$ (wherein $\Omega$ is the FM modulation frequency when using a lock-in amplifier) and such signal is inputted to mixer MX1s, such removal can be done.

Figure 32:
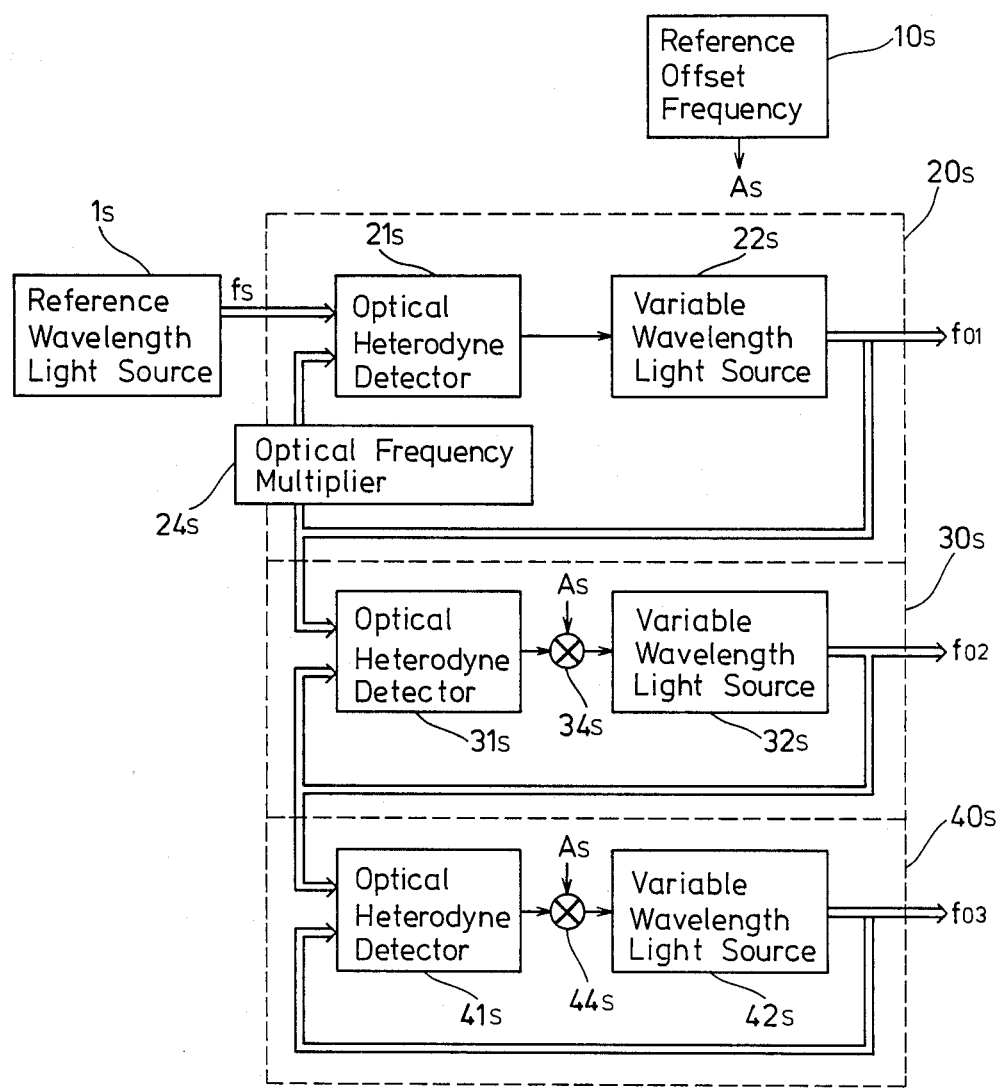
FIG. 32 is a block diagram depicting another example of the optical frequency synthesizer/sweeper wherein a multiple light source is formed.

FIG. 32 describes a synthesizer/sweeper similar to FIG. 27 wherein a plurality of light outputs are generated. The arrangement comprises a reference wavelength light source 1s wherein the wavelength is stabilized; a first stage optical phase locked loop 20s for receiving output light from source 1s; a second stage optical phase locked loop 30s for receiving output from first stage loop 20s; and a third stage optical phase locked loop 40s for receiving output from second stage loop 30s.

First stage loop 20s comprises an optical heterodyne detector 21s comprising PIN photo diode, an avalanche photo diode, or the like, for receiving output light from source 1s, at one side thereof as input; a variable wavelength light source 22s wherein an oscillation wavelength of the output light is controlled by electric output from heterodyne detector 21s; and an optical frequency multiplier 24s, comprising a light waveguide path formed of a non-linear material for multiplying the frequency of output from variable source 22s and at the same time supplying output to the heterodyne detector 21s at its other side as an input.

Each of the second stage and third stage loops 30s, 40s comprises heterodyne detectors 31s, 41s (similar to detector 21s) for receiving part of the output light, as an input at one side, from prior stge loops 20s, 30s; mixers 34s, 44s for receiving electric outputs from respective heterodyne detectors 31s, 41s, as input at one side, and a reference offset signal Ax at the other side (reference offset frequency circuit 10s comprises an oscillator for generating electric output AS with a given frequency); and variable wavelength light source 32s, 42s (similar to source 22s) for receiving outputs from mixer 34s, 44s and for supplying part of the output light to heterodyne detector 31s, 41s, as the inputs thereof at the other side, and outputting another part as output light $f_{o1}$, $f_{o2}$ of the embodiment.

Operation of the FIG. 32 embodiment is as follows. When output from source 1s is inputted to the first stage loop 20s, loop 20s controls (i.e. locks) its light output wavelength such as to correspond to the oscillation wavelength of source 1s. The output light from variable source 22 is supplied to multiplier 24s which outputs a secondary higher harmonic wave of input light on a light waveguide path formed of non-linear material. Heterodyne detector 21s outputs an electric signal (i.e. a beat signal) having a frequency equivalent to the difference between the frequency of the output light from reference source 1s and the frequency of the output from multiplier 24s. Variable source 22s controls the frequency of output light so that frequency of electric signal from detector 21s becomes zero. Namely, the output frequency from source 1s is equalized to that of multiplier 24s. Taking the results thus far obtained into consideration, let the frequency of the output from reference source 1s be fs, and output frequency $f_{o1}$ of output from variable source 22s be $$f_{o1} = (\tfrac{1}{2})fs \tag{6}$$

As far as this embodiment is concerned, the secondary higher harmonic wave is utilized in multiplier 24s. However, when an arbitrary n-dimensional higher harmonic wave is used, it is feasible to obtain the output frequency reduced by a factor of n.

Since the frequency offset frequency fos of reference offset circuit 10s is added to the frequency of the output from heterodyne detector 31s, the frequency of the output light from variable source 32 in the second stage loop 30s is $$f_{o2} = f_{o1} + fos = (\tfrac{1}{2})fs + fos \tag{7}$$

Similarly, the frequency of the output from variable source 42s in the third stage loop 40s is $$f_{o3} = f_{o2} + fos = (\tfrac{1}{2})fs + 2fos \tag{8}$$

Figure 33:
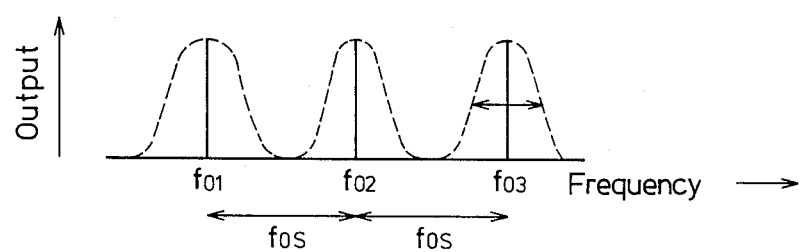
FIG. 33 is a graph depicting characteristic curves of the frequency spectrum of the output light of the arrangement of FIG. 32.

Namely, as shown in FIG. 33, which depicts a characteristic curve of the frequency spectrum, it is possible to precisely generate light output having the frequency interval fos (e.g. 10 GHz) from the respective stages of loops 20s, 30s, 40s of FIG. 32.

Advantageously, with the FIG. 32 embodiment, it is practicable to lock the reference light output thereof to the absorption beams of Rb at the absolute wavelength with high accuracy and high stability, thereby realizing the highly accurate source generating a plurality of output lights. Moreover, the frequency interval between the different light outputs can be controlled in a highly precise manner. In addition, since the respective frequency intervals are narrow and stable, a source of generating a plurality of highly dense optical signals can be realized.

Moreover, since an external resonator type laser diode is used as the tunable laser diode, it is feasible to increase the Q of the resonator and to reduce the width of oscillation spectrum. Furthermore, the absorption wavelength of the $D_2$ line of Rb is 780 nm in the reference source 1s, and this numeric value is multiplied in the first stage loop 20s, thus obtaining 1560 nm. Consequently, light output is generated which is within the 1500 nm zone, which is used in optical communication systems.

In the FIG. 32 embodiment, the offset frequency can be varied by interposing an ultrasonic modulator between the outputs from variable sources 32s, 42s and the inputs to heterodyne detectors 31s, 41s. Also, the multiple of the multiplier 24s may involve discretionary integers. If the multiple is 1, the multiplier 24 may be omitted. In this case, the respective frequencies of the output light are $$\begin{aligned} f_{o1} &= fs \\ f_{o2} &= fs + fos \\ f_{o3} &= fs + 2fos \end{aligned} \tag{9}$$

In this case, the first stage loop 20s may be omitted. Instead, the output from reference source 1s can be used as the first stage output light. Moreover, although identical reference offset frequency fos is added to each stage, a plurality of reference offset frequencies $fos_1$, $fos_2$, which are different from each other may be added thereto for different stages. In addition, although three stages are shown, the number of stages can be altered as desired.

Next will be described different circuit configurations of the reference wavelength light source 1s which may be used in the optical frequency synthesizer/sweeper.

Figure 34:
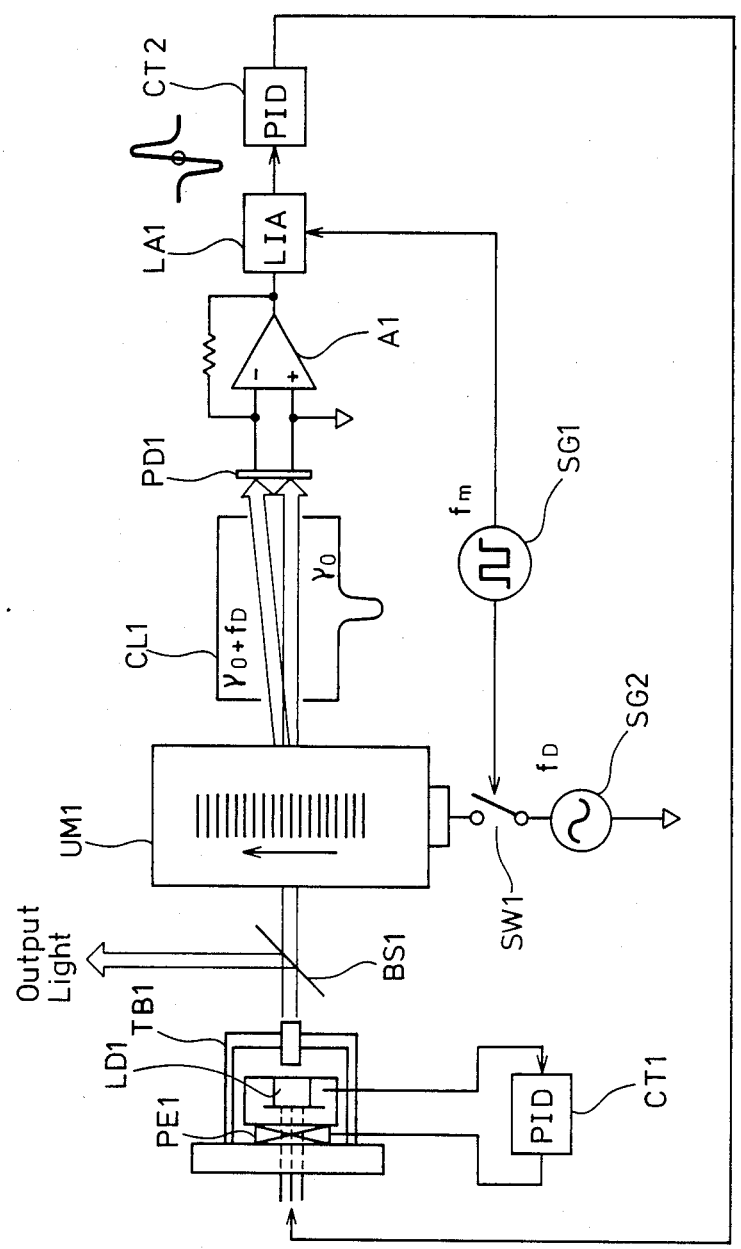
FIG. 34 is a block diagram depicting an example of a frequency stabilized semiconductor laser used as a reference wavelength light source.

FIG. 34 depicts a frequency stabilized laser which may be used as a reference wavelength light source, and comprises semiconductor laser LD1, a Peltier element PE1 for cooling off or heating laser LD1; temperatuure control means CT1 for controlling the temperature of laser LD1 to a fixed value by driving element PE1; a constant temperature oven TB1 for decreasing fluctuations in temperature by housing laser LD1 and element PE1; a beam splitter BS1 for bidirectionally splitting output from laser LD1; acousto-optic deflector UM1 upon which one flux of light transmitted through beam splitter BS1 strikes (deflector UM1 constitutes a modulation means); an absorption cell CL1 which receives diffraction light output from deflector UM1 (cell CL1 comprises a standard substance, eg. Cs, which absorbs light at a specified wavelength); an optical detector PD1 for receiving light transmitted through cell CL1; an amplifier A1 for inputting output electric signals from detector PD1; a lock-in amplifier LA1 for inputting electric outputs from amplifier A1; a PID controller CT2 which constitutes an electric current control circuit both for inputting outputs from lock in amplifier LA1 and for controlling electric current applied to semiconductor laser LD1; switch SW1 having one end thereof connected to deflector UM1; signal generator SG1 for supplying outputs for causing switch SW1 to be turned ON and OFF at frequency fm (e.g. 2 kHz); and second signal generator SG2, to which the other end of switch SW1 is connected for generating an electric signal having frequency $f_D$ (e.g. 30 MHz) which is applied to deflector UM1.

Operation of the FIG. 34 embodiment is as follows. The temperature of laser LD1 is controlled to a fixed value by Peltier element PE1 by control circuit CT1 which obtains temperature detecting signals within oven TB1 and supplies control signals to element PE1. Output from laser LD1 is bidirectionally split by beam splitter BS1. The reflected light becomes output light which is outputted as the reference wavelength light source, for example. The transmitted light is supplied to deflector UM1. Since deflector UM1 is driven by electric signals having frequency $f_D$ from signal generator SG2 when switch SW1 is ON, the majority of light having frequency $\omega_o$ is diffracted and is then subjected to frequency, i.e. Doppler, shift. Light having frequency $\omega_o + f_D$ which is defined as primary diffraction light is supplied to cell CL1. When switch SW1 is in an OFF state, incident light having frequency $\omega_o$ which is all defined as zero-dimensional diffraction light is supplied to cell CL1. Switch SW1 is driven by a clock having frequency fm which is provided by signal generator SG1. Hence, the light falling on cell CL1 undergoes frequency modulatoon with the modulation frequency being fm and the modulation depth being $f_D$.

Figure 35:
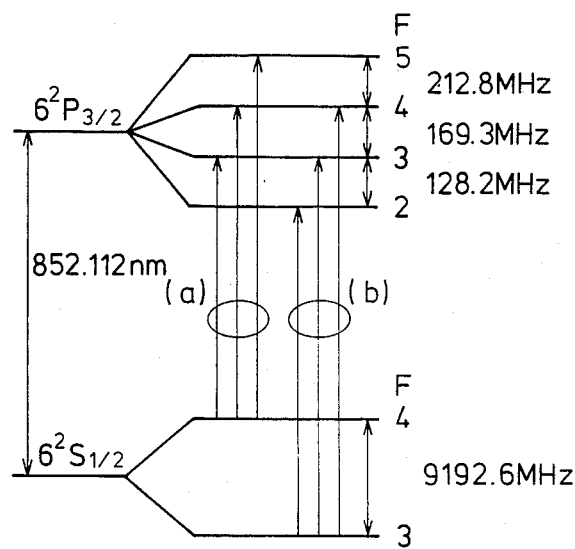
FIG. 35 is an energy diagram showing a hyperfine structure of the energy level of a Cs atom.
Figure 36:
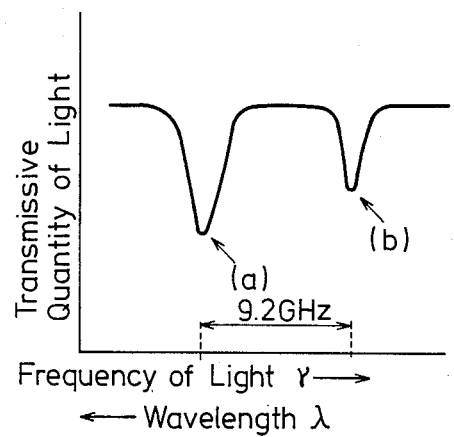
FIG. 36 is a graph depicting optical absorption caused by the Cs atoms.

FIG. 35 depicts energy levels of Cs atoms, wherein when light having a wavelength of 852.112 nm impinges on Cs atoms, carriers are excited from $6^2S_{1/2}$ to $6^2P_{3/2}$, and the light loses its energy, whereby absorption takes place. In this case, the levels of $6^2S_{1/2}$ and $6^2P_{3/2}$ have two or four hyperfine structures respectively. Strictly speaking, absorption thus occurs with respect to light having six types of wavelengths or frequencies between these levels. In fact, however, since the absorption spectrum width is several hundred MHz because of the Doppler expansion, no hyperfine structure having the level of $6^2P_{3/2}$ can usually be observed. Consequently, as shown in FIG. 36, it is observed that two kinds of absorption (a),(b) are present on the absorption spectrum line. Point (a) of the absorption signals shown in FIG. 36 involves the one sent from F4 and bundle (a) in FIG. 35, while point (b) depicted in FIG. 36 involves the one sent from F3 and bundle (b) shown in FIG. 36.

Figure 37:
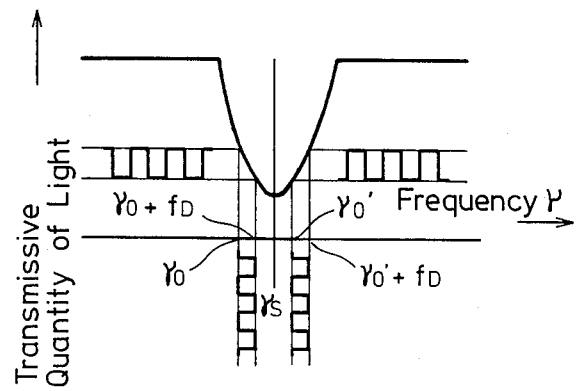
FIG. 37 is a diagram depicting operation of the arrangement of FIG. 34.
Figure 38:
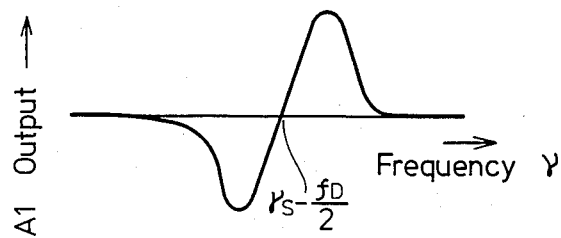
FIG. 38 is a graph depicting the characteristic curve of the arrangement of FIG. 34.

When light modulated by deflector UM1 falls upon absorption cell CL1, as depicted in FIG. 37, the signal appears in the output by transmitted light volume being modulated at the position alone (e.g. (a) of FIG. 36) of the absorption signals. Provided that this signal is converted into an electric signal by detector PD1 and the converted signal is then synchronously rectified at frequency fm in lock-in amplifier LA1 with aid of amplifier A1, there is obtained a primary differential waveform such as shown in FIG. 38. If the output of lock-in amplifier LA1 is locked (i.e. controlled) to the center of the primary differential waveform, the output light from laser LD1 will have the stable frequency of $\omega_s - f_D/2$.

According to the FIG. 34 embodiment, since the oscillating fequency of the laser is not modulated, the light source has high stability for instantaneousness of frequency variations.

Even if the diffraction efficiency of deflector UM1 is varied, an optical component (i.e. zero dimensional diffraction light) which does not contribute to the modulation increases in volume, whereas the signal intensity merely decreases; and no influence is exerted on the central wavelength.

Although modulation frequency fm is used as the reference frequency of lock-in amplifier LA1, frequencies of odd numbered multiples may also be used. Also, the standard substance used in cell CL1 may be Rb, Cs, $NH_3$ or $H_2O$. Furthermore, although deflector UM1 is used as the modulation means, a phase modulator which uses an electro-optic element may, for example, be used. This involves, for example, a longitudinal type modulator, a lateral type modulator and a travelling wave type modulator. Furthermore, although wavelength control is obtained by electric current applied to the semiconductor LD1 being controlled by electric signals from the control means, such wavelength control may be obtained by controlling the temperature of the laser.

Figure 39:
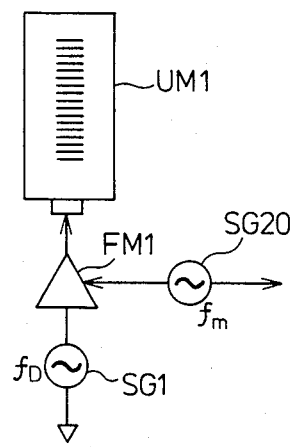
FIG. 39 is a block diagram depicting the principal portions of a second example of a frequency stabilized semiconductor laser.

FIG. 39 depicts another way of controlling deflector UM1, wherein an FM modulator FM1 is controlled by a sine wave generator SG20 (e.g. modulation frequency fm=2 kHz), whereby the acousto-optic deflector UM1 is modulated by sine waves.

Figure 40:
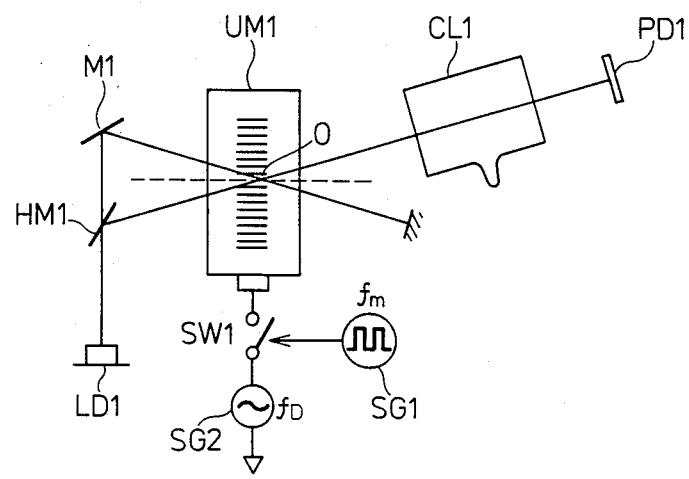
FIG. 40 is a block diagram depicting the principal portions of an optical system of a third example of a frequency stabilized semi-conductor laser.

FIG. 40 depicts principal portions of an optical system, wherein the output light from laser LD1 is made to twice impinge on deflector UM1. The arrangement comprises a half mirror HM1 designed for bi-directionally splitting output light from semiconductor laser LD1 and causing the reflected light to strike from one direction upon deflector UM1 and mirror M1 which reflects light which is transmitted through half mirror HM1, and causes the reflected light to strike from the other direction on deflector UM1. When switch SW1 is in the OFF state, light which is reflected by half mirror HM1 is transmitted through deflector UM1 and strikes cell CL1 at frequency $\omega_o$. When switch SW1 is ON, the light which is reflected by mirror M1 is diffracted by deflector UM1 and strikes absorption cell CL1 at frequency $\omega_o + f_D$ The FIG. 40 embodiment advantageously has a substantially constant light path within cell CL1. However, where there is used a phase modulator which utilizes an electro-optic element as the modulating means, the necessity does not arise, because the direction of the output light is substantially constant.

Figure 41:
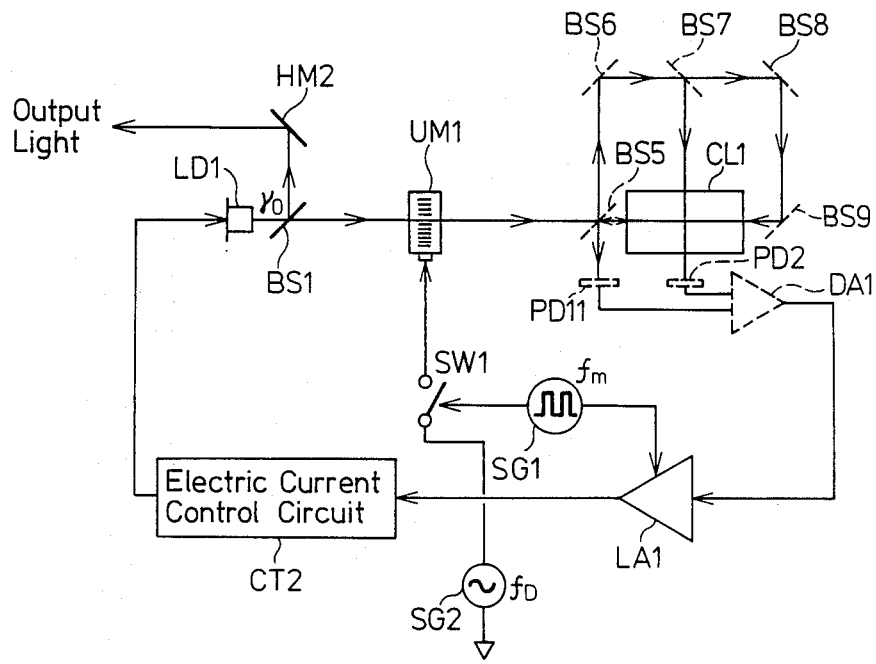
FIG. 41 is a block diagram depicting a fourth example of a frequency stabilized semiconductor laser.
Figure 42:
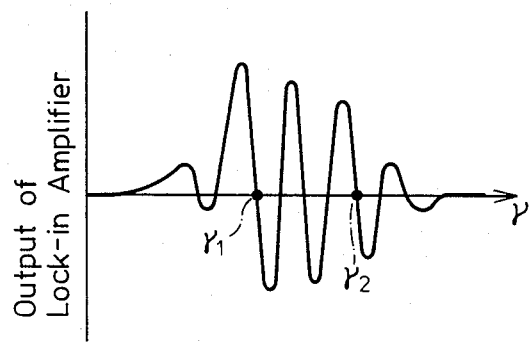
FIG. 42 is a graph depicting an output signal from a lock-in amplifier used in the arrangement of FIG. 41.

FIG. 41 depicts another stabilized wavelength light source, wherein one part of fluxes of emergent light from deflector UM1 is, as pump light, supplied to cell CL1, and the other part of narrow fluxes of emergent light is, as probe light, supplied from the opposite direction to absorption cell CL1, thereby obtaining saturated absorption signals. By virtue of this saturated absorption spectroscopy, the Doppler expansion disappears. Hence, it is feasible to distinguish the hyperfine structure which was previously explained with reference to FIG. 35. Since the output signals from the lock in amplifier LA1, which are based on the hyperfine structure shown in FIG. 42, can be obtained, it is possible to realize a still more stable frequency stabilized semiconductor laser by locking the output to any one (e.g. $\omega_1$ of FIG. 42) of the structures.

In FIG. 41, the portion indicated by a dotted line is different from FIG. 34, and comprises beam splitters BS5 to BS9, light receiving detectors PD11, PD2 and a differential amplifier DA1; and the outputs of differential amplifier DA1 are introduced into lock-in amplifier LA1. In such a case, the optical system arrangement of FIG. 40 can be used so that the direction of the output light from deflector UM1 does not vary substantially.

Figure 43:
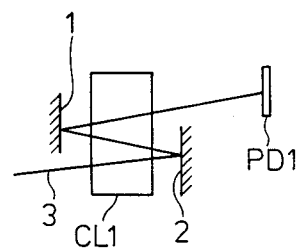
FIG. 43 is a block diagram depicting principal portions of a fifth example of a frequency stabilized semiconductor laser.
Figure 44:
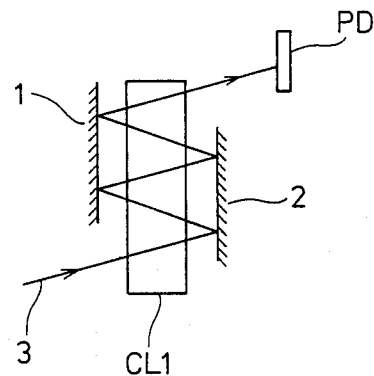
FIG. 44 is a block diagram depicting principal portions of a sixth example of a frequency stabilized semiconductor laser.
Figure 45:
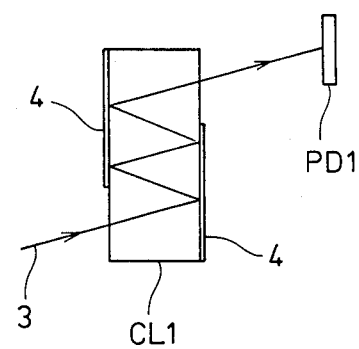
FIG. 45 is a block diagram depicting principal portions of a seventh example of a frequency stabilized semiconductor laser.

FIGS. 44,45 depict optical systems for enabling multiple passes of output light through absorption cell CL1 thereby to lengthen the effective length of exposure to absorption substance of the output light and hence increase efficiency and stability. In FIG. 43, which shows only a circumferential portion of the absorption cell CL1, there are provided reflection members 1,2 and a light path 3 for the output light from deflector UM1 which light comprises zero-dimensional diffraction light and primary diffraction light. The output from deflector UM1 passes through the cell CL1 and is then reflected by reflection member 2. The reflected light penetrates absorption cell CL1 once again and is similarly reflected by reflection member 1. After passing through absorption cell CL1, the output light strikes photo detector PD1. Since light penetrates cell CL1 three times, even if the length of the cell is reduced by a factor of three, the volume of absorption is the same. Or to put it another way, with the same absorption cell length, absorption is three times that for light passing through only once.

FIG. 44 is similar to FIG. 43, but due to adjustment of dimensions of cell CL1, mirrors 1,2 and angle of light application, there are five passes of light through cell CL1. In the same manner, the efficiency is increased five times, or cell size can be reduced by a factor of 5.

FIG. 45 is similar to FIG. 44, but mirrors 4 are of metallic thin film formed on the surfaces of absorption cell CL1, for example, by vapor deposition or other similar methods. With this arrangement, advantageously, it is possible to further reduce the size of the device.

Figure 46:
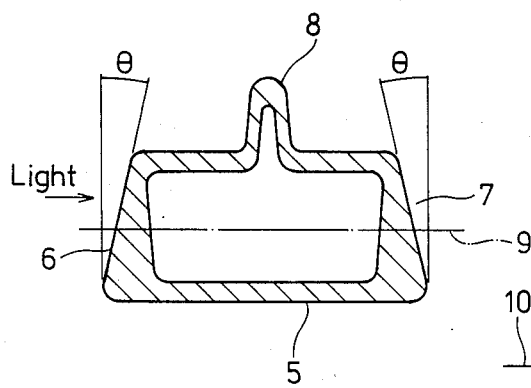
FIG. 46 is a cross sectional view depicting principal portions of an eighth example of a frequency stabilized semiconductor laser.

FIG. 46 is a cross sectional view cut by a plane including the central axis of the cell CL1, in the device of FIG. 34, and comprises vessel 5 forming the absorption cell CL1; incidence plane 6 of light; emergence plane of light 7; sealing port 8; and a central axis 9 of the cell CL1. Both the incidence plane 6 and emergence plane 7 are inclined at an angle $\theta$ to a plane perpendicular to the central axis 9.

Figure 47:
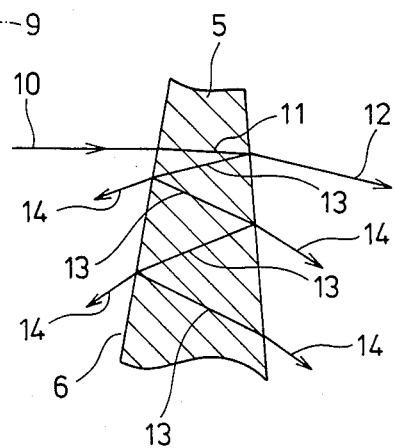
FIG. 47 is a diagram depicting operation of the device of FIG. 46.

FIG. 47 shows multiple reflections of light on incident plane 6, wherein a flux of incident light 10 impinges incident plane 6 of vessel 5, travels within vessel 5 as another flux of light 11, and exits as flux of transmitted light 12. Within vessel 5 the light is reflected a plurality of time as fluxes 13. Then, the light is exited when the light strikes at suitable angles the walls of vessel 5 as exited flux of light 14. Since incidence plane 6 is not parallel to a plane perpendicular to the central axis of the vessel 5, the multiple refected light fluxes 13, light flux 14 are reflected and exited in directions different from light flux 10. Thus, the incident light flux 11 and the multiply reflected light flux 13 do not interfere with each other at all; and, furthermore, incident light flux 10, transmitted light flux 12 and multiple reflected exit light flux 14 do not interfere with each other. Thus, no noise is caused by light interference, and hence the intensity of the transmitted light does not fluctuate together with the frequency, thereby producing stability. Although the description is in connection with the incidence plane 6, the same situation applies to the emergence plane 7.

The oblique angle $\theta$ varies in accordance with the thickness of the vessel 5, beam diameter of incident light or the like, but 2° to 3° are sufficient in ordinary cases. Vessel 5 is described to be in the form of a circular cylinder, however, it may assume other suitable configurations like angularity. In short, the incident plane and emergent plane are flat, and it is merely required that they be disposed with respect to each other. The incident plane 6 and emergent plane 7 of vessel 5 may comprise light transmissive material, and other portions thereof may be non-transmissive material. Furthermore, the slopes of the incident plane and the emergent plane need not necessarily be on both the inside and outside of vessel 5. It is sufficient that only one be inclined.

Figure 48:
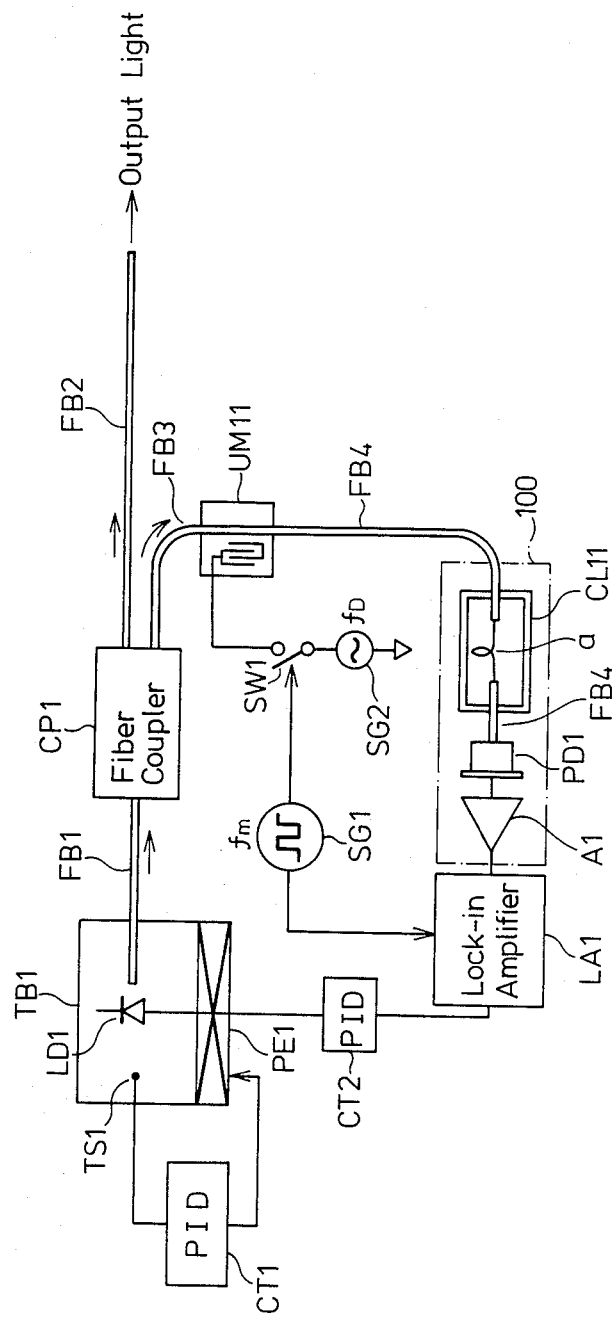
FIG. 48 is a block diagram depicting a ninth example of a frequency stabilized semiconductor laser.

FIG. 48 depicts a frequency stabilized laser wherein evanescent absorption of light is utilized, and comprising a single mode optical fiber FB1 which receives output light from semiconductor laser LD1; a fiber coupler CP1 for receiving output light from fiber FB1; another single mode optical fiber FB2 for transmitting one flux of output light from coupler CP1 and exited as output light of the source; a third single mode optical fiber FB3 which receives another flux of output light from coupler CP1; a waveguide passage type acousto-optic deflector UM11 for receiving output light from fiber FB3; a fourth single mode optical fiber FB4 for receiving output light from deflector UM11 and causing ultimately the emission of light to photo detector PD1; and an absorption cell CL11 through which optical fiber FB4 passes. Absorption cell CL11 encloses a standard substance, eg Cs, which absorbs light at a given wavelength. Cladding is removed from fiber FB4 to expose a core portion a within cell CL11 to the standard substance.

Figure 49:
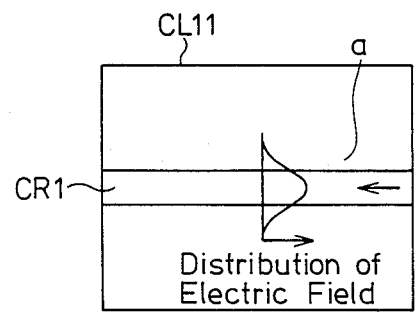
FIG. 49 is a diagram depicting operation of the device of FIG. 48.

Operation of the FIG. 48 embodiment is as follows. The output from laser LD1, which is controlled in terms of temperature, travels via optical fiber FB1 and is then branched off into two directions by fiber coupler CP1. One flux of the branched output is emitted to the outside through fiber FB2. The other flux of output travels via fiber FB3 to and is applied to deflector UM11 whereat the light is modulated. The modulated light travels through fiber FB4 and then penetrates cell CL11. Within cell Cl11, as shown in FIG. 49, there is generated an evanescent wave, that is, at core portion a, the propagation light permeates outside of the core portion a of fiber FB4. An electric field over this portion a mutually acts on circumferential gas, whereby absorption takes place at a specified wavelength. Thus, when the output of fiber FB4 is detected by photo detector PD1, absorption signals are thus procured. As in the conventional case, when feeding the light via lock in amplifier or the like, back to laser LD1, the oscillating frequency of laser LD1 can be controlled to an area in the vicinity of the center of absorption. The FIG. 48 embodiment has the same advantages as those of FIG. 34. In addition, in FIG. 48, the optical system consists entirely of optical fibers. Hence positioning operation is not required. This leads to simplicity of adjustment and enables miniaturization of the device.

Although a single mode fiber is used, the invention is not limited thereto. For example, a multi-mode fiber can be also used.

Figure 50:
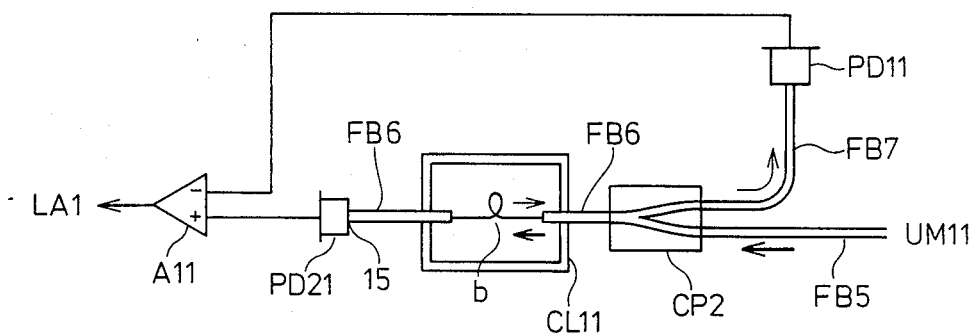
FIG. 50 is a block diagram depicting principal portions of a tenth example of a frequency stabilized semiconductor laser showing a partial modification of FIG. 48.

FIG. 50 depicts a variation of the absorption component 100 of FIG. 48, wherein the saturated absorption method is used. The arrangement comprises a single mode optical fiber FB5 for propagating output light from deflector UM11; a fiber coupler CP2, one end of which is connected to optical fiber FB5; another single mode optical fiber FB6 that is connected to the other end of coupler CP2 and led through absorption cell CL11, wherein a part of the cladding thereof is removed to expose core part b to the standard substance in cell CL11, and out to whereat the end thereof a half mirror coated end surface 15 is provided; a first photo detector PD21 for detecting light transmitted through end surface 15; a second photo detector PD11 for detecting light reflected by end surface 15 of fiber FB6 and transmitted back through cell CL11, coupler CP2, fiber FB7; and differential amplifier A11 for inputting electric outputs from photo detectors PD21, PD11 and for outputting them to lock in amplifier LA1 (e.g. in FIG. 48).

In the FIG. 50 embodiment, output light from deflector UM11 is transmitted through fiber FB5 and coupler CP2 and through fiber FB6. Subsequently, evanescent waves produced outside core portion b which waves, as pump light, saturate the light absorption of the standard substance, e.g. Cs, in the vicinity of the portion b. A major part (e.g. 90%) of light travelling through optical fiber FB6 strikes end surface 15 and strikes photo detector PD21. On the other hand, the remainder (e.g. 10%) of light is reflected by end surface 15 and travels back through fiber FB6 in the reverse direction and its evanescent waves, as probe light, overlap the pump light to bring forth absorption. This probe light is then led through coupler CP2, and fiber FB7 to photo detector PD11. Since the electrical outputs from detectors PD21, PD11 are compared and the difference therebetween obtained by differential amplifier A11, the absorption signals by the Doppler expansion are erased, thereby outputting saturated absorption signals having sharp absorption spectrums to lock in amplifier LA1. Due to a feedback loop, such as shown in FIG. 48, it is feasible to control the oscillating frequency of laser LD1 in a highly stable manner by virtue of peaks of the saturated absorption sepctrums.

In FIG. 50, although end surface 15 is a coated half mirror, other similar arrangements may be used. For example, a half mirror may be interposed between, for example, fibers FB6.

Figure 51:
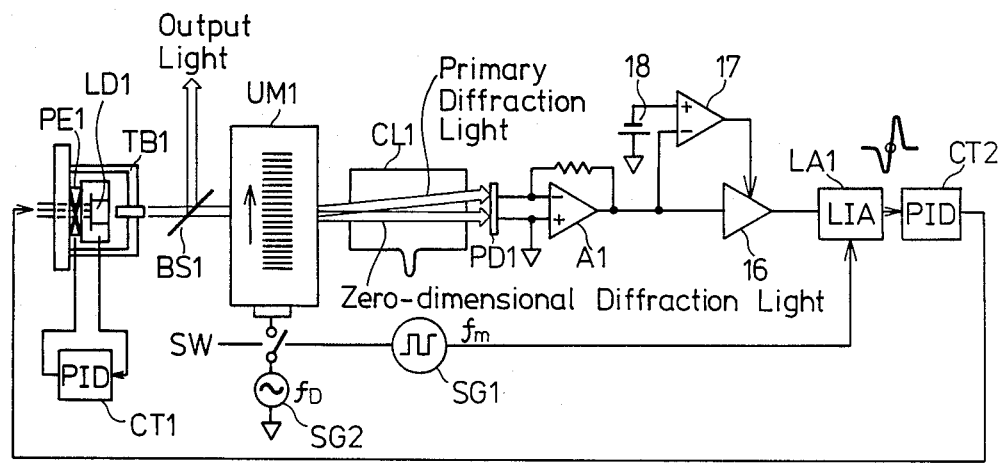
FIG. 51 is a block diagram of an eleventh example of a frequency stabilized semiconductor laser.

FIG. 51 depicts another frequency stabilized semiconductor laser similar to FIG. 34 and comprising a variable gain amplifier 16 for receiving outputs from amplifier A1 and outputs electrical signals to lock in amplifier LA1; a comparator comprising an inversion (−) input terminal to which is inputted the output from amplifier A1; and a setting power source 18 connected between a non-inversion (+) input terminal of comparator 17 and a common electric potential point. The gain of variable gain amplifier 16 is controlled by comparator 17.

Figure 52:
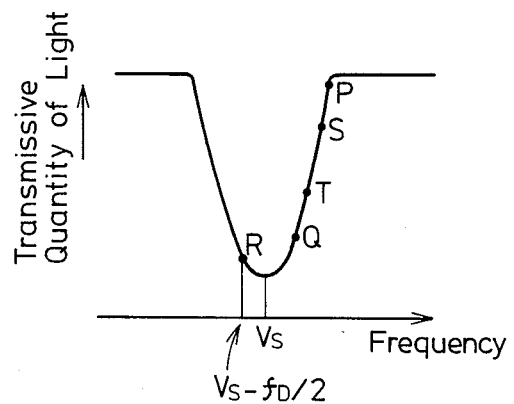
FIG. 52 is a diagram depicting operation of the device of FIG. 51.

The resonant absorption cell CL1 in the FIG. 51 arrangement is shown in FIG. 52, wherein suppose the frequency of output light from deflector UM1 is positioned at a point P, the amount of transmitted light increases; the output of amplifier A1 is largely deflected in the negative direction; the output from comparator 17 assumes a high level; and the gain of the variable gain amplifier 16 diminishes. Subsequently, a moving point slowly shifts from point P towards the bottom of the resonant absorption, i.e., in the direction of the frequency $\omega_s$. Concurrently, the transmitted light decreases in volume, whereas the output from amplifier A1 gradually grows. At a point Q, the output of amplifier A1 becomes higher than the setting power source 18, the output from comparator 17 comes to a low level, and the gain of variable gain amplifier 16 is heightened, whereby the output from laser LD1 is maintained at a point R with high stability.

Figure 53:
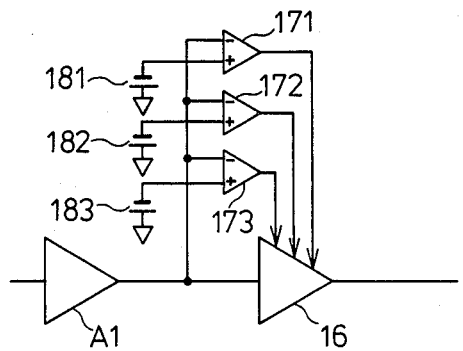
FIG. 53 is a block diagram depicting principal portions of a twelfth example of a frequency stabilized semiconductor laser.

FIG. 53 depicts a circuit for imparting a plurality of gains to variable gain amplifier 16, for example, of FIG. 51, and which comprises comparators 171,172,173 with the outputs from amplifier A1 being applied to each of the inversion (−) input terminals of comparators 171,172,173 and the outputs of comparators 171,172,173 controlling the outputs from variable gain amplifier 16; setting power sources 181,182,183 connected between non-inversion (+) input terminals of comparators 171,172,173 and ground. When this embodiment is connected to the arrangement of FIG. 51, the outputs from photodetector PD1 are inputted to amplifier A1, and the outputs from variabel gain amplifier 16 are inputted to lock in amplifier LA1. With such a connection, the comparators 171,172,173 individually assume low levels at points S. T. Q. of FIG. 52; and the gain of amplifier 16 gradually rises. With this embodiment, it is possible to stably converge to point R at high velocity. Also, the gain of amplifier 16 may consecutively be controlled by stepwise increase or decrease.

Figure 54:
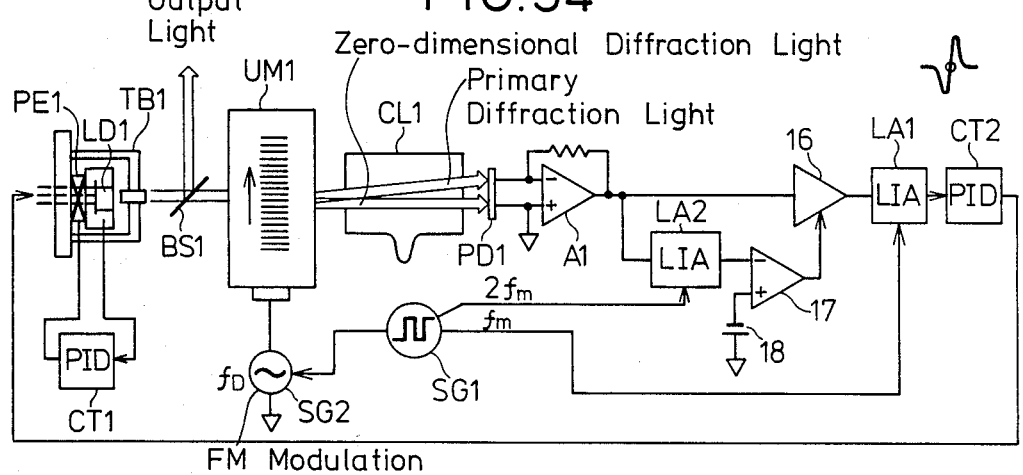
FIG. 54 is a block diagram depicting a thirteenth example of a frequency stabilized semiconductor laser.

FIG. 54 depicts a frequency stabilized semiconductor laser similar to that of FIG. 51, wherein a secondary differential waveform of amplifier A1 is used as an input of the comparator. In the arangement signal generator SG1 FM modulates SG2 with sine waves or chopping waves. The outputs from amplifier A1 are inputted to lock in amplifier LA2 and to variable gain amplifier 16. Lock in amplifier LA2 is driven by signal generator SG1 which generates an output having an even frequency 2 fm that is twice as high as the modulation frequency of signal generator SG2, whereby it is synchronously rectified. The secondary differential waveform of amplifier A1 is thus to be obtained. The output from lock-in amplifier LA2 is inputted to inversion (−) input terminal of comparator 17 that supplies output to control amplifier 16. The output from amplifier 16 is inputted to lock-in amplifier LA1. Setting power source 18 is connected between non-inversion (+) input terminal of comparator 17 and ground.

According to the embodiments of FIGS. 51, 53, 54, in case the output light from laser LD1 largely deviates from a preset value, there is no probability of the output light wavelength exceeding the preset value, and hence, it is feasible to keep the output wavelength to the preset value with high stability. By virtue of this advantage, even if the output light from laser LD1 greatly deviates from the preset value, it is possible to make it converge at the preset value, and at the same time there is a highly stable wavelength.

In all the embodiments of FIGS. 51, 53, 54, variable gain amplifier 16 is disposed behind amplifier A1. It is, however, possible to place the amplifier 16 at the rear of lock-n amplifier LA1 and PID controller CT2. That is, these elements may be disposed at any place within the feedback loop.

Figure 55:
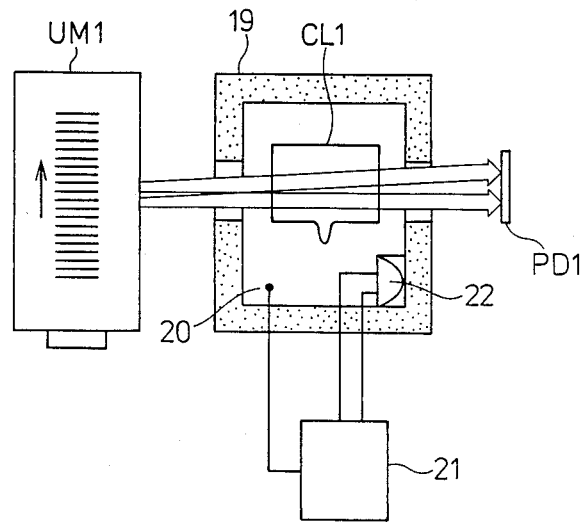
FIG. 55 is a block diagram of a fourteen example of a frequency stabilized semiconductor laser, in principal portions thereof.

FIG. 55 depicts an oven for controlling the temperature of the absorption cell CL1, and comprises constant temperature oven 19 surrounded by an adiabatic material, the inside of which is provided with absorption cell CL1 and is formed with a path for output light from acousto-optic deflector UM1; a temperature measuring element 20 disposed within oven 19 and heater 22 disposed within oven 19. The output of measuring element 20 is connected to a temperature adjuster 21, whose output is connected to heater 22. The temperature control means may be considered to comprise oven 19, measuring element 20, adjuster 21 and heater 22. The temperature within oven 19 is measured by measuring element 20. Heater 22 is so controlled by temperature adjuster 21 as to keep the temperature within oven 19 substantially constant. The temperature is set to such a value that the volume of absorption is large in accordance with dimensions of the absorption cell, and its secondary differential is at a maximum. When standard substance is Cs, the volume of absorption is small at a temperature of less than 20°, and there exists the most suitable value of secondary differential of the absorption quantity in the vicinity of 40° C.

Even if the circumferential temperature varies, the temperature is kept constant, in FIG. 55. Consequently, there is no variation both in volume of absorption and in amount of secondary differential, and the stability of the wavelength of the output light is not deteriorated at all by fluctuations in the circumferential temperature. Furthermore, temperatures at which to increase the absorption quantity of the absorption cell can be selected regardless of the circumferential temperature and hence it is feasible to obtain comparativly large amounts of absorption with respect to even a small absorption cell, thereby making possible the miniaturization of the device. In addition, it is usable within a wide range of circumferential temperatures.

Although heater 2 alone is used to control temperature, if the temperature to be controlled approximates the circumferential temperature, cooling means may additionally be utilized. Moreover, there may be used in place of heater 22 devices, such as a Peltier element, which are capable of heating and cooling.

The temperature measuring element 20 and adjuster 21 may be be omitted by using in place of heater 22 a PTC thermistor or posistor whose resistance value increases in proportion to the temperature increase.

Figure 56:
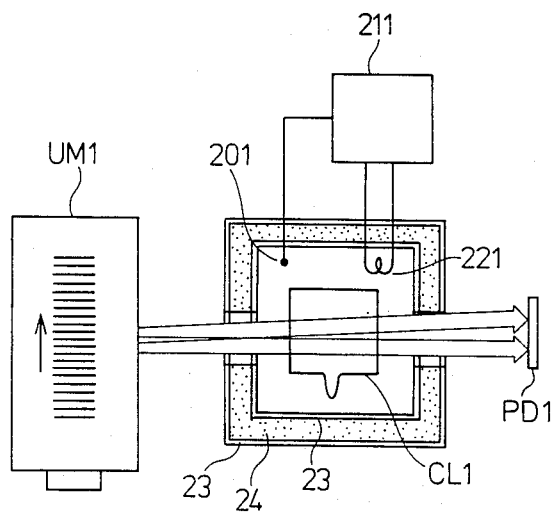
FIG. 56 is a block diagram depicting principal portions of a fifteenth example of a frequency stabilized semiconductor laser.

FIG. 56 depicts another temperature controlling oven similar to FIG. 55 but wherein influences due to outside magnetic field are eliminated. The arrangement comprises as of magnetic plate 23, such as of permalloy or the like covering the inside and outside surfaces of the oven which comprises walls of an adiabatic material which surrounds absorption cell CL1 except for the path for output light from acousto-optic deflector UM1, a temperature measuring element 201 for measuring the temperature around cell CL1, a heater 221 and temperature adjuster 211. The output of measuring element 201 is inputted to adjuster 211, which drives heater 221. The temperature of the air space encompassed by the soft magnetic plates 23 and adiabatic material 24 is so controlled as to be substantially constant by means of the temperature measuring element 201, temperature adjuster 211 and heater 221.

The FIG. 56 embodiment is stable with respect to variations in circumferential temperature, and due to magnetic shielding 23, there is no possibility that the absorption spectrum will have Zeeman split resulting from an outside magnetic field and the frequency of output light be thereby varied, and waveform consequently distorted. Since it is unnecessary for the entire system to be housed in a magnetic shield case, it is possible to reduce the system size and still enjoy the benefits of magnetic shielding applied only to the absorption cell.

In the embodiment of FIG. 56, there are two sheets of soft magnetic plates 23 and a sheet of adiabatic material 24. However, only one sheet of soft magnetic plate 23 may be used, or a plurality of plates may be superposed on each other. In this case, if the thin magnetic plates and adiabatic layers are alternately laminated on each other, magnetic shielding effect is enhanced. Also, where the circumferential temperature does not vary much, heater 221 itself may be omitted.

Figure 57:
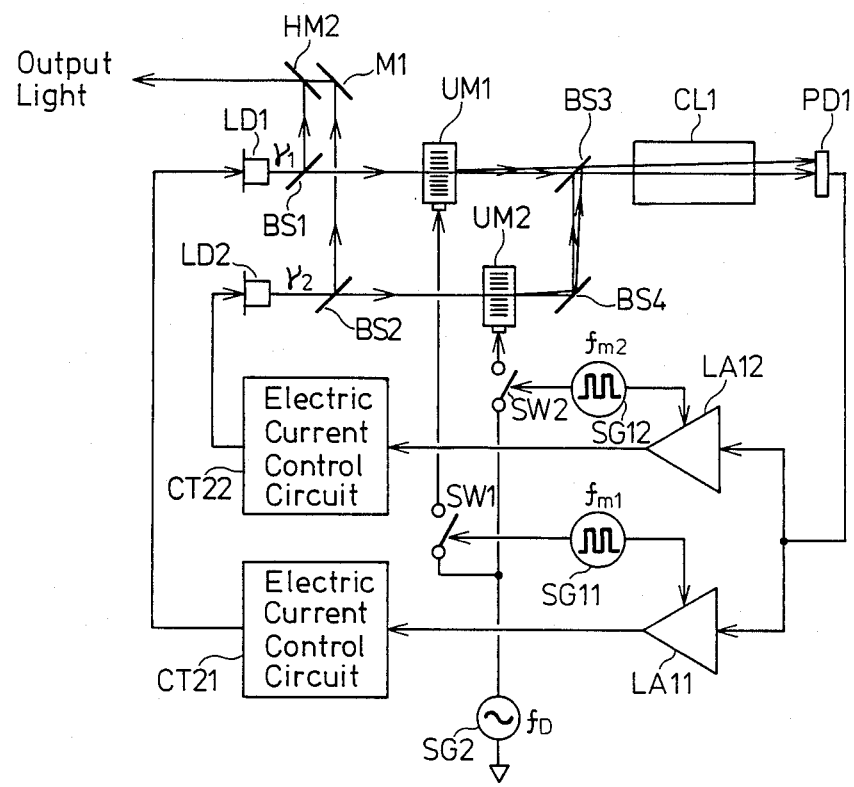
FIG. 57 is a block diagram depicting a sixteenth example of a frequency stabilized semiconductor laser.

FIG. 57 depicts a frequency stabilized semiconductor laser wherein a multiplicity of stabilized wavelengths are generated and wherein fluxes of output light from semiconductor lasers LD1,LD2 are split by beam splitters BS1, BS2 and apart of such output is arranged to be the light output of the source. The rest of the split fluxes of light are introduced into acousto-optic deflectors UM1, UM2, respectively. The outputs of UM1, UM2 are combined by beam splitters BS3, BS4 and are then introduced into absorption cell CL1. In cell CL1 is enclosed a standard substance which absorbs laser beams having multiple wavelengths. Standard substance may be, for example, cesium, rubidium, ammonia, or water. A plurality of absorption spectrums are created in the light which is transmitted through cell CL1. The laser beams are transmitted through cell CL1 and are supplied to light receiving detector PD1 and then converted into electrical signals corresponding to the light receiving power. The electric signals are applied to lock in amplifiers LA11, LA12, and then outputted to electric current control circuits CT21, CT22. The electric outputs from control circuits CT21, CT22 are applied to lasers LD1, LD2. Hence, the electric currents to be applied to control lasers LD1, LD2 are prescribed by signals added from respective control circuits CT21, CT22, and the oscillating frequencies of the lasers LD1, LD2 are determined by such electric current values.

An oscillator SG2, frequency $f_D$ being 80 MHz, eg, is connected via switches SW1, SW2 to acousto-optic deflectors UM1, UM2. The outputs (e.g. $fm_1 = 2$ kHz, $fm_2 = 2.5$ kHz) of oscillators SG11, SG12 are connected to switches SW1, SW2. Thus, the oscillating wavelength of light applied to deflectors UM1, UM2 is modulated at frequencies $fm_1$, $fm_2$. The outputs from oscilaltors SG11, SG12 are added to lock-in amplifiers LA11, LA12 and are then synchronously rectified at frequencies $fm_1$, $fm_2$. The control means may be considered as comprising control circuits CT21, CT22 and lock in amplifiers LA11, LA12.

Operation of the FIG. 57 embodiment is as follows, assuming that Cs is used as the standard substance in cell CL1. Output light from laser LD1 is bidirectionally split by beam splitter BS1. Reflected light becomes the output light to be emitted to the outside. Light transmitted through beam splitter BS1 is applied to deflector UM1. As in the case of FIG. 34, output light having frequency $\omega_1$ from laser LD1 undergoes frequency modulation in deflector UM1 wherein the modulation frequency is $fm_1$ and the modulation depth is $f_D$. Thereafter, the modulated output light falls on absorption cell CL1. Similarly, output light from LD2 having frequency $\omega_2$ is subjected to frequency modulation in deflector UM2 wherein the modulation frequency is $fm_2$, and modulation depth is $f_D$. Then, the modulated output light strikes cell CL1.

If light having frequencies $\omega_1$, $\omega_2$ is made to penetrate the Cs atoms existing within cell CL1, with respect to the amount of transmitted light, there are obtained absorption signals shown in FIG. 36, which correspond to variations of $\omega_1$, $\omega_2$. Consequently, the output waveform of lock in amplifier LA11, LA12 take the shapes shown in FIGS. 58,59, wherein the signals (see FIG. 36) from element PD1 are differentiated.

Assuming that light having frequency $\omega_1$ is modulated at modulation frequency $fm_1$ and light having frequency $\omega_2$ is likewise modulated at modulation frequency $fm_2$, when lock in amplifiers LA11, LA12 are synchronously rectified at modulation frequencies $fm_1$, $fm_2$, respectively, (at this time, $fm_1$, $fm_2$ are set so that formula $k \cdot fm_1 = m \cdot fm_2$ (wherein k and n are integers) is established), the influences of light having frequency $\omega_2$ are not present in the output of lock in amplifier LA11. Similarly, the influences of light having frequency $\omega_1$ are not present in the output of lock in amplifier LA12. Subsequently, the outputs from lock-in amplifiers LA11, LA12 individually take the waveforms depicted in FIG. 58 (for outputs from amplifier LA11) and in FIG. 59 (for outputs from amplifier LA12). If the oscillating frequencies of the lasers LD1, LD2 are controlled by control circuits CT21, CT22 so that the output from amplifier LA11 is at a point A of FIG. 58, and the output from amplifier LA2 is at a point B of FIG. 59, then the laser beams appearing at the outputs have wavelengths of 852.112 nm or thereabouts, thereby obtaining fluxes of light having two wavelengths which differ from each other by 9.2 GHz.

Advantageously, the FIG. 57 embodiment is simple and produces a plurality of stable wavelengths. Where Rb is used instead of Cs, the basic level has a hyperfine structure wherein F=1, F=2. Let the frequency at which absorption is caused from F=1 be $\omega_1$, and let the frequency at which absorption is caused from F=2 be $\omega_2$, then $\Delta\omega = \Omega_1 - \omega_2$, which is defined as the difference therebetween becomes $\Delta\omega = 6.8$ GHz in time of $^{87}$Rb and further becomes $\Delta\omega \approx 3$ GHZ in time of $^{85}$Rb. When using $D_1$ beams (excitation from level $5^2S_{\frac{1}{2}}$ to level $5^2P_{3/2}$ implies 794.7 nm) of Rb and $D_2$ beams (excitation from level $5^2S_{\frac{1}{2}}$ to level $5^2P_{\frac{1}{2}}$ implies 780.0 nm) of Rb, the formula $\Delta\lambda = 14.7$ nm is valid. By passing through Cs and Rb, this expression $\Delta\lambda = = 852.1 - 780$ (or 794.7) = 72.1 (or 57.4) nm, is established. Moreover, molecular absorption beams of $H_2O$ and $HNH_3$ or the like may be used.

The number of semiconductors is not confined to two. If the number is increased, it can be diversified as to type by combining the above frequencies. In such a case, the acousto-optic deflector, the lock-in amplifier, the oscillator and the electric current control circuit must be proportionally added.

Figure 58:
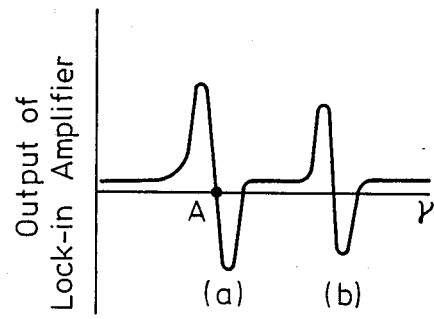
FIGS. 58, 59 are graphs showing outputs of lock-in amplifiers used in FIG. 57.
Figure 59:
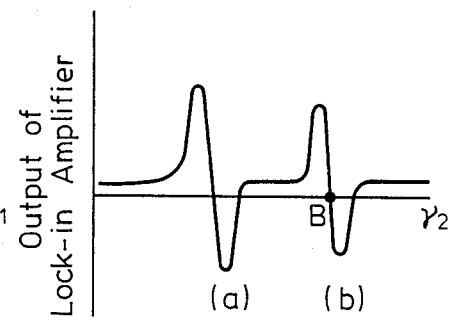
Figure 60:
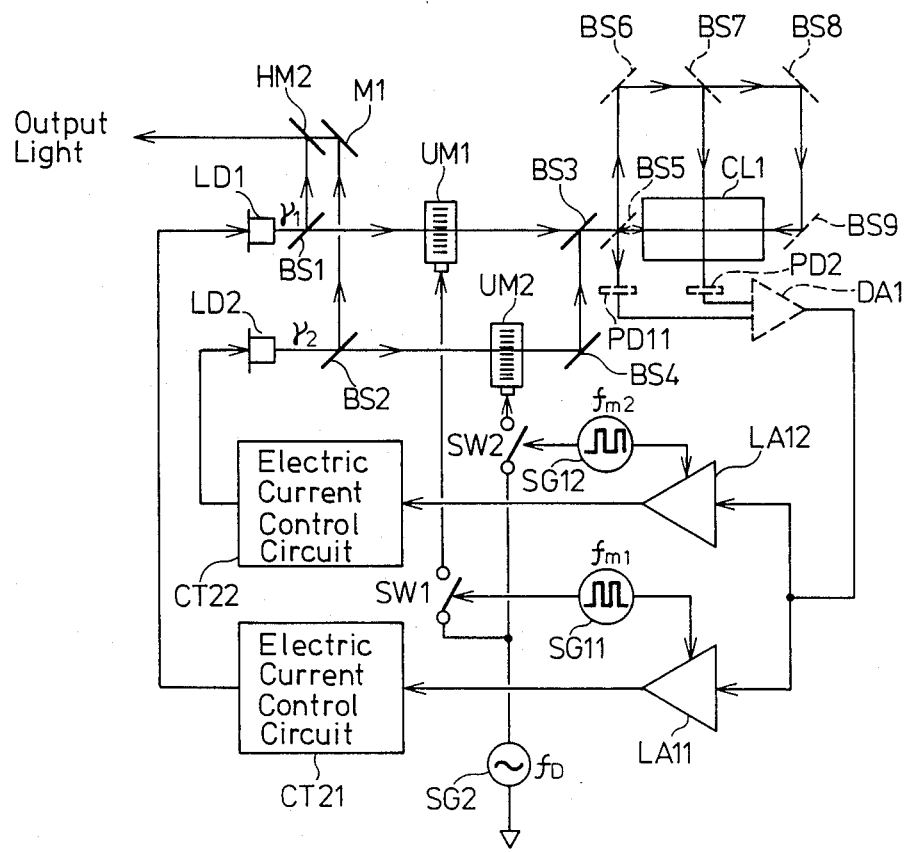
FIG. 60 is a block diagram of a seventeenth example of a frequency stabilized semiconductor laser.
Figure 61:
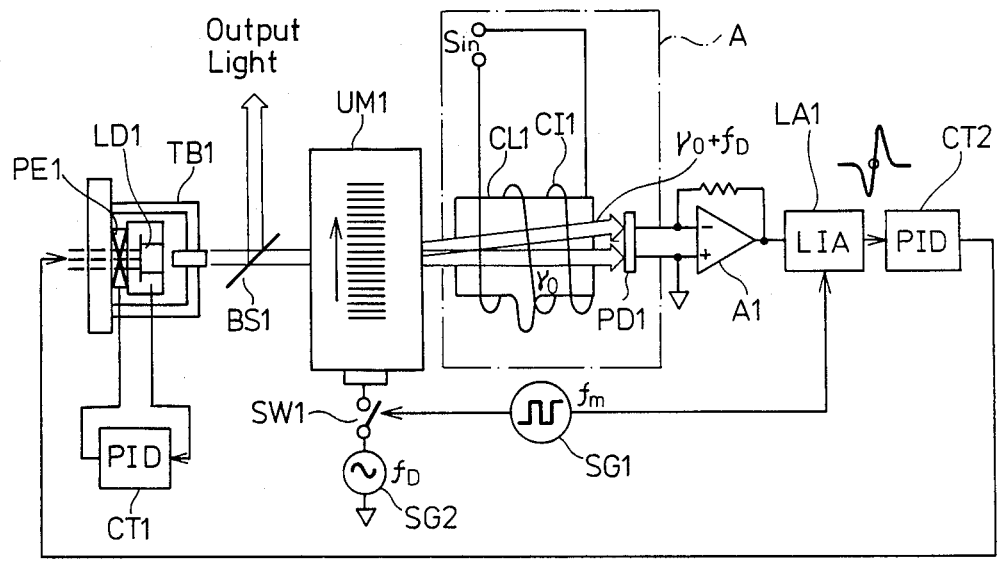
FIG. 61 is a block diagram depicting an eighteenth example of a frequency stabilized semiconductor laser.

FIG. 60 depicts another frequency stabilized semiconductor laser wherein the Doppler expansion disappears using saturated absorption spectroscopy, wherein it becomes possible to distinguish the hyperfine structure described in FIG. 35. Consequently, there is obtained output signal from lock-in amplifier which is based on the hyperfine structure shown in FIG. 42, so that $\Delta\omega$ can further be reduced, depending on the position at which the wavelength is locked. The FIG. 60 embodiment differs from the FIG. 57 embodiment in the portions indicated by the dotted lines. The differences are beam splitters BS5 to BS9, light receiving detectors PD11, PD2, and differential amplifier DA1. The outputs from amplifier DA1 are introduced into amplifiers LA11, LA12. The higher harmonic wave frequency of $fm_1$ or the like can be used as the frequency of a signal to be inputted to lock in amplifier. In this case, if a triplex harmonic wave is used, the bias components of the lock-in amplifiers, such as shown in FIG. 58, disappear.

Where a polarization beam splitter is used in place of the beam splitter of FIG. 57, the output laser beam becomes orthogonal polarized waves. FIG. 61 depicts a stabilizer wherein the laser output wavelength is so varied as to correspond to the input signal. The FIG. 61 embodiment differs from FIG. 34 in that coil CI1 is used as a magnetic field applying means around cell CL1. A wavelength variable input signal Sin is applied to the ends of coil CI1. As in the case of FIG. 34, the output from laser LD1 is controlled to a stable frequency of $\omega_s - f_D/2$. On applying the wavelength variable input signal Sin to the ends of coil CI1, electric current flows through coil CI1, thereby generating a magnetic field, the magnitude of which corresponds to signal Sin. The magnetic field causes the absorption spectrum of the standard substance within the cell CL1 to have Zeeman separation thereby to vary the absorption wavelength. Accompanied with variations of the absorption wavelength, the output wavelength of laser LD1 which is locked to absorption beam changes. It is therefore possible to change the wavelength of the laser output from beam splitter BS1 with the aid of the signal Sin.

The variable light source of FIG. 61 produces a variable wavelength while keeping a stable state in which the output light is locked to the absorption beam of the standard substance. Also, the embodiment is stable for instantaneousness of frequency variations.

In the FIG. 61 embodiment, coil CI1 is used as the magnetic field applying means. Other arrangements are possible, however, such as a permanent magnet may be used and varied as to distance from the cell CL1 in response to signal Sin.

Figure 62:
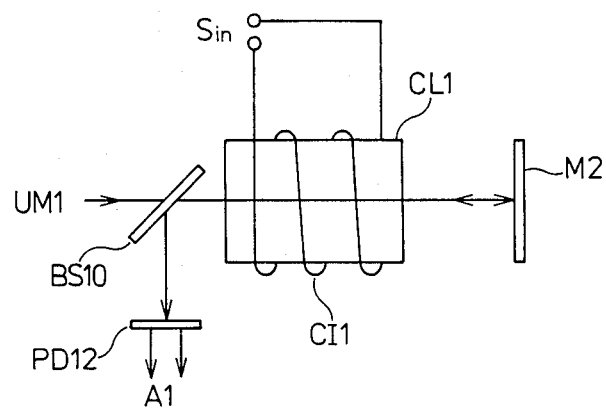
FIG. 62 is a block diagram depicting principal portions of a nineteenth example of a frequency stabilized semiconductor laser.

FIG. 62 depicts (see portion A of FIG. 61) an absorption cell CL1 having a magnetic field applying means, but which uses the saturated absorption method instead of the linear method. In this arrangement, light which has been modulated by deflector UM1 is transmitted through beam splitter BS10, as pump light, to absorption cell CL1. Light which is transmitted through cell CL1 is then reflected by mirror M2 and returns through the previous light path. The returned reflected light, serving as probe light, strikes cell CL1 once again, and is transmitted through cell CL1 and is reflected by beam splitter BS10, whereby the saturated absorption signal is detected by photodetectors PD12. The other functions are the same as those of FIG. 61.

Figure 65:
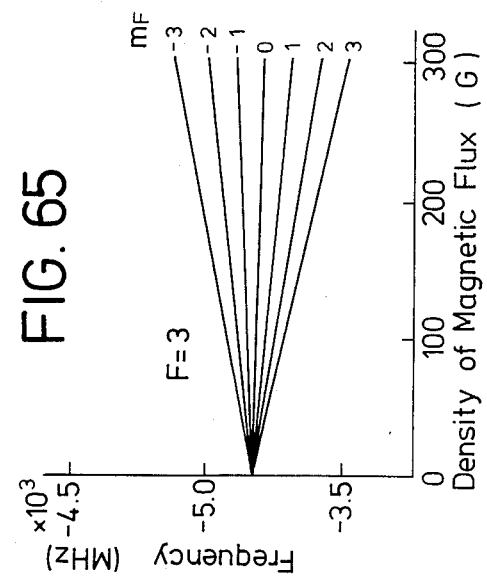
FIG. 63, FIG. 64, and FIG. 65 are graphs showing Zeeman separation of the energy levels of Cs atom.
Figure 64:
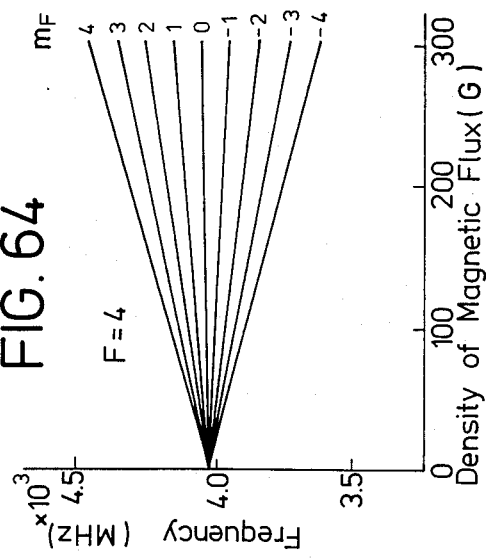
Figure 63:
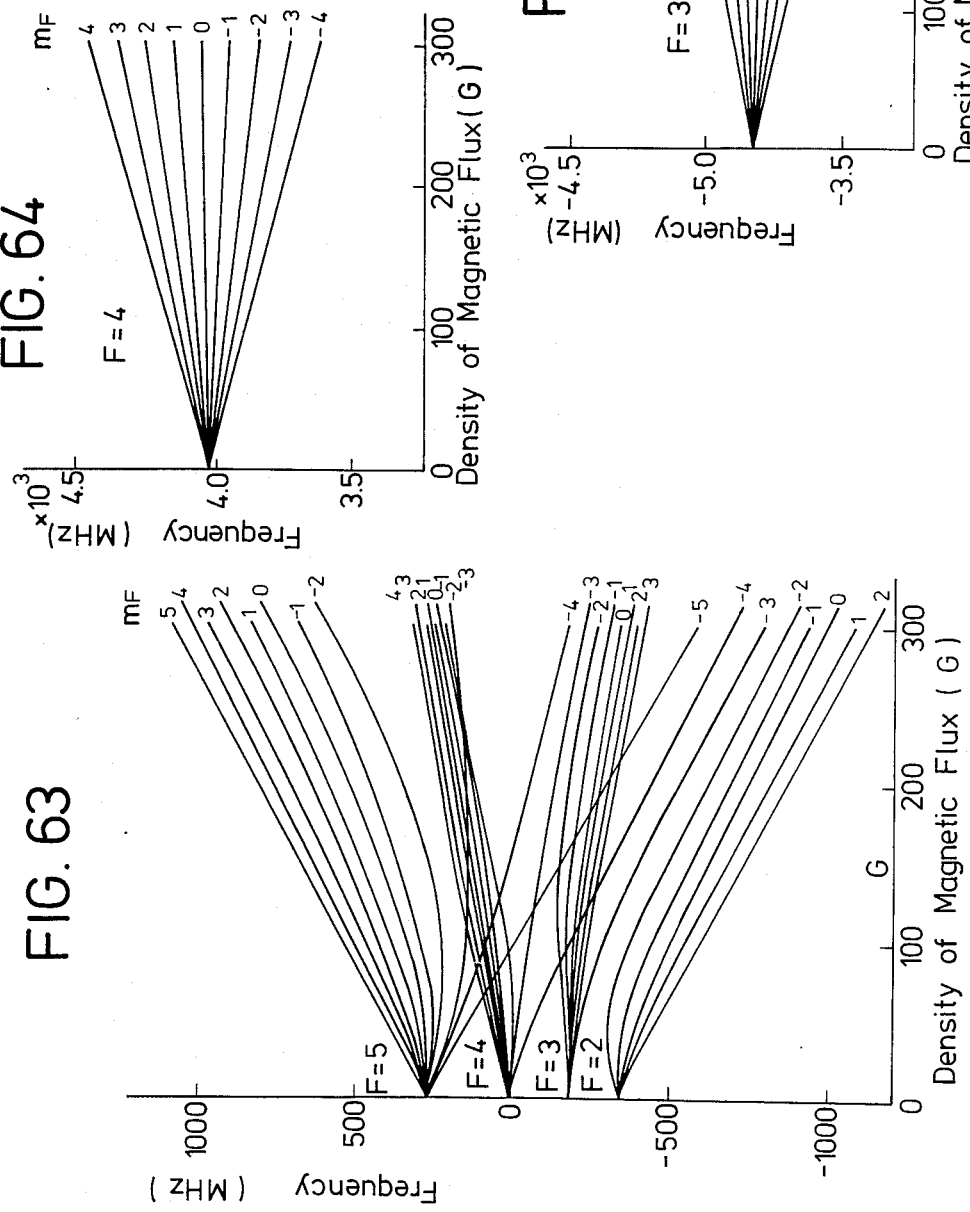

When applying wavelength variable input signal Sin to the ends of coil CI1, as in FIG. 61, the absorption spectrum of the standard substance, e.g. Cs, within cell CL1 causes Zeeman separation, whereby saturated absorption wavelength varies. Referring to FIGS. 63, 64, 65, wherein $m_F$ is the energy level at which Zeeman separation occurs by effecting magnetic modulation, there are shown Zeeman separation at the respective energy levels of Cs. FIG. 63 is a diagram showing the characteristic curve of Zeeman separation of a $6^2P_{3/2}$ excitation of Cs. FIG. 64 is a diagram showing the characteristic curve of Zeeman separation of a level of hyperfine structure F=4 in which the basic state of Cs is $6^2S_{\frac{1}{2}}$. FIG. 65 is a diagram showing the characteristic curve of Zeeman separation of a level of hyperfine structure of F=3 in which the basic state of Cs is $6^2S_{\frac{1}{2}}$. For example, if the frequency of the semiconductor laser LD1 is controlled to the absorption spectrum obtained when shifting from F=3 of $6^2S_{\frac{1}{2}}$ to F=2 of $6^2P_{3/2}$, the absorption spectrum shifts toward lower frequencies at the time of applying the magnetic field to the cell CL1. As a result, the oscillating frequency of laser LD1 concurrently shifts toward the lower frequencies.

In the FIG. 62 embodiment, in addition to the characteristics of FIG. 61, variations in saturated absorption frequency are large with respect to changes in magnitude of magnetic field and hence the sensitivity increases. Since the width of absorption spectrum is large in the device of FIG. 61, as compared to FIG. 62, the output frequency can be controlled to substantially the mean value of the energy levels (e.g. F=3 to 5 of FIG. 63) of the hyperfine structure. Consequently, the sensitivity becomes smaller than this.

Figure 66:
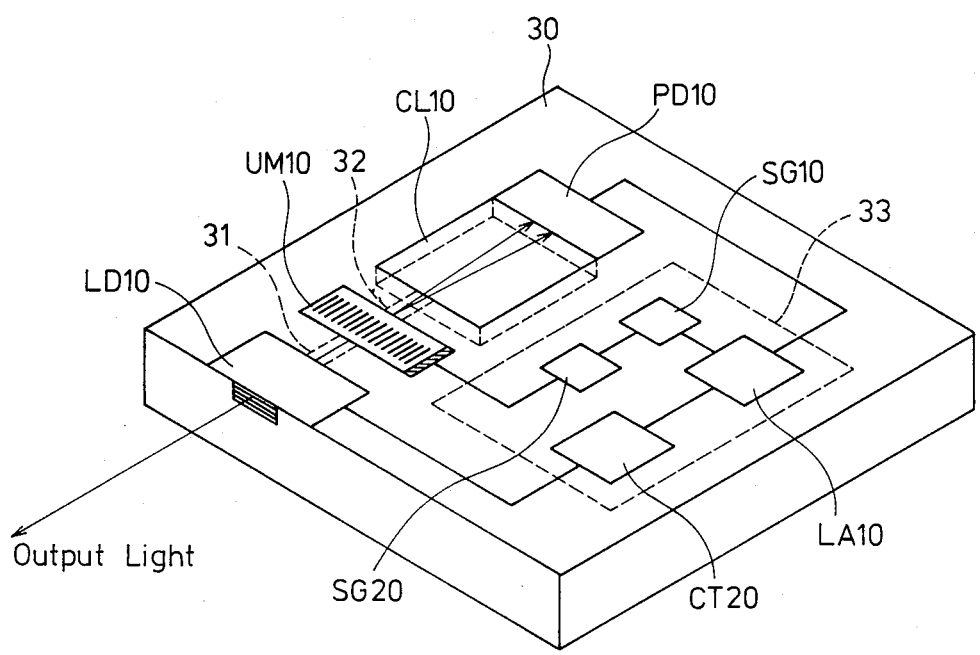
FIG. 66 is a perspective view depicting a twentieth example of a frequency stabilized semiconductor laser wherein the device is formed as an integrated circuit.

FIG. 66 depicts a frequency stabilized semiconductor laser disposed on a single chip in an integrated structure. (called "IC" for integrated circuit). The arrangement comprises a photo integrated circuit (IC) substrate 30 comprising, for example, GaAs or the like, and formed on substrate 30 semiconductor laser LD10; light waveguide path 31 upon which the output from laser LD10 travels; acousto-optic deflector UM10 for receiving output emerging from path 31; a second light waveguide path 32 which receives output from deflector UM10; an absorption cell CL10 which encloses a standard substance, e.g. Cs, which is capable of absorption of light with a specified wavelength and which receives light emerging from path 32; light receiving detector PD10 which receives emergent light from cell CL10; and control device 33 for receiving output electric signal from detector PD10.

Control device 33 comprises a lock-in amplifier LA10 having an input connected to the output of detector PD10; an electric current control circuit CT20 consisting of a PID controller circuit having it input connected to the output of amplifier LA10 and its output connected to an injection electric current input to laser LD10; signal generating circuit (e.g. an oscillator) SG10 with a frequency fm (e.g. 2 kHz) (on of the outputs from generator SG10 serving as a reference signal input to amplifier LA10); and a second signal generating circuit (e.g. an oscillator) SG20 having a frequency $f_D$ (e.g. 80 MHz), the output of which is connected to deflector UM10 and being modulated by output from generator SG10.

The embodiment of FIG. 66 operates as follows, and is similar to that of FIG. 34. Advantageously, the embodiment is integrated onto a simple semiconductor chip. Hence, the device can be reduced in size, be mass produced and is easy to adjust.

Figure 68:
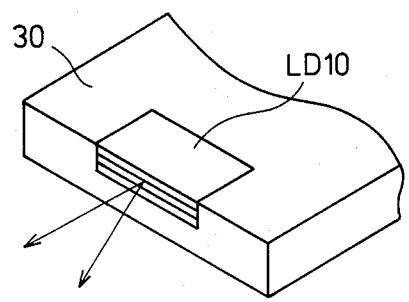
FIGS. 68, 69 are perspective views depicting principal portions of another example of the device of FIG. 66.
Figure 69:
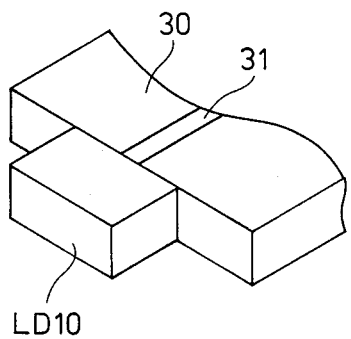
Figure 70:
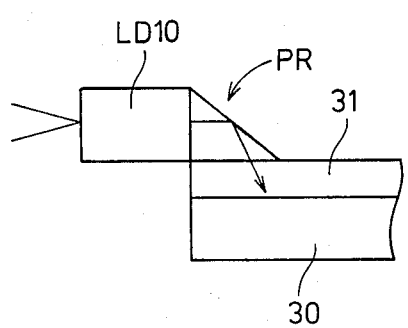
FIGS. 70, 71, 72 are cross sectional views depicting principal portions of the device of FIG. 66.

FIG. 67 is a table depicting a method of fabricating the respective components of the embodiment of FIG. 66. For example, the electric current circuit is of the monolithic construction using a silicon substrate. In other cases, however, a hybrid construction may be fabricated. Further details are shown with respect to FIGS. 68–71. FIG. 68 depicts principal portions of a laser LD10 fabricated on a substrate 30 using monolithic techniques. FIG. 69 depicts principal portions of the device using hybrid techniques. FIG. 70 is a cross sectional view of another example. In FIG. 69, end surface of waveguide path 31 is formed on substrate 30 and is directly radiated with outputs from laser LD10. In FIG. 70, output light from laser LD10 is introduced by a prism into path 71.

Figure 71:
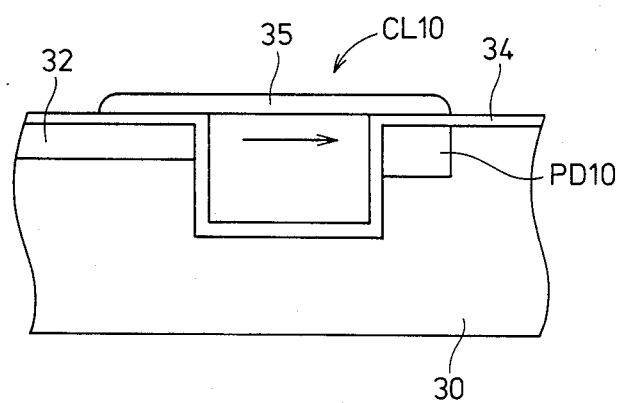

FIG. 71 is a cross sectional view of the arrangement of FIG. 66 wherein a recessed portion is formed, by etching or other similar method, in the surface of substrate 30. A glass film 34 is formed on the surface by glass coating or thermal oxidation. Next, a standard substance is placed into the recessed portion. This recessed portion is next covered with a glass plate 35 by fusion-bonding, thus enclosing the standard substance within the absorption member CL10.

Figure 72:
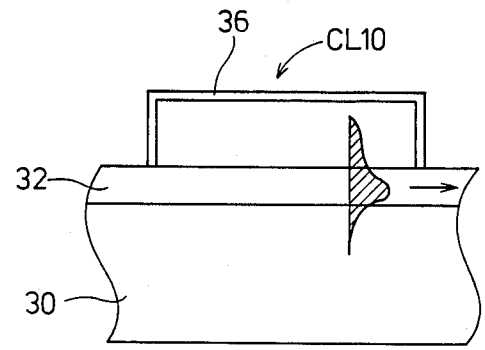

FIG. 72 is a cross sectional view showing another absorption cell CL10, which may be formed on the device depicted in FIG. 66, wherein a wave guide path 32 is formed on substrate 30 comprising GaAs or LiNbO$_3$ or the like. By evanescent effect, the standard substance enclosed by cover 36 provided on top of waveguide path 32 is arranged to absorb light from laser LD10 passing through path 32. In this embodiment, there is the advantage that manufacturing is easier since the cell is arranged on top of, rather than, within, substrate 30. The photo detector can be incorporated, by using monolithic or hybrid techniques, into the device.

Figure 73:
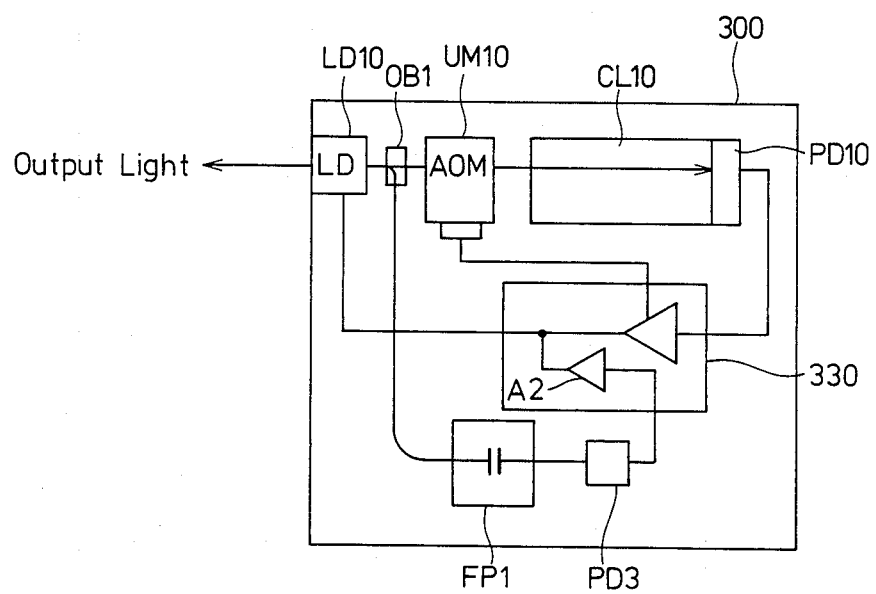
FIG. 73 is a plan view depicting a twenty first example of a frequency stabilized semiconductor laser as laid out on an integrated circuit.

FIG. 73 is a plan view of a chip having an embodiment thereon having a much narrower spectrum than the arrangement of FIG. 66. The arrangement comprises an IC substrate 30; a light branching device OB1 for branching off a part of the fluxes of outut light from semiconductor laser LD10; a light resonant device FP1 consisting of a Fabry-Perot etalon which receives light from branching device OB1; a second photo detector PD3 which receives light from resonator FP1; and a broad band region amplifier A2 for amplifying electric outpts from detector PD3 and feeding the thus amplified outputs back to an injection electric current for laser LD10.

In this configuration, the broad band amplifier A2 (only roughly shown for simplicity) is provided in control device 330. A resonant curve (position deviating from central frequency) of resonator FP1 is made to accord with an oscillating wavelength of laser LD10. Phase noises contained in output from laser LD10 are detected by detector PD3 after converting them into amplitude modulation signals, and the electric outputs thereof are negatively fed via amplifier A2 (which has a band region that is wider than the width of the spectrum of the laser beam) back to the injection electric current which drives the laser LD10, thereby restraining the phase noises of laser LD10 os as to make the spectrum still narrower. (See M. Ohtsu and S. Kotajima, IEEE Journal of Quantum Electronics, Vol. QE-21, No. 12 December 1985).

Figure 74A:
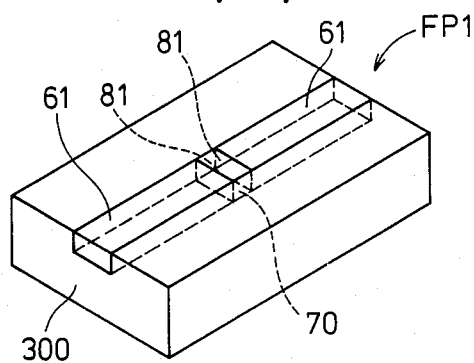
Figure 74B:
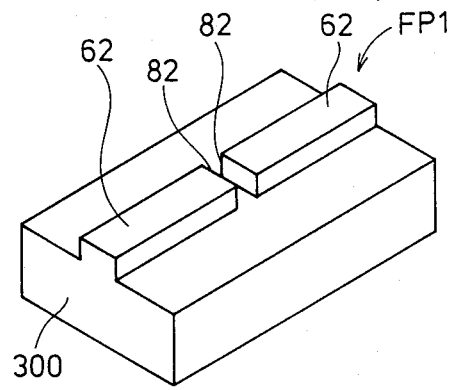
Figure 74C:
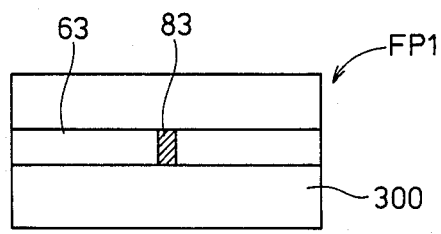

FIGS. 74(A), 74(B) depict principal portions of a Fabry-Perot resonator FP1 provided on an IC substrate 300 in the device of FIG. 73. FIG. 74(C) is a plan view of the same portion. In FIG. 74(A), a hole 70 is formed in a part of a waveguide path 61 provided on substrate 300, and two surfaces 81 which partially constitute hole 70 and are disposed vis-a-vis with respect to each other, are coated with reflection films, thus forming a resonator. In FIG. 74(B), the ridges 62, serving as waveguide paths, are so spaced from each other as to be placed in series on substrate 300, and end surface 82 of these ridges 62 which surfaces stand vis-a-vis with respect to each other are formed with reflection films, thus constituting the resonator. In FIG. 74(C), a material having a high refractive index is doped at a part of the path 63 provided on substrate 300, thus forming a resonat device 83.

Figure 75:
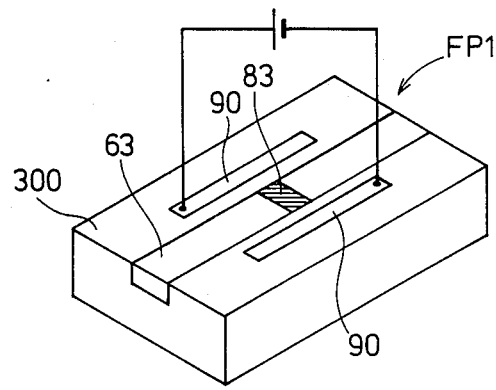

FIG. 75 depicts a means for adjusting the resonant frequency of the resonator FP1 in the device of FIG. 74(C). In FIG. 75 electrodes 90 are provided on both sides of resonator 83 disposed on substrate 300, and the effective length of the resonator 83 is varied by changing the refractive index of the resonant member 83 using electrice current applied between electrodes 90. Another way of adjusting the resonant frequency is to use a thin film resistance formed in close proximity to the light resonant member provided on the substrate, and to vary the length of the resonator by thermal expansion using heat generated by the thin film resistor. In addition, a ferroelectric substance, defined as a material having high refractive index, is doped, and the refractive index is varied by applying electric field in the same manner as FIG. 75.

In the case of controlling the temperature of the laser LD10, and the light resonator 8FP1 to be at a preset value, the thin film resistances can be used as heaters. In this case, it is desirable that the heaters be disposed as remote as possible from each other so that they do not interfere with each other.

In the embodiments of FIGS. 66 to 75, the linear absorption method is used. However, with suitable changes of the optical system, the saturated absorption method can be used.

Figure 76:
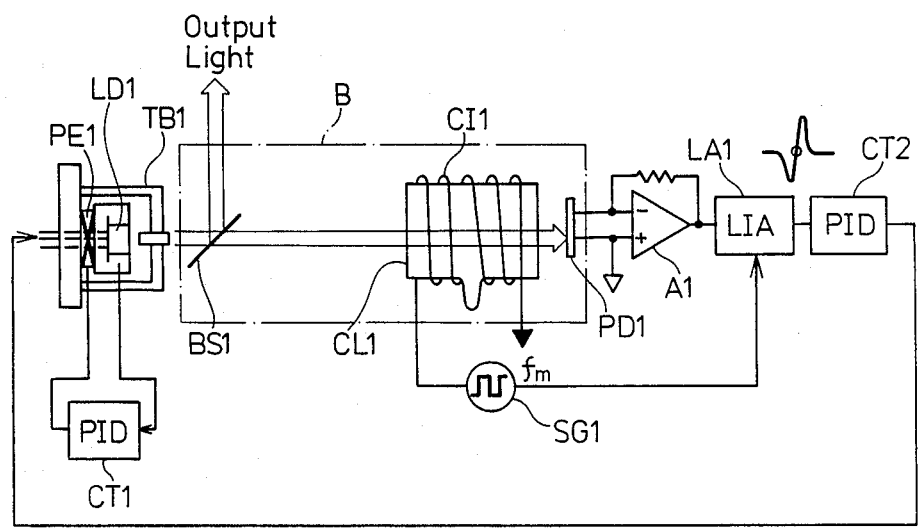
FIG. 76 is a block diagram depicting a twenty second example of a frequency stabilized semiconductor laser.
Figure 77:
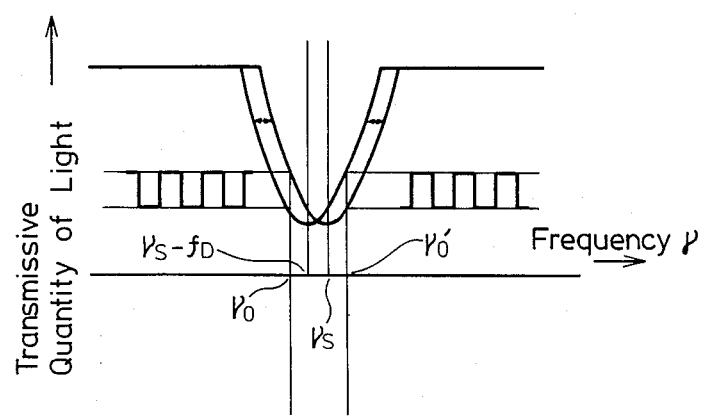
FIG. 77 is a diagram showing operation of the arrangement of FIG. 76.

FIG. 76 depicts a frequency stabilized laser similar to FIG. 34, and wherein the absorption wavelength of the standard substance is modulated by a magnetic field. The arrangement comprises a coil $C_l 1$ wound on cell CL1, coil CI1 constituting a magnetic field applying means. Light transmitted through beam splitter BS1 falls on cell CL1. Outputs from signal generator SG1 are applied to coil CI1 and lock in amplifier LA1. The electric current is modulated by the coil CI1 at a frequency fm (e.g. 2 kHz) and serves as the reference signal for lock in amplifier LA1. On applying the outputs from generator SG1 to both ends of coil CI1, an electric current, modulated by coil CI1, begins to flow, thereby generating a magnetic field in which the intensity varies at the frequency fm. Corresponding to the variations in this magnetic field, the absorption wavelength of the standard substance within absorption cell CL1 is changed by Zeeman separation. As a result, the laser beams fall upon the absorption cell CL1, signals are present in the output when the amount of transmitted light is, as shown in FIG. 77, modulated only at the position of the absorption signal. It is presumed that the magnetic field is modulated within the scope of 0 to a certain value at frequency fm. Frequency $\omega_s$ is the absorption frequency when the output electric current is 0. Also, when the magnetic field is 0, and $F_D$ is the degree to which the absorption frequency varies in time of the magnetic field being applied. This signal is detected and converted into electric signal by detector PD1 and is then synchronously rectified at frequency fm in lock in amplifier LA1 through amplifier A1, thereby obtaining a primary differential waveform illustrated in the diagram of FIG. 38. As in the case of FIG. 34, if the output of amplifier LA1 is locked, i.e. controlled, to the center of the primary differential waveform, the output of the laser has a stable frequency $\omega_s - f_D/2$.

According to the FIG. 76 embodiment, no acousto-optic deflector is used and therefore it is possible to obtain non-modulation outputs which exhibit the characteristics of high stability for frequency instantaneousness in a compact device requiring low cost of production. Since a deflector is not used, there is only a small amount of heat evolved and power consumption is reduced. Also, the saturated absorption method can be used in place of the linear arrangement by using the arrangement of FIG. 62 in portion B of FIG. 76. Such an arrangement has the advantage that the saturated absorption spectrum can be varied even in a feeble modulation magnetic field since changes in saturated absorption frequency with respect to variations in magnitude of the magnetic field are large, and the sensitivity to variations in the magnetic field is high.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. An optical frequency analyzer for measuring frequency characteristics of an object on the basis of incident light, said optical frequency analyzer comprising
    means for applying incident light to an object;
    an optical frequency sweeping means for frequency sweeping light and for outputting frequency swept light of a first frequency;
    an optical heterodyne detector means for heterodyning said frequency swept light of said first frequency from said optical frequency sweeping means and light of a second frequency indicative of said incident light, and for outputting an electrical signal having a frequency corresponding to the difference between said first and second frequencies;
    first filter means for filtering said electrical signal from said optical heterodyne detector means and for producing an electrical output indicative of the filtered results; and
    a signal processing/displaying means for processing and displaying said electrical signal from said first filter means.

2. The analyzer of claim 1, further comprising a polarization control means for controlling the polarization plane of said incident light and for producing an output light indicative thereof; and photo amplifying means for amplifying said output light from said polarization control means and for producing an output light indicative thereof.

3. The analyzer of claim 2, wherein said photo amplifying means comprises a photo amplifier for producing an amplified output light; a source for generating a wavelength stabilizing light; and an optical frequency mixer for mixing said wavelength stabilizing light from said source and said amplified output light from said photo amplifier.

4. The analyzer of claim 1, further comprising detecting means for detecting said electric output from said first filter means and for producing an output; means for measuring an optical frequency spectrum of said incident light; and means for causing said output from said detecting means to be an optical power input to said signal processing/display means and for causing an electrical signal indicative of said swept light from said optical frequency sweeping means to be a frequency axial input to said signal processing/display means.

5. The analyzer of claim 4, further comprising means for generating a periodic pulse light; means for causing the frequency of said swept light from said optical frequency sweeping means to be swept in a step configuration in response to a signal synchronized with said period pulse light so as to measure the frequency spectrum of said periodic pulse light.

6. The analyzer of claim 1, wherein said optical frequency sweeping means comprises a tunable laser for producing output light corresponding to said swept light; and a marker light source for outputting a marker light at a given wavelength; wherein said signal processing/display means comprises means for outputting frequency characteristics of said object together with said marker light.

7. The analyzer of claim 6, further comprising a light detector means for converting said marker light into an electrical signal; and means for causing said electrical signal from said detector means to be applied as a marker signal to said signal processing/display means.

8. The analyzer of claim 6, wherein said marker light source comprises an absorption cell comprising a standard substance, means for causing output light from said tunable laser to strike said absorption cell, and means for transmitting said marker light to undergo absorption at a specified wavelength corresponding to said standard substance.

9. The analyzer of claim 6, wherein said marker light source comprises a Fabry-Perot resonator, means for applying said output light from said tunable laser to said Fabry-Perot resonator, and means for outputting light from said Fabry-Perot resonator as said marker light.

10. The analyzer of claim 9, wherein said Fabry-Perot resonator comprises an electro-optic element and means for controlling said electro-optic element to thereby control the effective length of said Fabry-Perot resonator.

11. The analyzer of claim 6, wherein said marker light source comprises a source for producing light of consecutive spectrums, a Fabry-Perot resonator, means for applying light from said source to said Fabry-Perot resonator, and means for causing light output from said Fabry-Perot resonator to be said marker light.

12. The analyzer of claim 11, wherein said Fabry-Perot resonator comprises an electro-optic element and means for controlling said electro-optic element to thereby control the effective length of said Fabry-Perot resonator.

13. The analyzer of claim 6, wherein said marker light source comprises a semiconductor laser and an external resonator.

14. The analyzer of claim 6, wherein said tunable laser comprises a laser resonator and an ultrasonic modulator provided in said laser resonator.

15. The analyzer of claim 6, wherein said tunable laser comprises a laser resonator, and an electro-optic element provided in said laser resonator.

16. The analyzer of claim 8, wherein said marker light source comprises a reference wavelength laser for producing a light having a given wavelength.

17. The analyzer of claim 16, wherein said reference wavelength laser comprises a laser diode having an oscillation wavelength controlled to the absorption spectrums of atoms of said standard source.

18. The analyzer of claim 1, wherein said optical frequency sweeping means comprises an optical synthesizer/sweeper comprising a reference wavelength light source for producing an output light; an optical phase locked loop for producing a light output having a wavelength which corresponds to the oscillation wavelength of said light from said reference wavelength light source; and means for varying the wavelength of light from said optical phase locked loop.

19. The analyzer of claim 18, wherein said reference wavelength light source comprises a laser diode for generating an output, and means for controlling the oscillation wavelength of said output from said laser diode to the absorption spectrum of any one of $D_2$ beams at 780 nm of Rb atoms and $D_1$ beams at 795 nm of Rb atoms; and wherein said optical phase locked loop outputs light having a wavelength band which is twice as large as the oscillation wavelength of said output from said laser diode.

20. The analyzer of claim 18, wherein said reference wavelength light source comprises a laser diode for producing an output; and means for controlling the oscillation wavelength of said output from said laser diode to the absorption spectrum of Rb atoms or Cs atoms.

21. The analyzer of claim 18, wherein said reference wavelength light source comprises a semiconductor laser for producing an output light; modulation means for effecting frequency modulation on a part of said output light from said semiconductor laser and for producing an output indicative thereof; an absorption cell comprising a standard substance which causes absorption at a given wavelength of said output light from said modulation means; photo detector for converting light transmitted through said absorption cell into electrical signals; and control means for controlling the oscillating wavelength of said semiconductor laser, said control means comprising means for applying said electrical signals from said photo detector to said semiconductor laser.

22. The analyzer of claim 21, wherein said control means comprises a lock-in amplifier; means for applying electrical signals indicative of said electrical signals from said photo detector to said lock-in amplifier; means for effecting synchronous rectification at a modulation frequency of said modulation means or at a frequency of odd numbered multiples thereof; and a control circuit for controlling electric current applied to said semiconductor laser so that the output of said lock-in amplifier becomes a specified value.

23. The analyzer of claim 21, wherein said modulation means comprises an acousto-optic deflector.

24. The analyzer of claim 21, wherein said modulation means comprises an phase modulator comprising an electro-optic element.

25. The analyzer of claim 18, wherein said reference light source comprises a semiconductor laser for producing an output light; an absorption cell for causing absorption at a specified wavelength of said output light from said semiconductor laser; magnetic applying means for applying a magnetic field to said absorption cell; modulation means for varying the intensity of said magnetic field at a fixed frequency; photo detector means for converting light transmitted through said absorption cell into an electrical signal; and means responsive to said electrical signal from said photo detector means for controlling an electric current applied to or temperature of said semiconductor laser.

26. The analyzer of claim 18, wherein said optical phase locked loop comprises a heterodyne detector for heterodyning said output light from said reference wavelength light source and another light and for outputting an electric output indicative of the heterodyned results; a variable wavelength light source for producing a variable output light; means for controlling the oscillation wavelength of said variable output light by using said electric output from said heterodyne detector; and an optical frequency multiplying means for multiplying the frequency of said variable output light to produce said another light; and means for applying said another light to said heterodyne detector.

27. The analyzer of claim 18, wherein said optical phase locked loop comprises a heterodyne detector for heterodyning said output light from said reference wavelength light source and another light and for outputting an electric output indicative of the heterodyned results; a variable wavelength light source for producing a variable output light; and a mixer circuit for mixing said variable output light to produce said another light; and means for applying said another light to said heterodyne detector.

28. The analyzer of claim 18, wherein said phase locked loop comprises a heterodyne detector for heterodyning said output light and another light, and for outputting an electric output representing the heterodyned results; and a variable wavelength light source wherein oscillation wavelength of output light is controlled by an output relative to said electric output from said heterodyne detector, and wherein said another light pertaining to the output light from said variable wavelength light source is applied to said heterodyne detector.

29. The analyzer of claim 18, wherein said phase locked loop comprises a heterodyne detector for heterodyning said output light and another light, and for outputting an electric output representing the heterodyned results; a variable wavelength light source wherein the oscillation wavelength of output light is controlled by an output pertaining to said electric output from said heterodyne detector; and an optical frequency shifter for shifting frequency of light relative to the output light from said variable light source; and means for applying said another light relative to the output light from said optical frequency shifter to said heterodyne detector.

30. The analyzer of claim 1, wherein said optical frequency sweeping means comprises means for applying said sweeping light of said second frequency to said object; means for generating and applying a sweeping light of said first frequency to said optical heterodyne detector means; means for arranging light reflected from said object to be as said incident light upon the analyzer; and comparison means for comparing said electrical output from said filter means with an electrical signal having a frequency which is equal to the difference between said first and second frequencies and for producing an electric output indicative of the compared results.

31. The analyzer of claim 29, further comprising a second optical heterodyne detector means, means for applying said first and second frequency sweeping light from said optical frequency sweeping means to said second optical heterodyne detector means, said second optical heterodyne detector means heterodyning said first and second frequency sweeping light, and outputting an electric output indicative of the heterodyned results; and second filter means for filtering said electric output from said second optical heterodyne detector means and for producing an electrical output indicative of the filtered results; and wherein said comparison means compares said electrical output from said second filter means with said electrical output from said first filter means.

32. The analyzer of claim 30, wherein said comparison means comprises an amplitude comparing circuit.

33. The analyzer of claim 30, wherein said comparison means comprises a phase comparing circuit.

34. The analyzer of claim 30, wherein said first filter means comprises a band pass filter having a transmissive frequency band corresponding to the difference between two output frequencies of said swept light from said optical frequency sweeping means.

* * * * *